(12) United States Patent
Bi et al.

(10) Patent No.: US 8,865,271 B2
(45) Date of Patent: Oct. 21, 2014

(54) HIGH RATE DEPOSITION FOR THE FORMATION OF HIGH QUALITY OPTICAL COATINGS

(75) Inventors: Xiangxin Bi, San Ramon, CA (US); Herman A. Lopez, San Jose, CA (US); Prasad Narasimha, Bangalore (IN); Eric Euvrard, Brookline, MA (US); Ronald J. Mosso, Fremont, CA (US)

(73) Assignee: NeoPhotonics Corporation, San Jose, CA (US)

( * ) Notice: Subject to any disclaimer, the term of this patent is extended or adjusted under 35 U.S.C. 154(b) by 1377 days.

(21) Appl. No.: 10/854,019

(22) Filed: May 26, 2004

(65) Prior Publication Data

US 2005/0019504 A1    Jan. 27, 2005

Related U.S. Application Data

(60) Provisional application No. 60/476,906, filed on Jun. 6, 2003.

(51) Int. Cl.
*C23C 14/30* (2006.01)
*C23C 24/00* (2006.01)
(Continued)

(52) U.S. Cl.
CPC .............. *C23C 24/00* (2013.01); *C23C 16/483* (2013.01); *G02B 6/036* (2013.01); *C03B 2201/10* (2013.01); *G02B 6/132* (2013.01); *C03B 2201/28* (2013.01);
(Continued)

(58) Field of Classification Search
CPC ...... C23C 14/048; C23C 14/08; C23C 14/28; C23C 14/30; B05D 7/00
USPC .......................... 427/585, 586, 588, 595, 596
See application file for complete search history.

(56) References Cited

U.S. PATENT DOCUMENTS

| 3,806,570 A | 4/1974 | Flamenbaum et al. |
| 3,883,336 A | 5/1975 | Randall |

(Continued)

FOREIGN PATENT DOCUMENTS

| EP | 0 545 432 A1 | 9/1993 |
| EP | 0 751 408 A1 | 1/1997 |

(Continued)

OTHER PUBLICATIONS

Bryan, U.S. Appl. No. 10/219,019, filed Aug. 14, 2002, entitled "Reactive Deposition for Formation of Chip Capacitors".

(Continued)

*Primary Examiner* — David Turocy
*Assistant Examiner* — Michael G Miller
(74) *Attorney, Agent, or Firm* — Dardi & Herbert PLLC; Peter S. Dardi; Curtis B. Herbert

(57) ABSTRACT

High rate deposition methods comprise depositing a powder coating from a product flow. The product flow results from a chemical reaction within the flow. Some of the powder coatings consolidate under appropriate conditions into an optical coating. The substrate can have a first optical coating onto which the powder coating is placed. The resulting optical coating following consolidation can have a large index-of-refraction difference with the underlying first optical coating, high thickness and index-of-refraction uniformity across the substrate and high thickness and index-of-refraction uniformity between coatings formed on different substrates under equivalent conditions. In some embodiments, the deposition can result in a powder coating of at least about 100 nm in no more than about 30 minutes with a substrate having a surface area of at least about 25 square centimeters.

16 Claims, 19 Drawing Sheets

(51) Int. Cl.

| | |
|---|---|
| *C23C 16/48* | (2006.01) |
| *G02B 6/132* | (2006.01) |
| *C03B 37/012* | (2006.01) |
| *C23C 16/56* | (2006.01) |
| *C03B 19/01* | (2006.01) |
| *C03B 19/14* | (2006.01) |
| *C23C 24/04* | (2006.01) |
| *C23C 16/40* | (2006.01) |
| *C03B 37/014* | (2006.01) |
| *G02B 6/036* | (2006.01) |

(52) U.S. Cl.
CPC ....... *C03B 37/01294* (2013.01); *C03B 2201/31* (2013.01); *C03B 2207/34* (2013.01); *C23C 16/56* (2013.01); *C03B 2201/12* (2013.01); *C03B 19/01* (2013.01); *C03B 19/1415* (2013.01); *C23C 24/04* (2013.01); *C23C 16/401* (2013.01); *C23C 16/482* (2013.01); *C03B 37/01413* (2013.01)
USPC ....................................................... 427/569

(56) References Cited

U.S. PATENT DOCUMENTS

| | | | |
|---|---|---|---|
| 3,923,484 A | 12/1975 | Randall | |
| 3,932,162 A | 1/1976 | Blankenship | |
| 3,934,061 A | 1/1976 | Keck et al. | |
| 4,011,067 A | 3/1977 | Carey, Jr. | |
| 4,038,370 A | 7/1977 | Tokimoto et al. | |
| 4,113,844 A | 9/1978 | Tokimoto et al. | |
| 4,363,647 A * | 12/1982 | Bachman et al. | 65/17.4 |
| 4,581,248 A | 4/1986 | Roche | |
| 4,681,640 A | 7/1987 | Stanley | |
| 4,735,677 A | 4/1988 | Kawachi et al. | |
| 4,782,787 A | 11/1988 | Roche | |
| 4,814,289 A | 3/1989 | Baeuerle | |
| 4,868,005 A | 9/1989 | Ehrlich et al. | |
| 5,059,475 A | 10/1991 | Sun et al. | |
| 5,060,595 A | 10/1991 | Ziv et al. | |
| 5,085,166 A | 2/1992 | Oka et al. | |
| 5,108,952 A | 4/1992 | Matsuhashi | |
| 5,174,826 A | 12/1992 | Mannava et al. | |
| 5,246,745 A | 9/1993 | Baum et al. | |
| 5,276,012 A | 1/1994 | Ushida et al. | |
| 5,306,447 A | 4/1994 | Marcus et al. | |
| 5,385,594 A | 1/1995 | Kanamori et al. | |
| 5,510,141 A | 4/1996 | Makita et al. | |
| 5,551,966 A | 9/1996 | Hirose et al. | |
| 5,556,442 A | 9/1996 | Kanamori et al. | |
| 5,622,750 A | 4/1997 | Kilian et al. | |
| 5,652,021 A | 7/1997 | Hunt et al. | |
| 5,744,777 A | 4/1998 | Bernecki et al. | |
| 5,858,465 A | 1/1999 | Hunt et al. | |
| 5,863,604 A | 1/1999 | Hunt et al. | |
| 5,874,134 A | 2/1999 | Rao et al. | |
| 5,885,904 A | 3/1999 | Mehta et al. | |
| 5,896,484 A | 4/1999 | Borrelli et al. | |
| 5,958,348 A | 9/1999 | Bi et al. | |
| 5,997,956 A | 12/1999 | Hunt et al. | |
| 6,011,981 A | 1/2000 | Alvarez et al. | |
| 6,013,318 A | 1/2000 | Hunt et al. | |
| 6,032,871 A | 3/2000 | Borner et al. | |
| 6,074,888 A | 6/2000 | Tran et al. | |
| 6,097,144 A | 8/2000 | Lehman | |
| 6,254,928 B1 | 7/2001 | Doan | |
| 6,280,802 B1 | 8/2001 | Akedo et al. | |
| 6,466,707 B1 | 10/2002 | Dawes et al. | |
| 6,467,313 B1 | 10/2002 | Chu et al. | |
| 6,504,983 B1 | 1/2003 | Nara et al. | |
| 6,636,676 B1 * | 10/2003 | Renn | 385/125 |
| 6,849,334 B2 | 2/2005 | Horne et al. | |
| 2002/0164119 A1 * | 11/2002 | Bryan et al. | 385/33 |
| 2003/0035642 A1 * | 2/2003 | Bryan | 385/129 |
| 2003/0203205 A1 | 10/2003 | Bi et al. | |

FOREIGN PATENT DOCUMENTS

| | | |
|---|---|---|
| WO | WO 99/23189 | 5/1999 |
| WO | WO 99/61244 | 12/1999 |
| WO | WO 01/07155 | 2/2001 |
| WO | WO 01/32799 | 5/2001 |
| WO | WO 02/32588 | 4/2002 |
| WO | WO 02/44765 | 6/2002 |
| WO | 03/016961 A2 | 2/2003 |
| WO | WO 03/013846 | 2/2003 |

OTHER PUBLICATIONS

Barbarossa et al., "Effect of Temperature Gradient on Sintering Kinetics of Doped Silica Waveguides," SPIE vol. 1794 Integrated Optical Circuits II (1992) pp. 191-197.

Barbarossa et al., "High-Silica Cascaded Three-Waveguide Couplers for Wideband Filtering by Flame Hydrolysis on SI," SPIE vol. 1583 Integrated Optical Circuits (1991) pp. 122-128.

Barbarossa et al., "High-Silica Low-Loss Three Waveguide Couplers on Si by Flame Hydrolysis Deposition," SPIE vol. 1513 Glasses for Optoelectronics II (1991) pp. 37-43.

Barbarossa et al., "Optical Damage Threshold of $P_2O_5$, and $GeO_2$-$P_2O_5$-Doped Silica Waveguides," SPIE vol. 1794 Integrated Optical Circuits II (1992) pp. 185-190.

Besling et al., "Laser-Induced Chemical Vapor Deposition of Nanostructured Silicon Carbonitride Thin Films," 1997, pp. 544-553, Laboratory for Applied Inorganic Chemistry, Delft University of Technology, Julianalaan 136, 2628 BL Delft, The Netherlands.

Bilenchi et al., $CO_2$ "Laser-Assisted Deposition of Boron and Phosphorus-Doped Hydrogenated Amorphous Silicon," American Institute of Physics 1985, pp. 279-281.

Bilenchi et al., "Hydrogenated Amorphous Silicon Growth by $CO_2$ Laser Photodissociation of Silane," American Institute of Physics 1982, pp. 6479-6481.

Bornard et al., "$LiNbO_3$ Thin Films Deposited on Si Substrates: a Morphological Development Study," Materials Chemistry and Physics, pp. 571-577, Elsevier Science B.V. 2002.

Choi, Center for Nano Particle Control; Web Site Mansoo Choi, Associate Professor of Mechanized Engineering, Seoul National University (2000).

Ichinose et al., "Deposition of $LaMO_3$ (M=Co, Cr, Al) Films by Spray Pyrolysis in Inductively Coupled Plasma," Journal of Crystal Growth, pp. 59-64, Elsevier Science B.V. 1994.

Ichinose et al., "Deposition of $LaMO_3$ (M=Co, Cr, Al)-Oriented Films by Spray Combustion Flame Technique," Jpn. J. Appl. Phys. vol. 33 (1994), pp. 5907-5910.

Jervis, "Metal Film Deposition by Gas-Phase Laser Pyrolysis of Nickel Tetracarbonyl," American Institute of Physics 1985, pp. 1400-1401.

Kim et al., "Deposition of MgO Thin Films by Modified Electrostatic Spray Pyrolysis Method," Thin Solid Films 376 (2000), pp. 110-114, Elsevier Science S.A. 2000.

Lebedev et al., "Laser Distillation-Deposition Synthesis of Silica Glasses with Variable Concentrations of Oxygen Deficient Centers," SPIE vol. 2498 (1995) pp. 6-71.

Liang et al., "Laser Synthesize Silicon-Based and Ferro-Based Nano Powders," SPIE vol. 3862 pp. 17-21 (1999).

Magee et al., "Laser-Induced Conversion of Molecular Precursors to Thin Films and Deposited Layers," American Chemical Society 1990, pp. 232-235.

Maric et al., "Electrolyte Materials for Intermediate Temperature Fuel Cells Produced via Combustion Chemical Vapor Condensation," Electrochemical and Solid-State Letters, 6 (5) 2003, pp. A91-A95.

Maxwell, "Photosensitivity & Rare-Earth Doping in Flame Hydrolysis Deposited Planar Silica Waveguides," SPIE vol. 2695 (1996) pp. 16-29.

(56) References Cited

OTHER PUBLICATIONS

Meunier et al., "Hydrogenated Amorphous Silicon Produced by Laser Induced Chemical Vapor Deposition of Silane," American Institute of Physics 1983, pp. 273-275.

Meunier et al., "Laser-Induced Chemical Vapor Deposition of Hydrogenated Amorphous Silicon. I. Gas-Phase Process Model," American Institute of Physics 1987, pp. 2812-2821.

Meunier et al., "Laser-Induced Chemical Vapor Deposition of Hydrogenated Silicon. II. Film Properties," American Institute of Physics 1987, pp. 2822-2829.

Oljaca et al., "Deposition of $Ba_xSr_{1-x}TiO_3$ in Atmospheric Pressure Flame: Combustion Monitoring and Optimization of Thin Film Properties," Surface Engineering, vol. 19, No. 1, 2003, pp. 51-57.

Rabii et al., Recent Advances in the Fabrication of Hollow Glass Waveguides, SPIE vol. 322 pp. 103-107 (1998).

Sun et al., "Building Passive Components with Silica Waveguides," SPIE vol. 3795 (1999) pp. 313-319.

Vukasinovic et al., "Closed Loop Controlled Deposition of $Ba_xSr_{1-x}TiO_3$ Thin Films in Spray Flames," Surface Engineering, vol. 19, No. 3, 2003, pp. 179-184.

PCT/US04/16534 International Search Report dated May 6, 2005.

Supplemental Search Report (EP 04 75 3377).

\* cited by examiner

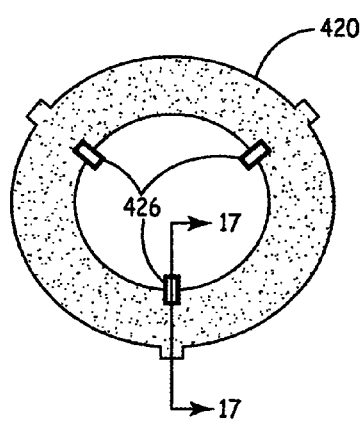
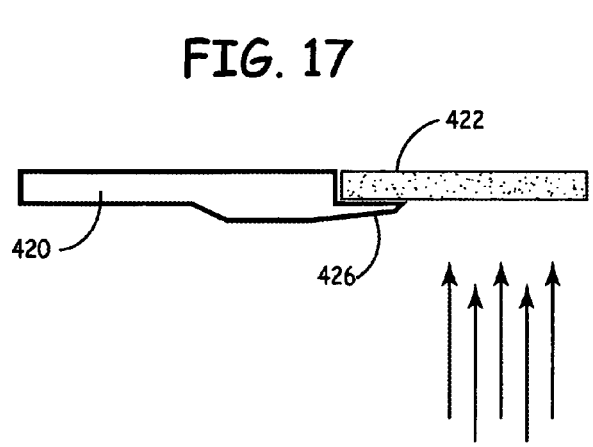
FIG. 16
FIG. 17

HIGH RATE DEPOSITION FOR THE FORMATION OF HIGH QUALITY OPTICAL COATINGS

CROSS REFERENCE TO RELATED APPLICATIONS

This application claims priority to U.S. Provisional Patent Application Ser. No. 60/476,906 to Bi et al. filed on Jun. 3, 2003, entitled "High Rate Deposition For The Formation Of High Quality Optical Coatings," incorporated herein by reference.

FIELD OF THE INVENTION

The invention relates to methods for forming coated substrates, especially with coatings that density into optical materials, such as optical glasses. In particular, the invention relates to methods for forming high quality optical coatings that result following consolidation of a powder coating, which can be formed in a reactive deposition process at high deposition rates.

BACKGROUND OF THE INVENTION

An explosion of communication and information technologies including internet based systems has motivated a world wide effort to implement optical communication networks to take advantage of a large bandwidth available with optical communication. The capacity of optical fiber technology can be expanded further with the interfacing of optical fibers with planar optical structures. With increasing demands, more channels are needed to fulfill the system functions. Integrated planar components can be used to replace discrete optical components to supply the desired capacity. To form these integrated structures, there is considerable interest in the formation of specific compositions applied to substrates such that the compositions provide appropriate optical properties. In order to form optical devices with high quality optical coatings from these materials, the coating properties need to be specified accordingly.

Basic characteristics of optical materials comprise surface quality, uniformity and optical quality. Optical quality refers to small enough absorption and scattering loss to achieve desired levels of transmission. Optical quality also comprises the uniformity of optical properties, such as index-of-refraction, and bi-refringence properties. In addition, optical quality is affected by interface quality, such as the interface between the core layers and cladding layers. For silica ($SiO_2$) and several other materials, preferred forms for optical transmission are a glass, while for some other materials single crystal or polycrystalline forms may have the highest quality optical transmission.

SUMMARY OF THE INVENTION

In a first aspect, the invention pertains to a method for forming an optical coating on a substrate having a first coating. The method comprises depositing a powder coating onto the first coating from a product flow. The product flow results from a chemical reaction in the flow. The powder coating consolidates under appropriate conditions into an optical coating wherein the optical coating and the first coating, following consolidation, have a difference in index-of-refraction of at least about 1%. In some embodiments, the substrate has a surface area of at least about 25 square centimeters, and the deposition can be at a rate to deposit a powder coating with a thickness of at least about 100 nm in no more than about 30 minutes In a further aspect, the invention pertains to a method for forming an optical coating on a substrate. The method comprises depositing a powder coating on the substrate from a product flow. The product flow results from a chemical reaction in the flow. The powder coating consolidates under appropriate conditions into an optical coating having a standard deviation in thickness across the substrate of less than about 0.5 microns with a 1 centimeter edge exclusion. In some embodiments, the substrate has a surface area of at least about 25 square centimeters, and the deposition can be performed at the high rates described herein.

In another aspect, the invention pertains to a method for forming optical coatings on a plurality of substrates. In some embodiments, each substrate has a surface area of at least about 25 square centimeters. The method comprises depositing a powder coating on each of the plurality of substrates from a product flow. The product flow results from a chemical reaction in the flow. The powder coatings consolidate under appropriate conditions into optical coatings on respective substrates with a standard deviation in average optical coating thickness among the plurality of substrates of no more than about 0.1 microns with a two centimeter edge exclusion. In some embodiments, the powder coating can be formed with a thickness of at least about 100 nm in no more than about 30 minutes.

Furthermore, the invention pertains to a method for forming optical coatings on a plurality of substrates. In some embodiments, each substrate has a surface area of at least about 25 square centimeters. The method comprising depositing a powder coating on each of the plurality of substrates from a product flow. The product flow results from a chemical reaction in the flow. The optical coatings on respective substrates have a standard deviation between the optical coatings on the substrates in average index-of-refraction for each substrate of no more than about 0.001 with a one centimeter edge exclusion. In some embodiments, the powder coating is deposited with a thickness of at least about 100 nm in no more than about 30 minutes.

In addition, the invention pertains to a method for forming an optical coating on a substrate. In some embodiments, the substrate has a surface area of at least about 25 square centimeters. The method comprises depositing a powder coating on the substrate from a product flow. The product flow results from a chemical reaction in the flow. The powder coating consolidates under appropriate conditions into an optical coating having a standard deviation in index-of-refraction across the substrate of less than about 0.001 with a 1 centimeter edge exclusion. The powder coating can be deposited at the high rates described herein.

In additional aspects, the invention pertains to a method for forming an optical coating on a substrate. The method comprises depositing a powder coating on the substrate from a product flow. The product flow results from a chemical reaction in the flow. The powder coating consolidates under appropriate conditions into an optical coating comprising a silicate glass with at least about 8 weight percent phosphate ($P_2O_5$).

In other aspects, the invention pertains to a method for forming an optical coating on a substrate. The method comprises depositing a powder coating on the substrate from a product flow. The product flow results from a chemical reaction in the flow. The powder coating consolidates into an optical coating comprising a silicate glass with at least about 20 weight percent germanium oxide ($GeO_2$).

BRIEF DESCRIPTION OF THE DRAWINGS

FIG. 16 is a top view of a wafer holder.

FIG. 17 is a sectional view of the wafer holder of FIG. 16 with a wafer with the section taken along line 17-17 of FIG. 16.

DETAILED DESCRIPTION OF THE INVENTION

Figure 1:
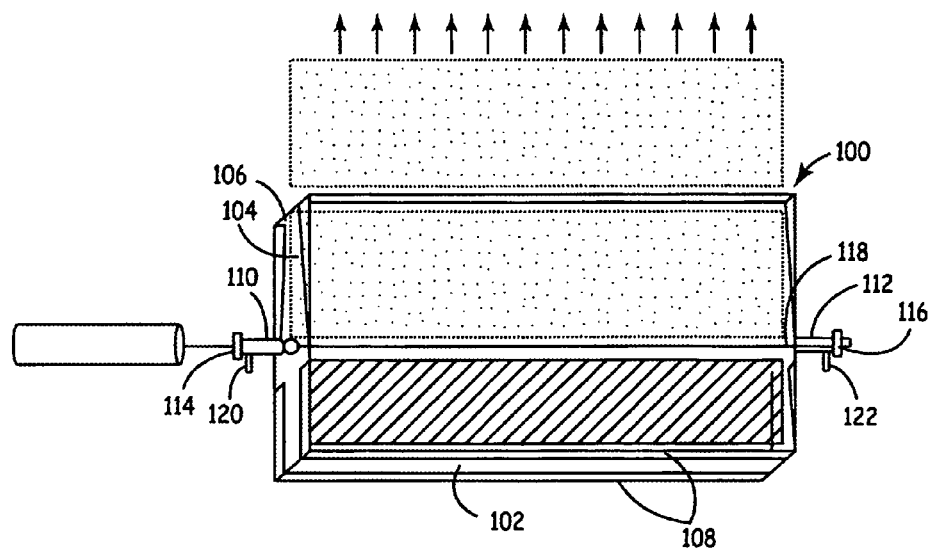
FIG. 1 is a side perspective view of a reaction chamber for performing laser pyrolysis synthesis of powders at high production rates.

It has been discovered that high rate deposition approaches are suitable for the production of powder coatings that consolidate into very high quality optical coatings. In particular, the optical coating can be formed with very high uniformity both along the surface of a particular substrate as well as between different substrates produced under the same conditions. The optical coatings can have, for example, high uniformity with respect to thickness and index-of-refraction while also having low surface roughness. The approaches for forming these coatings also provide for the inclusion of a wide range of compositions, such as silicate glasses with additives/dopants, and/or a wide range of concentrations of elements within a composition, such that the index of refraction and other optical properties can be correspondingly varied over a significant range. Thus, adjacent optical layers can be formed with large differences in index-of-refraction. Specifically, adjacent silicate glass layers can be formed with difference in index-of-refraction of at least about 1 percent. The high rate deposition approaches can deposit a powder coating layer that densifies under heating to form the optical coatings. The powder coating layers can be deposited, for example, by light reactive deposition.

Fiber optic communication networks provide broadband communication channels through the transmission of light. However, manipulation of the optical signals requires the interface of the fiber optical pathways with appropriate optical devices and electro-optical devices. The formation of planar optical devices on a substrate surface has been used to decrease the size of the optical devices. The formation of planar optical devices involves the manipulation of optical materials to form structures in layers with dimension on the order of tens of nanometers to tens or hundreds of microns. Improved processes for the deposition of optical materials and/or the manipulation of optical materials in the formation of optical devices introduces the capability of producing more complex optical devices and integrated structures in more compact configurations.

While the discussion herein focuses on planar optical devices, some of the embodiments relate to optical fibers and optical fiber preforms. Optical fibers are generally formed by pulling the optical fiber from a softened preform that introduces the basic structural and compositional aspects of the fiber. Optical fiber preforms can be produced using similar approaches for the formation of planar optical devices.

A new process has been developed involving reactive deposition driven by a radiation beam (e.g., a light beam), to form coatings with optical characteristics that are tightly controlled. The coating can be used to form optical structures with simple or complex collections of corresponding optical devices. In one embodiment, reactive deposition driven by a radiation beam (e.g., a light beam) involves a reactor with a flowing reactant stream that intersects a radiation beam proximate a reaction zone to form a product stream configured for the deposition of product particles onto a surface following formation of the particles in the flow. The particles are deposited in the form of a powder coating, i.e. a collection of unfused particles or a network of fused or partly fused particles in which at least some characteristics of the initial primary particles are reflected within the coating. Radiation-based reactive deposition incorporates features of a radiation-based process for driving the reaction of a flowing reactant stream to form submicron powders into a direct coating process. When particle formation incorporates an intense radiation, e.g., light, beam to drive a reaction in a flow for the production of particles, the radiation-based process for the production of submicron powders in a flow is known as laser pyrolysis. In particular, a wide range of reaction precursors can be used to generate a reactant stream with compositions in gas, vapor and/or aerosol form, and a wide range of highly uniform product particles can be efficiently produced.

In laser pyrolysis, the reactant stream is reacted by an intense light beam, such as a laser beam, which heats the reactants at a very rapid rate. While a laser beam is a convenient energy source, other intense radiation (e.g., light) sources can be used in laser pyrolysis. Laser pyrolysis provides for formation of phases of materials that are difficult to form under thermodynamic equilibrium conditions. As the reactant stream leaves the light beam, the product particles are rapidly quenched. The reaction takes place in a confined reaction zone at the intersection of the light beam and the reactant stream. For the production of doped materials and other complex optical materials, the present approaches have the advantage that the composition of the materials can be adjusted over desirable ranges.

Reactant delivery approaches developed for laser pyrolysis can be adapted for light reactive deposition. In particular, a wide range of reaction precursors can be used in gaseous/vapor and/or aerosol form, and a wide range of highly uniform product particles can be efficiently produced for the deposition in the form of a coating, such as a powder coating. Specifically, light reactive deposition can be used to form highly uniform coatings of materials, optionally comprising dopant(s)/additive(s) and/or complex composition(s). The coating formed by light reactive deposition can be a collection of particles on a surface or a powder coating, depending on the deposition conditions. For convenience, this application refers interchangeably to radiation-driven pyrolysis, light-driven pyrolysis and laser pyrolysis. For convenience, this application also refers interchangeably to radiation-based reactive deposition and light reactive deposition. In other words, as used herein, laser pyrolysis and light reactive deposition refer generally to all radiation based particle synthesis and radiation based coating approaches, respectively, unless explicitly indicated otherwise.

In some embodiments, the reactor apparatus, e.g., a light reactive deposition apparatus, includes an extended reactant inlet such that a stream of particles is generated within a flowing sheet forming a reactant/product stream. Generally, the reactant flow is oriented to intersect the radiation such that most or all of the reactant flow intersects with the radiation such that high yields are obtained. Using an extended reactant inlet, a line or stripe of particles at a high throughput can be, at least in part, simultaneously deposited onto a substrate. It has been discovered how to obtain high reactant throughput such that a high particle production rate can be maintained without sacrificing control of the product particle properties and/or corresponding uniformity of the deposited powder coating. For coating deposition, by depositing a line or stripe of particles, the coating process can be performed more rapidly.

More specifically, in a reactor with an elongated reactant inlet, particle production rates are readily achievable in the range(s) of at least about 50 grams per hour (g/h) and in other embodiments in the range(s) of at least about 100 g/h. These rates can be used to achieve particles with a wide range of compositions and with high particle uniformity. Specifically, particles within the flow can be formed with a distribution of particle diameters that is highly peaked at or near the average such that the distribution of a majority of the particles is narrow and that has a cut off in the tail of the distribution such that effectively no particles have a diameter larger than a cut off value of a low multiple of the average diameter. Correspondingly high coating rates also can be achieved. The uniformity of the particles in the flow can result in desirable properties for the corresponding coating formed from the particles.

Light reactive deposition has considerable advantages for the production of particles for coating substrate surfaces. First, light reactive deposition can be used in the production of a large range of product particles. Thus, the composition of the corresponding coating can be adjusted based on the features of the light reactive deposition approach. Furthermore, light reactive deposition can produce very small particles with a high production rate.

Submicron inorganic particle coatings with various stoichiometries and/or non-stoichiometric compositions can be produced by light reactive deposition. Similarly, deposited materials can be formed with various crystal structure(s), including, for example, amorphous structures. Specifically, light reactive deposition can be used to form highly uniform coatings of glasses, i.e., amorphous materials, and crystalline materials (either single crystalline or polycrystalline), optionally with additive/dopants comprising, for example, complex blends of stoichiometric and/or additive/dopant components. Suitable optical materials include, for example, silicon oxide, germanium oxide, aluminum oxide, titanium oxide, telluride glasses, phosphate ($P_2O_5$) glass, InP, lithium niobate, combinations thereof and doped compositions thereof. Glasses have been generally used in optical applications, although crystalline aluminum oxide, e.g., sapphire, and crystalline $SiO_2$, e.g., quartz, may be suitable for optical applications at certain light wavelengths.

A basic feature of successful application of laser pyrolysis/light reactive deposition for the production of particles and corresponding coatings with desired compositions is generation of a reactant stream containing an appropriate precursor composition. In particular, for the formation of doped materials by light reactive deposition, the reactant stream can comprise host glass or crystal precursors and, optionally, dopant precursors. The reactant stream includes appropriate relative amounts of precursor compositions to produce the optical materials with the desired compositions and/or dopant concentrations. Also, unless the precursors are an appropriate radiation absorber, an additional radiation absorber can be added to the reactant stream to absorb radiation/light energy for transfer to other compounds in the reactant stream. Other additional reactants can be used to adjust the oxidizing/reducing environment in the reactant stream. Formation of doped optical glasses with these reactive approaches can involve fewer processing steps than common commercial approaches for introducing dopants.

By adapting the properties of laser pyrolysis, light reactive deposition is able to deposit highly uniform, very small particles in a coating. Due to the uniformity and small size of the powders, light reactive deposition can be used to form uniform and smooth coating surfaces. The desirable qualities of the particles are a result of driving the reaction with an intense light beam, which results in the extremely rapid heating and cooling.

Appropriate controls of the deposition process can result in very high uniformity of densified coating thickness across the surface of a substrate and with respect to average coating thickness between substrates coated under the equivalent conditions. The powder coatings are densified to form optical materials. The high uniformity of the powder coatings results in a correspondingly uniform densified optical material. Specifically, a substrate with a densified coating thickness of at least about 100 nm can have an optical coating thickness with a variation across the substrate of less than about 0.07 microns with a one-centimeter edge exclusion, as described further below. Similarly, a plurality of substrates can be coated each with a densified coating thickness of at least about 100 nm with a standard deviation in average coating thickness among the plurality of substrates of no more than about 0.1 microns with a two-centimeter edge exclusion. In addition, the surface roughness of the optical coating can be evaluated to be less than about 5 nm Ra (root mean square) and less than about 5 nm Rq (average) when evaluated by interferometry over an area of about 480×736 microns. Thus, the surfaces are smoother than are thought to be obtained by flame hydrolysis deposition and roughly comparable to smoothness obtainable by chemical vapor deposition. The smooth glass coating applied by light reactive deposition was deposited at relatively high deposition rates by moving the product stream relative to the substrate.

The composition of the optical material can be selected based on the desired optical properties as well as suitable processing properties. In some embodiments, the materials of interest include, for example, silica ($SiO_2$) glass, e.g., a composition with at least about 35 weight percent $SiO_2$ and no other single component with a weight percent greater than $SiO_2$. Dopants can be added to the silica glass to change the index-of-refraction as well as lower the flow temperature. Some dopants, such as rare earth dopants, can be added to introduce optical properties useful for the formation of active materials, such as amplifying materials. Other dopants such as phosphorous, boron and germanium are useful in modifying the index-of-refraction and processing properties without directly introducing significant changes in the optical performance of silica glass at the light wavelengths presently of most interest. Using the approaches described herein, high levels of phosphorous, boron and/or germanium additives can be introduced into silica glass. In particular, silica glass can be formed with phosphorous dopants with at least about 10 weight percent $P_2O_5$, germanium doping with at least about 25 weight percent $GeO_2$ and boron doping with at least about 3 weight percent $B_2O_3$. Of course, lower dopant concentrations can be introduced, and dopant levels are discussed further below.

Germanium and phosphorous increase the index-of-refraction of silica glass, while boron decreases the index-of-refraction. Thus, the ability to incorporate high dopant levels into the glass corresponds with an ability to manipulate the index-of-refraction in desirable ways. For the transmission of light through an optical fiber or a planar optical waveguide, the light is generally confined mostly within a core optical material with an index-of-refraction that is higher than the corresponding cladding material surrounding the core such that light is confined by total internal reflection. If there is a higher index-of-refraction difference between the core and the cladding, the core can be made with smaller physical dimensions, and curves within the optical pathway can be made at larger angles relative to the straight-line pathway without reaching undesirable losses due to light leaking from the core. Using a phosphorous silica glass, a core material can be deposited with an index-of-refraction difference relative to a cladding layer of at least about 1%, and using a germanium boron silica glass an index-of-refraction difference between the core layer and a cladding can be at least about 2%, in which the cladding has an index-of-refraction of 1.4447 at 1.55 microns light wavelength. The index-of-refraction difference was calculated as $\delta n = (n_{core} - n_{clad})n_{core}$.

In addition, the deposition approaches described herein provide for a high level of control over the deposition properties as well as the composition of the deposited material. This control of the deposition can result in a high level of uniformity of the index-of-refraction across one substrate and between different substrates. Thus, a substrate can be coated with silica glass with a standard deviation of the index-of-refraction of less than about 0.001, and the average index-of-refraction of a plurality of substrates can have a standard deviation of no more than about 0.001 index units.

For communication applications, the core is generally formed with dimensions to allow single mode propagation. The propagation can be simulated to estimate the dimension of a rectangular core for single mode operations. In other words, for a particular thickness/height of the core, suitable widths can be estimated based on the index-of-refraction of the core and cladding materials. Cores were successfully made with suitable dimensions for single mode propagation with a higher index-of-refraction difference between the core and cladding and with correspondingly smaller dimensions of the core. While achieving these significant advances in high rate deposition of optical materials with respect to high index-of-refraction differences along with highly reproducible properties, in-plane optical losses have been achieved at commercially acceptable levels of less than about 0.1 dB/cm.

Light reactive deposition is able to produce quality coatings at much higher rates than previously available. At the same time, light reactive deposition is able to generate coatings with an extremely broad range of compositions by controlling reactant composition, reaction chemistry and reaction conditions, such as light intensity which can be used to continuously control effective temperatures in the reaction zone over a wide range, such as in the range(s) from about room temperature (e.g., 20° C.) to about 3000° C. Thus, light reactive deposition has already demonstrated the ability to be an efficient and effective approach for the formation of very high quality glass coatings.

Multiple layers can be formed by additional sweeps of the substrate through the product particle stream. Since each coating layer can have high uniformity and smoothness, a large number of layers can be stacked while maintaining appropriate control on the layered structure such that optical devices can be formed throughout the layered structure without structural variation adversely affecting the ability to form optical devices. Composition can be varied between layers, i.e., perpendicular to the plane of the structure, and/or portions of layers, within the plane of the structure, to form desired optical structures. Thus, using light reactive deposition possibly with other patterning approaches, it is possible to form complex structures with intricate variation of materials with selectively varying compositions. Furthermore, by adapting laser pyrolysis techniques for the production of commercial quantities of powders, light reactive deposition can form high quality coatings at very rapid rates.

To form a densified optical layer, a layer of amorphous particles deposited by light reactive deposition can be consolidated. To consolidate the optical materials, the powders are heated to a temperature above their flow temperature. At these temperatures, the powders density and upon cooling form a uniform layer of optical material. Substantially uniform optical materials have an optical quality that permits transmission of light. Incorporation of desired composition and/or dopants into the particles results in an optical material with a desired composition/dopants through the resulting densified optical material directly as a result of the powder deposition. Generally, amorphous particles can be consolidated to form a glass material, and crystalline particles, such as aluminum oxide, can be consolidated to form a crystalline material, such as sapphire. However, in some embodiments, appropriate heating and quenching rates can be used to consolidate an amorphous material into a crystalline layer, either single crystalline or polycrystalline, (generally slow quenching rates) and a crystalline powder into a glass layer (generally a rapid quench).

Efficient approaches have been developed for the patterning of optical compositions for the formation of optical materials, as described in detail below. Patterning of optical materials with respect to composition or other property effecting the optical properties can be performed during deposition and/or following deposition, for example, by etching the coated substrate using photolithography and/or other etching approaches. For example, in the formation of a core layer, and optionally in the formation of cladding layers, the composition of the optical material can be varied to change the index-of-refraction and/or the other optical properties, for example, in the formation of active optical devices. These approaches can be adapted for the formation planar integrated optical devices, such as waveguides, and/or optical fiber preforms that can be pulled to form corresponding optical fibers.

Passive and/or active optical devices can be incorporated into the optical structure to introduce the desired functionality. Optical devices of interest comprise, for example, optical waveguide devices, such as optical couplers, splitters, arrayed waveguide grating (AWG) and the like. Waveguides manufactured on a substrate surface are referred to as planar waveguides. Planar waveguides are useful in the production of integrated optical circuits for optical communication and other opto-electronics applications. Other optical devices of interest comprise, for example, three dimensional optical memory device, Bragg grating, optical attenuator, optical splitter/coupler, optical filter, optical switch, laser, modulator, interconnect, optical isolator, optical add-drop multiplexer (OADM), optical amplifier, optical polarizer, optical circulator, phase shifter, optical mirror/reflector, optical phase-retarder, and optical detector.

Integrated optical circuits generally comprise a plurality of optical devices that are optically connected. In a planar optical structure, a layer of optical material can include one or more optical circuits that form corresponding optical pathways along the layer. Due to improved processing ability of light reactive deposition, multiple layer optical structures with multiple layers having independent light pathways have been described. These multiple layered optical structures are described further in copending and commonly assigned PCT application PCT/US01/45762 designating the U.S. filed on Oct. 26, 2001 to Bi et al., entitled "Multilayered Optical Structures," incorporated herein by reference. Furthermore, light reactive deposition can be adapted for full three-dimensional integration of optical structures to take advantage of composition variation in three dimensions. Thus, a monolithic optical structure can be formed with full integration within one or more layers and between layers to form a highly compact optical structure with the capability of complex functionality. The formation of three-dimensional structures is described further in copending and commonly assigned U.S. patent application Ser. No. 10/027,906 to Bi et al., entitled "Three Dimensional Engineering of Optical Structures," incorporated herein by reference. The index-of-refraction selection approaches described herein can be adapted in the formation of complex multilayered optical structures by designing the structures for light pathways to the photosensitive material for index-of-refraction selection or by performing the index-of-refraction selection on intermediate structures before all of the layers of the structure are deposited.

Particle Synthesis Within A Reactant Flow

Laser pyrolysis has been demonstrated to be a valuable tool for the production of submicron/nanoscale particles with a wide range of particle compositions and structures alone or with additional processing. Using light reactive deposition, the particles can be deposited onto a substrate as a coating. The reactant delivery approaches described in detail below can be adapted for producing powder coatings in flowing reactant systems, for example, with a radiation source, e.g., a light source.

Flowing reactant systems generally comprise a reactant delivery apparatus that directs a flow through a reaction chamber. The reaction of the reactant flow takes place in the reaction chamber. The reaction zone may or may not be localized in a narrow region within the reaction chamber. The use of a radiation, e.g., light, beam, to drive the reaction can result in a localized reaction zone that leads to high uniformity of the particles. Beyond the reaction zone, the flow comprises product particles, unreacted reactants, reaction by-products and inert gases. The flow can continue to a deposition surface at which at least a portion of the product particles are harvested from the flow as a powder coating. Continuous supply of reactants to the flow and removal of product particles from the flow during the course of the reaction characterizes the reaction process within the flowing reactant system, although the reaction and/or the deposition can be interrupted at appropriate intervals, for example, to position substrates, alter reactant compositions or for other processing considerations and the like.

Light reactive deposition can incorporate some of the particle production features of laser pyrolysis for the production of coatings. In particular, the versatility of forming particles with a range of particle compositions and structures can be adapted for the formation of particle coatings by light reactive deposition with a comparable range in particle compositions. In general, product particles within a flowing reactant system can be deposited onto a substrate as a coating within the reaction chamber, or directed to a separate coating chamber for deposition onto a substrate, or directed to a collector for collection as a powder.

Laser pyrolysis has become the standard terminology for flowing chemical reactions driven by an intense radiation, e.g., light, with rapid quenching of product after leaving a narrow reaction region defined by the radiation. The name, however, is a misnomer in the sense that radiation from non-laser sources, such as a strong, incoherent light or other radiation beam, can replace the laser. Also, the reaction is not a pyrolysis in the sense of a thermal pyrolysis. The laser pyrolysis reaction is not solely thermally driven by the exothermic combustion of the reactants. In fact, in some embodiments, laser pyrolysis reactions can be conducted under conditions where no visible light emissions are observed from the reaction, in stark contrast with pyrolytic flames. Light reactive deposition involves comparable processes as laser pyrolysis for the particle production, although some characteristics of the flow may be altered to accommodate the coating process.

The reaction conditions can determine the qualities of the particles produced by light reactive deposition, as in laser pyrolysis. The reaction conditions for light reactive deposition can be controlled relatively precisely in order to produce particles and corresponding powder coatings with desired properties. In particular, the particle properties influence the properties of the powder coating formed from the particles, although other factors, such as temperature of the substrate and distance of the substrate from the reaction zone also influence the powder coating properties.

For example, the reaction chamber pressure, flow rates, composition and concentration of reactants, radiation intensity, radiation energy/wavelength, type and concentration of inert diluent gas or gases in the reaction stream, temperature of the reactant flow can affect the composition and other properties of the product particles, for example, by altering the time of flight of the reactants/products in the reaction zone and the quench rate. Thus, in a particular embodiment, one or more of the specific reaction conditions can be controlled. The appropriate reaction conditions to produce a certain type of particles generally depend on the design of the particular apparatus. Specific conditions used to produce selected powder coatings in particular apparatuses are described below in the Examples. Furthermore, some general observations on the relationship between reaction conditions and the resulting particles can be made.

Increasing the light power results in increased reaction temperatures in the reaction region as well as a faster quenching rate. A rapid quenching rate tends to favor production of higher energy phases, which may not be obtained with processes near thermal equilibrium. Similarly, increasing the chamber pressure also tends to favor the production of higher energy phases. Also, increasing the concentration of the reactant serving as the oxygen source or other secondary reactant source in the reactant stream favors the production of particles with increased amounts of oxygen or other secondary reactant.

Reactant velocity of the reactant gas stream is inversely related to particle size so that increasing the reactant velocity tends to result in smaller particle sizes. A significant factor in determining particle size is the concentration of product composition condensing into product particles. Reducing the concentration of condensing product compositions generally reduces the particle size. The concentration of condensing product can be controlled by dilution with non-condensing, e.g., inert, compositions or by changing the pressure with a fixed ratio of condensing product to non-condensing compositions, with a reduction in pressure generally leading to reduced concentration and a corresponding reduction in particle size and vice versa, or by combinations thereof, or by any other suitable means.

Light power also influences particle size with increased light power favoring smaller particle formation, especially for higher melting temperature materials. Also, the growth dynamics of the particles have a significant influence on the size of the resulting particles. In other words, different forms of a product composition have a tendency to form different size particles from other phases under relatively similar conditions. Similarly, under conditions at which populations of particles with different compositions are formed, each population of particles generally has its own characteristic narrow distribution of particle sizes.

Materials of interest include amorphous materials, crystalline materials and combinations thereof. Amorphous materials possess short-range order that can be very similar to that found in crystalline materials. In crystalline materials, the short-range order comprises the building blocks of the long-range order that distinguishes crystalline and amorphous materials. In other words, translational symmetry of the short-range order building blocks found in amorphous materials creates long-range order that defines a crystalline lattice. For example, silica glass is an amorphous material comprised of $(SiO_4)^{4-}$ tetrahedra that are bonded together at irregular bond angles. The regularity of the tetrahedra provides short-range order but the irregularity of the bond angles prevents long-range order. In contrast, quartz is a crystalline silica material comprised of the same $(SiO_4)^{4-}$ tetrahedra that are bonded together at regular bond angles to form long-range order which results in a crystalline lattice. In general, the crystalline form is a lower energy state than the analogous amorphous form. This provides a driving force towards formation of long-range order. In other words, given sufficient atomic mobility and time, long-range order can form.

In laser pyrolysis, a wide range of inorganic materials can be formed in the reactive process. Based on kinetic principles, higher quench rates favor amorphous particle formation while slower quench rates favor crystalline particle formation as there is time for long-range order to develop. Faster quenches can be accomplished with a faster reactant stream velocity through the reaction zone. In addition, some precursors may favor the production of amorphous particles while other precursors favor the production of crystalline particles of similar or equivalent stoichiometry. Specifically, amorphous particles can be consolidated/densified under appropriate conditions to form amorphous layers, such as optical glasses. Amorphous particles are more easily consolidated into a glass layer since amorphous particles do not have a long-range order that is disrupted to form a glass layer. The formation of amorphous oxides is described further in U.S. Pat. No. 6,106,798 to Kambe et al., entitled "Vanadium Oxide Nanoparticles," incorporated herein by reference. Also, crystalline materials are of interest for optical and/or other applications. Crystalline particles can be consolidated into single crystalline or polycrystalline materials. While it may be easier to consolidate amorphous particles into glasses and crystalline particles into crystalline layers, crystalline particles can be consolidated into amorphous layers under appropriate consolidation conditions such as heating the particles to a temperature above the melting temperature followed by quenching at a rate that prevents long-range order formation. Amorphous particles can be consolidated into crystalline layers under appropriate consolidation conditions including the heating and cooling at rates that provide time for long-range order to develop.

To form a desired composition in the reaction process, one or more precursors supply the one or more metal/metalloid elements that form the desired composition. The reactant stream generally would include the desired metal and, additionally or alternatively, metalloid elements to form the host material and, optionally, dopant(s)/additive(s) in appropriate proportions to produce product particles with a desired composition. The composition of the reactant stream can be adjusted along with the reaction condition(s) to generate desired product particles with respect to composition and structure. Based on the particular reactants and reaction conditions, the product particles may not have the same proportions of metal/metalloid elements as the reactant stream since the elements may have different efficiencies of incorporation into the particles, i.e., yields with respect to unreacted materials. However, the amount of incorporation of each element is a function of the amount of that element in the reactant flow, and the efficiency of incorporation can be empirically evaluated based on the teachings herein to obtain desired compositions. The designs of the reactant nozzles for radiation driven reactions described herein are designed for high yields with high reactant flows. Furthermore, additional appropriate precursor(s) can supply any desired dopant/additive element(s).

Metalloids are elements that exhibit chemical properties intermediate between or inclusive of metals and nonmetals. Metalloid elements comprise silicon, boron, arsenic, antimony, and tellurium. While phosphorous is located in the periodic table near the metal elements, it is not generally considered a metalloid element. However, phosphorous in the form of $P_2O_5$ is a composition of interest. For convenience, as used herein including in the claims, phosphorous is also considered a metalloid element. Astatine perhaps can be considered a metalloid also, but it is highly radioactive with the longest lived isotopes having a half life of about 8 hours. Elements from the groups Ib, IIb, IIIb, IVb, Vb, VIb, VIIb and VIIb are referred to as transition metals. In addition to the alkali metals of group I, the alkali earth metals of group II and the transition metals, other metals include, for example, aluminum, gallium, indium, thallium, germanium, tin, lead, bismuth and polonium. The non-metal/metalloid elements include hydrogen, the noble gases, carbon, nitrogen, oxygen, fluorine, sulfur, chlorine, selenium, bromine, and iodine.

Laser pyrolysis has been performed generally with gas/vapor phase reactants. Many precursor compositions, such as metal/metalloid precursor compositions, can be delivered into the reaction chamber as a gas/vapor. Appropriate precursor compositions for gaseous delivery generally include compositions with reasonable vapor pressures, i.e., vapor pressures sufficient to get desired amounts of precursor gas/vapor into the reactant stream. The vessel holding liquid or solid precursor compositions can be heated (cooled) to increase (decrease) the vapor pressure of the precursor, if desired. Solid precursors generally are heated to produce a sufficient vapor pressure. A carrier gas can be bubbled through a liquid precursor to facilitate delivery of a desired amount of precursor vapor. Similarly, a carrier gas can be passed over the solid precursor to facilitate delivery of the precursor vapor. Alternatively or additionally, a liquid precursor can be directed to a flash evaporator to supply a composition at a selected vapor pressure. The use of a flash evaporator to control the flow of non-gaseous precursors provide a high level of control on the precursor delivery into the reaction chamber.

However, the use of exclusively gas/vapor phase reactants can be challenging with respect to the types of precursor compositions that can be used conveniently. Thus, techniques have been developed to introduce aerosols containing precursors, such as metal/metalloid precursors, into laser pyrolysis chambers. Improved aerosol delivery apparatuses for flowing reaction systems are described further in U.S. Pat. No. 6,193,936 to Gardner et al., entitled "Reactant Delivery Apparatuses," incorporated herein by reference. These reactant delivery systems can be adapted for light reactive deposition. These reactant delivery systems can be adapted for light reactive deposition. In some embodiments, the aerosol is entrained in a gas flow, which can comprise an inert gas(es) and/or a gaseous reactant(s).

Using aerosol delivery apparatuses, solid precursor compositions can be delivered by dissolving the compositions in a solvent. Alternatively, powdered precursor compositions can be dispersed in a liquid/solvent for aerosol delivery. Liquid precursor compositions can be delivered as an aerosol from a neat liquid, a multiple liquid dispersion or a liquid solution. Aerosol reactants can be used to obtain a significant reactant throughput. A solvent/dispersant can be selected to achieve desired properties of the resulting solution/dispersion. Suitable solvents/dispersants include water, methanol, ethanol, isopropyl alcohol, other organic solvents and mixtures thereof. The solvent should have a desired level of purity such that the resulting particles have a desired purity level. Some solvents, such as isopropyl alcohol, are significant absorbers of infrared light from a $CO_2$ laser such that no additional light absorbing composition may be needed within the reactant stream if a $CO_2$ laser is used as a light source.

The precursor compositions for aerosol delivery are dissolved in a solution generally with a concentration in the range(s) greater than about 0.1 molar. Generally, increasing the concentration of precursor in the solution increases the throughput of reactant through the reaction chamber. As the concentration increases, however, the solution can become more viscous such that the aerosol may have droplets with larger sizes than desired. Thus, selection of solution concentration can involve a balance of factors in the selection of a suitable solution concentration.

If precursors are delivered as an aerosol with a solvent present, the solvent generally can be rapidly evaporated by the radiation (e.g., light) beam in the reaction chamber such that a gas phase reaction can take place. The resulting particles are not generally highly porous, in contrast to other approaches based on aerosols in which the solvent cannot be driven off rapidly. Thus, the fundamental features of the laser pyrolysis reaction can be unchanged by the presence of an aerosol. Nevertheless, the reaction conditions are affected by the presence of the aerosol. The use of aerosol reactants for light reactive deposition is described further in copending and commonly assigned U.S. patent application Ser. No. 10/099,597 to Horne et al., entitled "Optical Materials And Optical Structures," incorporated herein by reference.

For embodiments involving a plurality of metal/metalloid elements, the metal/metalloid elements can be delivered all as vapor, all as aerosol or as any combination thereof. If a plurality of metal/metalloid elements is delivered as an aerosol, the precursors can be dissolved/dispersed within a single solvent/dispersant for delivery into the reactant flow as a single aerosol. Alternatively, the plurality of metal/metalloid elements can be delivered within a plurality of solutions/dispersions that are separately formed into an aerosol. The generation of a plurality of aerosols can be helpful if convenient precursors are not readily soluble/dispersible in a common solvent/dispersant. The plurality of aerosols can be introduced into a common gas flow for delivery into the reaction chamber through a common nozzle. Alternatively, a plurality of reactant inlets can be used for the separate delivery of aerosol and/or vapor reactants into the reaction chamber such that the reactants mix within the reaction chamber prior to entry into the reaction zone.

In addition, for the production of highly pure materials, it may be desirable to use a combination of vapor and aerosol reactants. In some embodiments, vapor/gas reactants generally can be supplied at higher purity than is readily available at low cost for aerosol delivered compositions. This can be particular convenient for the formation of doped optical glasses. For example, very pure silicon can be delivered in an easily vaporizable form, such as silicon tetrachloride. At the same time, some elements, especially rare earth dopant(s)/additive(s), cannot be conveniently delivered in vapor form.

Thus, in some embodiments, a majority of the material for the product compositions can be delivered in vapor/gas form while other elements are delivered in the form of an aerosol. The vapor and aerosol can be combined for reaction, among other ways, following delivery through a single reactant inlet or a plurality of inlets.

The particles, in some embodiments, further comprise one or more non-(metal/metalloid) elements. For example, several compositions of interest are oxides. Thus, an oxygen source should also be present in the reactant stream. The oxygen source can be the metal/metalloid precursor itself if it comprises one or more oxygen atoms or a secondary reactant can supply the oxygen. The conditions in the reactor should be sufficiently oxidizing to produce the oxide materials.

In particular, secondary reactants can be used in some embodiments to alter the oxidizing/reducing conditions within the reaction chamber and/or to contribute non-metal/metalloid elements or a portion thereof to the reaction products. Suitable secondary reactants serving as an oxygen source for the formation of oxides include, for example, $O_2$, CO, $N_2O$, $H_2O$, $CO_2$, $O_3$ and the like and mixtures thereof. Molecular oxygen can be supplied as air. In some embodiments, the metal/metalloid precursor compositions comprise oxygen such that all or a portion of the oxygen in product particles is contributed by the metal/metalloid precursors. Similarly, liquids used as a solvent/dispersant for aerosol delivery can similarly contribute secondary reactants, e.g., oxygen, to the reaction. In other words, if one or more metal/metalloid precursors comprise oxygen and/or if a solvent/dispersant comprises oxygen, a separate secondary reactant, e.g., a vapor reactant, may not be needed to supply oxygen for product particles.

In one embodiment, a secondary reactant composition should not react significantly with the metal/metalloid precursor(s) prior to entering the radiation reaction zone since this can result in the formation of larger particles and/or damage the inlet nozzle. Similarly, if a plurality of metal/metalloid precursors is used, these precursors should not significantly react prior to entering the radiation reaction zone. If the reactants are spontaneously reactive, a metal/metalloid precursor and the secondary reactant and/or different metal/metalloid precursors can be delivered in separate reactant inlets into the reaction chamber such that they are combined just prior to reaching the light beam.

Light reactive deposition can be performed with radiation at a variety of optical frequencies, using either a laser or other intense radiation source. Convenient light sources operate in the infrared portion of the electromagnetic spectrum, although other wavelengths can be used, such as the visible and infrared regions of the spectrum. Excimer lasers can be used as ultraviolet sources. $CO_2$ lasers are particularly useful sources of infrared light. Infrared absorber(s) for inclusion in the reactant stream include, for example, $C_2H_4$, isopropyl alcohol, $NH_3$, $SF_6$, $SiH_4$ and $O_3$. $O_3$ can act as both an infrared absorber and as an oxygen source. The radiation absorber(s), such as the infrared absorber(s), can absorb energy from the radiation beam and distribute the energy to the other reactants to drive the pyrolysis.

Generally, the energy absorbed from the radiation beam, e.g., light beam, increases the temperature at a tremendous rate, many times the rate that heat generally would be produced by exothermic reactions under controlled condition(s). While the process generally involves nonequilibrium conditions, the temperature can be described approximately based on the energy in the absorbing region. The light reactive deposition process, similar to the laser pyrolysis process, is qualitatively different from the process in a combustion reactor where an energy source initiates a reaction, but the reaction is driven by energy given off by an exothermic reaction. Thus, while the light driven process for particle collection is referred to as laser pyrolysis, it is not a traditional pyrolysis since the reaction is not driven by energy given off by the reaction but by energy absorbed from a radiation beam. In particular, spontaneous reaction of the reactants generally does not proceed significantly, if at all, back down the reactant flow toward the nozzle from the intersection of the radiation beam with the reactant stream. If necessary, the flow can be modified such that the reaction zone remains confined.

An inert shielding gas can be used to reduce the amount of reactant and product molecules contacting the reactant chamber components. Inert gases can also be introduced into the reactant stream as a carrier gas and/or as a reaction moderator. Appropriate inert gases generally include, for example, Ar, He and $N_2$.

The particle production rate based on reactant delivery configurations described herein can yield particle production rates in the range(s) of at least about 50 g/h, in other embodiments in the range(s) of at least about 100 g/h, in further embodiments in the range(s) of at least about 250 g/h, in additional embodiments in the range(s) of at least about 1 kilogram per hour (kg/h) and in general up in the range(s) up to at least about 10 kg/h.

In general, these high production rates can be achieved while obtaining relatively high reaction yields, as evaluated by the portion of metal/metalloid nuclei in the flow that are incorporated into the product particles, a portion of which are incorporated into the powder coating. In general, the yield can be in the range(s) of at least about 30 percent based on the limiting reactant, in other embodiments in the range(s) of at least about 50 percent, in further embodiments in the range(s) of at least about 65 percent, in other embodiments in the range(s) of at least about 80 percent and in additional embodiments in the range(s) of at least about 95 percent based on the metal/metalloid nuclei in the reactant flow. A person of ordinary skill in the art will recognize that additional values of particle production rate and yield within these specific values are contemplated and are within the present disclosure.

Particle Deposition

In embodiments of particular interest, the powder coatings are formed by light reactive deposition. In light reactive deposition, a highly uniform flow of product particles is formed that are directed toward a substrate to be coated. The resulting particle coating can be formed into an optical material, such as a glass or crystal. In particular, the powder coatings can be subsequently processed into high quality optical coatings by densifying the powder coating.

Light reactive deposition/radiation-based reactive deposition is a coating approach that uses an intense radiation source, e.g., light source, to drive synthesis of desired compositions from a flowing reactant stream. Light reactive deposition can result in deposition of powders, although hot particles deposited on the surface can partly fuse during the deposition process due to their temperature. Generally, particles in a product flow, as described herein, can be solid particles, liquid particles and softened particles that have not cooled sufficiently to completely solidify. Light reactive deposition involves a flowing reactant stream that intersects with the radiation beam at a reaction zone where reaction products form particles at least a portion of which are subsequently deposited onto a substrate. While the particles produced in laser pyrolysis are collected for subsequent use, in light reactive deposition, the resulting compositions are directed to a substrate surface where a coating is formed.

The characteristics of laser pyrolysis that can lead to the production of highly uniform particles can be correspondingly implemented in the production of coatings with high uniformity with additional attention to features relating to coating formation. In particular, a well-defined laser reaction zone result in particles with uniform size and composition that result in uniform coating properties. The shape of the laser beam can be controlled to produce particles under very uniform heating, nucleation and quenching conditions. The uniform particle size results in uniform packing and more controlled melting such that the resulting consolidated film has uniform and reproducible thickness. A uniformity in composition of the particles results in improved uniformity and reproducibility of index-of-refraction. The use of a flash evaporator for reactant delivery can improve the uniformity of chemical delivery, which further improves the uniformity of the chemical composition of the particles. Furthermore, in contrast with other methods that require the scanning of a substrate in two dimensions to form a layer, an elongated reactant inlet provides for the deposition of a uniform coating layer with one or few passes through the product stream such that a large number of stripes do not have to be stitched together.

In light reactive deposition, the coating of the substrate can be performed in a coating chamber separate from the reaction chamber or the coating can be performed within the reaction chamber. In either of these configurations, the reactant delivery system can be configured for the production of particles with various compositions. Thus, a wide range of coatings can be formed for further processing into optical materials.

If the coating is performed in a coating chamber separate from the reaction chamber, the reaction chamber is essentially the same as the reaction chamber for performing laser pyrolysis, although the reactant throughput and the reactant stream size may be designed to be appropriate for the coating process. For these embodiments, the coating chamber and a conduit connecting the coating chamber with the reaction chamber replace the collection system of the laser pyrolysis system. If the coating is performed within the reaction chamber, a substrate intercepts flow from the reaction zone, directly capturing the particles onto its surface.

A laser pyrolysis apparatus design incorporating an elongated reactant inlet has been developed that facilitates production of commercial quantities of particles. Specifically, the reaction chamber and reactant inlet are elongated significantly along the light beam to provide for an increase in the throughput of reactants and products. By orienting the light beam along the elongated reactant stream, a sheet of product particles is generated. This design has been described in U.S. Pat. No. 5,958,348 to Bi et al., entitled "Efficient Production of Particles by Chemical Reaction," incorporated herein by reference.

Additional embodiments and other appropriate features for commercial capacity laser pyrolysis apparatuses are described in copending and commonly assigned U.S. patent application Ser. No. 09/362,631 to Mosso et al., entitled "Particle Production Apparatus," incorporated herein by reference. The delivery of gaseous/vapor reactants and/or aerosol reactants, as described further below, can be adapted for the elongated reaction chamber design. These designs for commercial production of powders by laser pyrolysis can be adapted for rapid coating of high quality optical materials by light reactive deposition.

The size of the elongated reactant inlet can be selected based on the size of the substrate to be coated. In some embodiments, the reactant inlet is somewhat larger than the diameter or other dimension across the substrate, such as a width, such that the entire substrate can be coated in one pass through the product stream. In other embodiments, the substrate is placed far enough away from the reactant inlet that the product particle stream spreads significantly prior to reaching the substrate such that a larger area of the substrate is simultaneously coated.

In general, the particle production apparatus with the elongated reactant inlet is designed to reduce contamination of the chamber walls, to increase the production capacity and to make efficient use of resources. Due to the chamber design, the elongated reaction chamber can provide for an increased throughput of reactants and products without compromising other performance properties during deposition. The dead volume of the chamber can become contaminated with unreacted compounds and/or reaction products. Furthermore, an appropriate flow of shielding gas can confine the reactants and products within a flow stream through the reaction chamber. The high throughput of reactants makes efficient use of the radiation (e.g., light) energy.

With light reactive deposition, the rate of production and/or deposition of the particles can be varied substantially, depending on a number of factors (e.g., the starting materials being utilized, the desired reaction product, the reaction conditions, the deposition efficiency, the like, and combinations thereof). Thus, in one embodiment, the rate of particle production can vary in the range(s) from about 5 grams per hour of reaction product to about 10 kilograms per hour of desired reaction product. Specifically, using apparatuses described herein, coating can be accomplished at particle production rates in the range(s) of up to at least about 10 kilograms per hour (kg/hr), in other embodiments in the range(s) of at least about 1 kg/hr, in further embodiments with lower production rates in the range(s) of at least about 250 grams per hour (g/hr) and in additional embodiments in the range(s) of at least about 50 g/hr. A person of ordinary skill in the art will recognize that production rates intermediate between these explicit production rates are contemplated and are within the present disclosure. Exemplary rates of particle production (in units of grams produced per hour) include in the range(s) of not less than about 5, 10, 50, 100, 250, 500, 1000, 2500, 5000, or 10000.

Not all of the particles generated are deposited on the substrate. In general the deposition efficiency depends on the relative speed of the substrate through the product stream with the particles, for embodiments based on moving the substrate through a sheet of product particles. Other factors affecting deposition efficiency include, for example, the particle composition, particle temperature and substrate temperature. At moderate relative rates of substrate motion, coating efficiencies in the range(s) of not less than about 15 to about 20 percent have been achieved, i.e. about 15 to about 20 percent of the produced particles are deposited on the substrate surface. Routine optimization can increase this deposition efficiency further. At slower relative motion of the substrate through the product particle stream, deposition efficiencies in the range(s) of at least about 40 percent have been achieved and can be as high as 80 percent or more. In some embodiments, the rates of particle production are in the range(s) such that at least about 5 grams per hour, or alternatively or in addition, in the range(s) of at least about 25 grams per hour, of reaction product are deposited on the substrate. In general, with the achievable particle production rates and deposition efficiencies, deposition rates can be obtained in the range(s) of at least about 5 g/hr, in other embodiments in the range(s) of at least about 25 g/hr, in further embodiments in the range(s) of at least from about 100 g/hr to about 5 kg/hr and in still other embodiment in the range(s) from about 250 g/hr to about 2.5 kg/hr. A person of ordinary skill in the art will recognize that deposition rates between these explicit rates are contemplated and are within the present disclosure. Exemplary rates of particle deposition (in units of grams deposited per hour) include in the range(s) of not less than about 0.1, 0.5, 1, 5, 10, 25, 50, 100, 250, 500, 1000, 2500, or 5000.

Alternatively or in addition, the invention provides that the rate of the movement of the substrate and the particle flow relative to each other can vary substantially, depending on the desired specifications for the coated substrate. Thus, in one embodiment, the rate can be measured on an absolute scale, and can vary in the range(s) of at least about 0.001 inches per second, in other embodiments at least about 0.05 inches per second, in further embodiments, from about 1 inch per second to about 12 inches per second, or even more. A person of ordinary skill in the art will recognize that additional ranges and subranges within these explicit ranges are contemplated and are encompassed within the present disclosure. Further, in another embodiment, the rate can be measured on a scale relative to the substrate being coated, and can vary in the range(s) from about 0.05 substrates per minute to about 1 substrate per second.

For suitable wafer/substrate sizes, at least a substantial portion of the substrate surface can be coated with a sufficient thickness to form a consolidated material at a rate in the range(s) of 2 microns per minute, in other embodiments in the range(s) of at least about 5 microns per minute, in some embodiments in the range(s) at least about 20 microns per minute, and in further embodiments in the range(s) at least about 100 microns per minute, in which the thickness refers to a powder coating sufficiently thick to form a consolidated material at the specified thickness. A person or ordinary skill in the art will recognize that additional ranges within these explicit ranges are contemplated and are within the present disclosure.

For appropriate embodiments using a sheet of product particles, the rate of relative substrate motion generally is a function of the selected deposition rate and the desired coating thickness as limited by the movement the substrate at the desired rate while obtaining desired coating uniformity. In embodiments in which the substrate is swept through the product particle stream, the substrate can be moved relative to a fixed nozzle, or the nozzle can be moved relative to a fixed substrate. Due to the high deposition rates achievable with light reactive deposition, extremely fast coating rates are easily achievable. These coating rates by light reactive deposition are dramatically faster than rates that are achievable by competing methods. In particular, at particle production rates of about 10 kg/hr, an eight-inch wafer can be coated with a thickness of about 10 microns of powder in approximately one second even at a deposition efficiency of only about 2.5 percent, assuming a powder density of about 10% of the bulk density. A person of ordinary skill in the art can calculate with simple geometric principles any one of the following variables based on one or more of the other variables from the group of a coating rate, the deposition rate, the desired thickness and the density of powder on the substrate.

In particular, apparatus designs based on an actuator arm moving a substrate through the product particle stream within a reaction chamber, as described herein, can straightforwardly move a substrate at rates to coat an entire eight-inch wafer in about 1 second or less. Generally, in embodiments of particular interest that take advantage of the rapid rates achievable, substrates are coated at rates in the range(s) of at least about 0.1 centimeters per second (cm/s), in additional embodiments in the range(s) at least about 0.5 cm/s, in other embodiments in the range(s) at least about 1 cm/s, in further embodiments in the range(s) from about 2 cm/s to about 30 cm/s, and in other embodiments in the range(s) from about 5 cm/s to about 30 cm/s. A person of ordinary skill in the art will recognize that coating rates intermediate between these explicit rates are contemplated and are within the present disclosure.

Furthermore, the rapid production rate can be advantageously used to form a plurality of particle coatings with or without consolidation between coatings. Each coating can cover an entire layer or a portion of a layer. Compositions can be changed within a layer or between layers. When changing compositions significantly between layers, it may be desirable to wait a few seconds for the product stream to stabilize.

The design of the elongated reaction chamber 100 for generating a sheet of product particles is shown schematically in FIG. 1. A reactant inlet 102 leads to main chamber 104. Reactant inlet 102 conforms generally to the shape of main chamber 104. Main chamber 104 comprises an outlet 106 along the reactant/product stream for removal of particulate products, any unreacted gases and inert gases. Shielding gas inlets 108 are located on both sides of reactant inlet 102. Shielding gas inlets are used to form a blanket of inert gases on the sides of the reactant stream to inhibit contact between the chamber walls and the reactants or products. The dimensions of elongated reaction chamber 104 and reactant inlet 102 can be designed for highly efficiency particle production. Reasonable dimensions for reactant inlet 102 for the production of nanoparticles, when used with a $CO_2$ laser with a power in the several kilowatt range, are from about 5 mm to about 1 meter.

Tubular sections 110, 112 extend from the main chamber 104. Tubular sections 110, 112 hold windows 114, 116, respectively, to define a light beam path 118 through the reaction chamber 100. Tubular sections 110, 112 can comprise inert gas inlets 120, 122 for the introduction of inert gas into tubular sections 110, 112.

Outlet 106 can lead to a conduit directed to a coating chamber. The reaction zone is located within the reaction chamber. A change in dimension does not necessarily demarcate a transition from the reaction chamber to a conduit to the coating chamber for appropriate embodiments. The conduit can but does not necessarily involve a change in direction of the flow. Alternatively or additionally, a substrate can intercept the product flow to coat the substrate within the reaction chamber.

Figure 2:
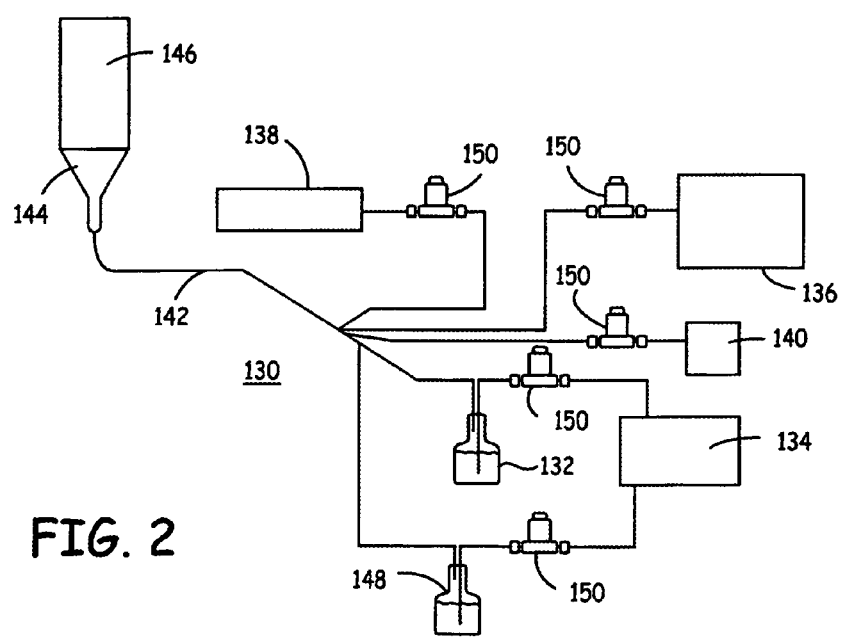
FIG. 2 is a schematic representation of a reactant delivery system for the delivery of vapor/gas reactants to a flowing reaction system, such as the laser pyrolysis reactor of FIG. 1.

Reactant inlet 102 is generally connected to a reactant delivery system. Referring to FIG. 2, an embodiment 130 of a reactant delivery apparatus comprises a source 132 of a precursor compound, which can be a liquid, solid or gas. For liquid or solid reactants, an optional carrier gas from one or more carrier gas sources 134 can be introduced into precursor source 132 to facilitate delivery of the reactant. Precursor source 132 can be a liquid holding container, a solid precursor delivery apparatus or other suitable container. The carrier gas from carrier gas source 134 can be, for example, an infrared absorber, an inert gas or mixtures thereof. In alternative embodiments, precursor source 132 is a flash evaporator that can deliver a selected vapor pressure of precursor without necessarily using a carrier gas. A flash evaporator can deliver a selected partial pressure of a precursor vapor into the reaction chamber, and other components leading to the reaction chamber can be heated, if appropriate, to reduce or eliminate condensation of the vapor prior to entry into the reaction chamber. Thus, a plurality of flash evaporators can be used to deliver precisely a plurality of vapor reactants into the reaction chamber.

The gases/vapors from precursor source 132 can be mixed with gases from infrared absorber source 136, inert gas source 138 and/or gaseous reactant source 140 by combining the gases/vapors in a single portion of tubing 142. The gases/vapors are combined a sufficient distance from the reaction chamber such that the gases/vapors become well mixed prior to their entrance into the reaction chamber. The combined gas/vapor in tube 142 passes through a duct 144 into channel 146, which is in fluid communication with a reactant inlet, such as 102 in FIG. 1.

An additional reactant precursor can be supplied as a vapor/gas from second reactant source 148, which can be a liquid reactant delivery apparatus, a solid reactant delivery apparatus, a flash evaporator, a gas cylinder or other suitable container or containers. As shown in FIG. 2, second reactant source 148 delivers an additional reactant to duct 144 by way of tube 142. Alternatively, second reactant source can deliver the second reactant into a second duct such that the two reactants are delivered separately into the reaction chamber where the reactants combine at or near the reaction zone. Thus, for the formation of complex materials and/or doped materials, a significant number of reactant sources and, optionally, separate reactant ducts can be used for reactant/precursor delivery. For example, as many as 25 reactant sources and/or ducts are contemplated, although in principle, even larger numbers could be used. Mass flow controllers 150 can be used to regulate the flow of gases/vapors within the reactant delivery system of FIG. 2. Additional reactants/precursors can be provided similarly for the synthesis of complex materials.

As noted above, the reactant stream can comprise one or more aerosols. The aerosols can be formed within the reaction chamber or outside of the reaction chamber prior to injection into the reaction chamber. If the aerosols are produced prior to injection into the reaction chamber, the aerosols can be introduced through reactant inlets comparable to those used for gaseous reactants, such as reactant inlet 102 in FIG. 1. For the formation of complex material, additional aerosol generators and/or vapor/gas sources can be combined to supply the desired composition within the reactant stream.

Figure 3:
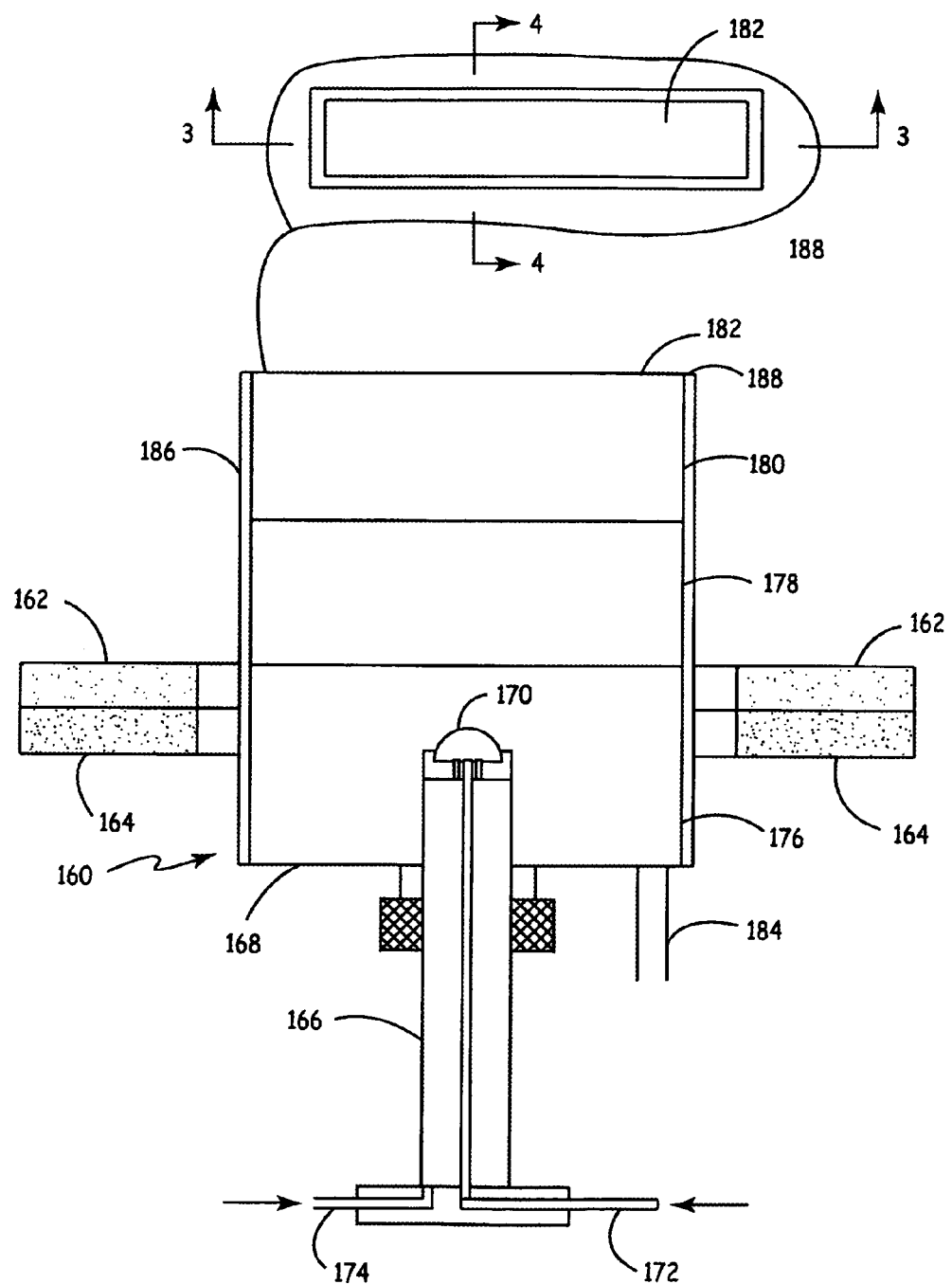
FIG. 3 is a sectional side view of a reactant inlet nozzle with an aerosol generator for the delivery of aerosol and gas/vapor compositions into a reaction chamber, wherein the cross section is taken along line 3-3 of the insert. The insert shows a top view of an elongated reactant inlet.
Figure 4:
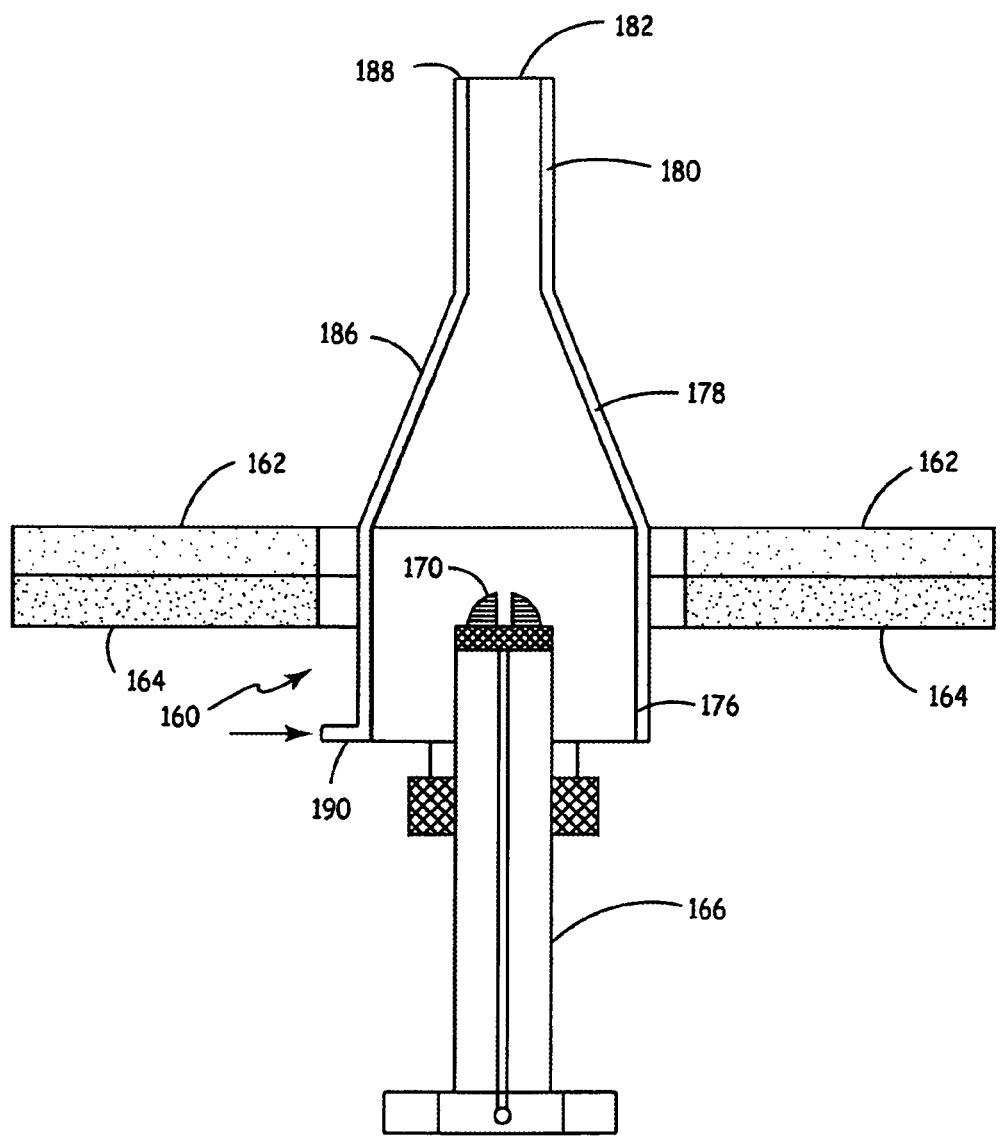
FIG. 4 is a sectional side view of the reactant inlet nozzle of FIG. 3 taken along the line 4-4 of the insert in FIG. 3.

An embodiment of a reactant delivery nozzle configured to deliver an aerosol reactant is shown in FIGS. 3 and 4. Inlet nozzle 160 connects with a reaction chamber at its lower surface 162. Inlet nozzle 160 comprises a plate 164 that bolts into lower surface 162 to secure inlet nozzle 160 to the reaction chamber. Inlet nozzle 160 comprises an inner nozzle 166 and an outer nozzle 168. Inner nozzle 166 can have, for example, a twin orifice internal mix atomizer 170 at the top of the nozzle. Suitable gas atomizers are available from Spraying Systems, Wheaton, Ill. The twin orifice internal mix atomizer 170 has a fan shape to produce a thin sheet of aerosol and gaseous compositions. Liquid is fed to the atomizer through tube 172, and gases for introduction into the reaction chamber are fed to the atomizer through tube 174. Interaction of the gas with the liquid assists with droplet formation.

Outer nozzle 168 comprises a chamber section 176, a funnel section 178 and a delivery section 180. Chamber section 176 holds the atomizer of inner nozzle 166. Funnel section 178 directs the aerosol and gaseous compositions into delivery section 180. Delivery section 180 leads to a rectangular reactant opening 182, shown in the insert of FIG. 3. Reactant opening 182 forms a reactant inlet into a reaction chamber for laser pyrolysis or light reactive deposition. Outer nozzle 168 comprises a drain 184 to remove any liquid that collects in the outer nozzle. Outer nozzle 168 is covered by an outer wall 186 that forms a shielding gas opening 188 surrounding reactant opening 182. Inert shielding gas is introduced through tube 190. Additional embodiments for the introduction of an aerosol with one or more aerosol generators into an elongated reaction chamber is described in U.S. Pat. No. 6,193,936 to Gardner et al., entitled "Reactant Delivery Apparatuses," incorporated herein by reference.

A secondary reactant compound such as an oxygen source, if present, should not react significantly with the metal precursor prior to entering the reaction zone since this generally would result in the formation of large particles. However, reacting precursors can be delivered into the reactant chamber through separate nozzles and/or separate inlets on a particular nozzle such that the reactant do not combine until they are near the reaction zone.

Light reactive deposition can be performed with a variety of optical frequencies, using either a laser or other strong focused radiation source, such as an arc lamp. Some desirable light sources operate in the infrared portion of the electromagnetic spectrum. $CO_2$ lasers are particularly convenient sources of light. Infrared absorbers for inclusion in the reactant stream comprise, for example, $C_2H_4$, water, isopropyl alcohol, $NH_3$, $SF_6$, $SiH_4$ and $O_3$. $O_3$ can act as both an infrared absorber and as an oxygen source. The radiation absorber, such as the infrared absorber, absorbs energy from the radiation beam and distributes the energy to the other reactants to drive the reaction.

Generally, the energy absorbed from the light beam increases the temperature at a tremendous rate, many times the rate that heat generally would be produced by exothermic reactions under controlled condition. While the process generally involves nonequilibrium conditions, the temperature can be described approximately based on the energy in the absorbing region. In light reactive deposition, the reaction process is qualitatively different from the process in a combustion reactor where an energy source initiates a reaction, but the reaction is driven by energy given off by an exothermic reaction. In a combustion reactor, there is generally no well-defined reaction zone with a boundary. The reaction zone is large and the residence time of the reactants is long. Lower thermal gradients are generally present in the combustion reactor.

In contrast, the laser/light driven reactions have extremely high heating and quenching rates. The product compositions and particle properties generally depend on the radiation power in the reactions zone and the quantity of radiation absorbers in the flow. By controlling the composition of the reactant flow and the light intensity in the reaction zone, the reaction product can be reproducibly controlled. The effective temperature in the reaction zone can be controlled over a wide range, for example, in the range(s) from about room temperature (e.g., 20° C.) to about 3000° C. In light reactive deposition, the reaction zone is primarily at the overlap of the light beam and the reactant stream, although the reaction zone may extend, for example, a few millimeters beyond the light beam, depending on the precise character of the reaction. After leaving the reaction zone in a radiation/light driven reactor, the particles may still be somewhat fluid/soft due to their temperature even if the reaction has terminated.

An inert shielding gas can be used to reduce the amount of reactant and product molecules contacting the reactant chamber components. Inert gases can also be introduced into the reactant stream as a carrier gas and/or as a reaction moderator. Appropriate inert shielding gases comprise, for example, Ar, He and $N_2$.

Laser pyrolysis apparatuses can be adapted for light reactive deposition. The nature of the adaptation depends on whether or not the coating is performed in the reaction chamber or within a separate coating chamber. In any of the embodiments, the reactant delivery inlet into the reaction chamber generally is configured to deliver a reactant stream with dimensions that results in a product stream with desired dimensions for the deposition process. For example, in some embodiments, the reactant inlet has a length approximately the same size or slightly larger than the diameter of a substrate such that the substrate can be coated along an entire dimension of the substrate with one pass through the product stream without wasting excessive amount of product.

Figure 5:
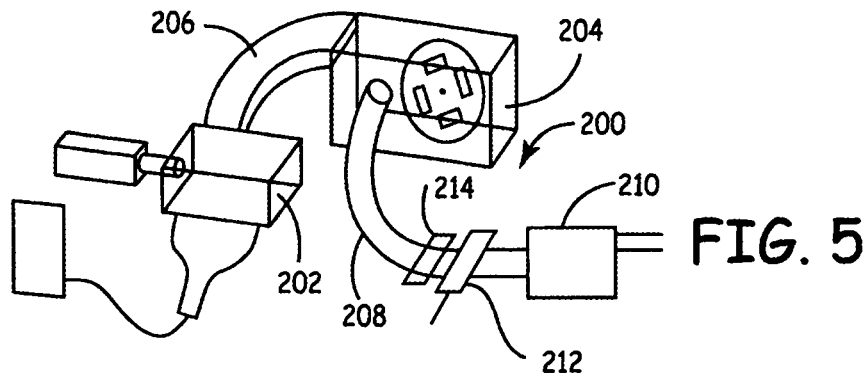
FIG. 5 is a schematic diagram of a light reactive deposition apparatus formed with a particle production apparatus connected to a separate coating chamber through a conduit.

The outlet of a laser pyrolysis apparatus can be adapted for the coating of substrates within a separate coating chamber. A coating apparatus with separate reaction chamber and coating chamber is shown schematically in FIG. 5. The coating apparatus 200 comprises a reaction chamber 202, a coating chamber 204, a conduit 206 connecting reaction chamber 202 with coating chamber 204, an exhaust conduit 208 leading from coating chamber 204 and a pump 210 connected to exhaust conduit 208. A valve 212 can be used to control the flow to pump 210. Valve 212 can be, for example, a manual needle valve or an automatic throttle valve. Valve 212 can be used to control the pumping rate and the corresponding chamber pressures. A collection system, filter, scrubber or the like 214 can be placed between the coating chamber 204 and pump 210 to remove particles that did not get coated onto the substrate surface.

Figure 6:
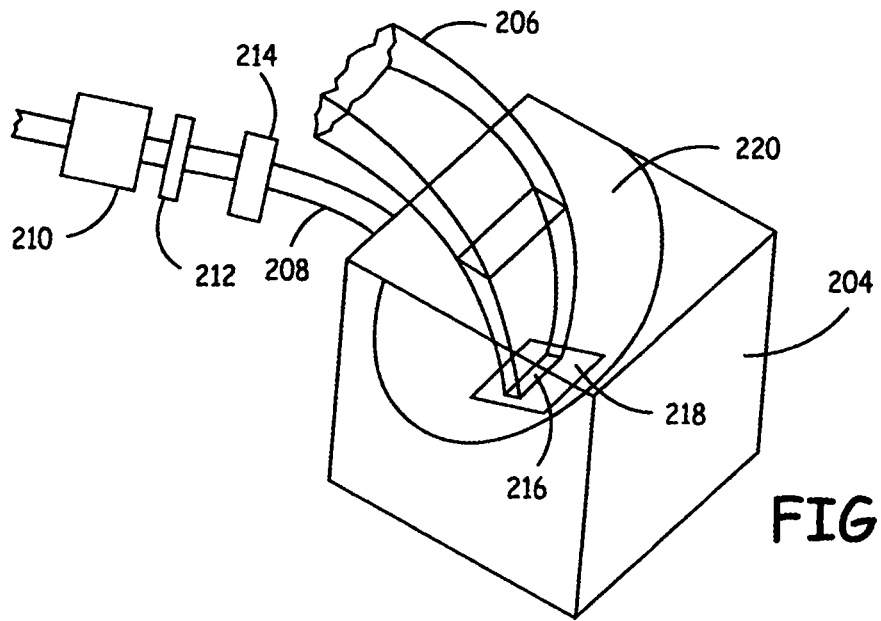
FIG. 6 is a perspective view of a coating chamber where the walls of the chamber are transparent to permit viewing of the internal components.

Referring to FIG. 6, conduit 206 from the particle production apparatus 202 leads to coating chamber 204. Conduit 206 terminates at opening 216 within chamber 204. In some embodiments, conduit opening 216 is located near the surface of substrate 218 such that the momentum of the particle stream directs the particles directly onto the surface of substrate 218. Substrate 218 can be mounted on a stage or other platform 220 to position substrate 218 relative to opening 216.

Figure 7:
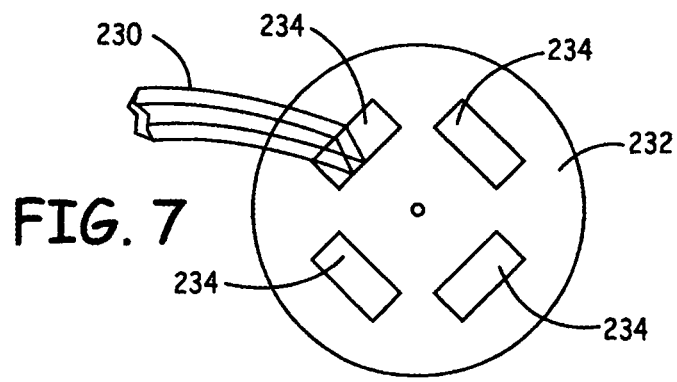
FIG. 7 is perspective view of a particle nozzle directed at a substrate mounted on a rotating stage.

An embodiment of a stage to position a substrate relative to the conduit from the particle production apparatus is shown in FIG. 7. A particle nozzle 230 directs particles toward a rotating stage 232. As shown in FIG. 7, four substrates 234 are mounted on stage 232. More or fewer substrates can be mounted on a moveable stage with corresponding modifications to the stage and size of the chamber. A motor is used to rotate stage 232. Other designs for a stage, conveyor or the like can be used to sweep the substrate through the product particle flow.

Movement of stage 232 sweeps the particle stream across a surface of one particular substrate 234 within the path of nozzle 230. Stage 232 can be used to pass sequential substrates through the product stream for one or more coating applications to each substrate. Stage 232 can comprise thermal control features that provide for the control of the temperature of the substrates on stage 232. Alternative designs involve the linear movement of a stage or other motions. In other embodiments, the particle stream is unfocused such that an entire substrate or the desired portions thereof is simultaneously coated without moving the substrate relative to the product flow.

If the coating is performed within the reaction chamber, the substrate is mounted to receive product compositions flowing from the reaction zone. The compositions/particles may not be fully solidified into solid particles, although quenching may be fast enough to form solid particles. Whether or not the compositions are solidified into solid particles, the particles can be highly uniform. The distance from the reaction zone to the substrate can be selected to yield desired coating results. In some embodiments, the substrate is mounted near the reaction zone. In general, the substrate/wafer is placed in the range(s) from about 1 millimeter (mm) to about 1 meter coaxial to the reactant flow vector measured from the radiation beam edge, i.e., the downstream locus of points where the radiation intensity is a factor of $1/e^2$ of the maximum beam intensity, in other embodiments in the range(s) from about 2 mm to 50 centimeters (cm), and in further embodiments in the range(s) from about 3 mm to about 30 cm, although in some circumstances it is conceived that distances less than 1 mm and/or greater than 1 meter can have utility. A person of ordinary skill in the art will understand that additional ranges within the explicit ranges of substrate distances are conceived and are within the present disclosure. If the substrate is closer to the reaction zone, the coating process is more dynamic since the well defined product flow can be directed to desired substrate locations. However, if the substrate is placed farther away from the reaction zone, the coating process is more static in the sense that a more diffuse cloud of product particles is directed at the substrate.

Figure 8:
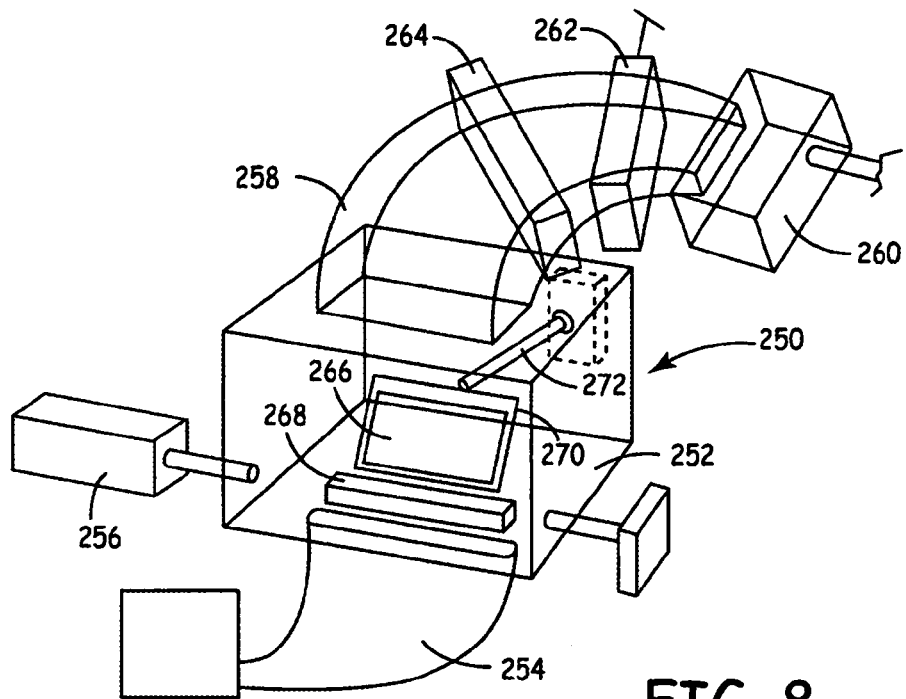
FIG. 8 is a schematic diagram of a light reactive deposition apparatus in which a particle coating is applied to a substrate within the particle production chamber.

An apparatus 250 to perform substrate coating within the reaction chamber is shown schematically in FIG. 8. The reaction/coating chamber 252 is connected to a reactant supply system 254, a radiation source 256 and an exhaust 258. Exhaust 258 can be connected to a pump 260, although the pressure from the reactant stream itself can maintain flow through the system. A valve 262 can be used to control the flow to pump 260. Valve 262 can be used to adjust the pumping rate and the corresponding chamber pressures. A collection system, filter, scrubber or the like 264 can be placed between chamber 252 and pump 260 to remove particles that did not get coated onto the substrate surface.

Substrate 266 can contact flow from a reaction zone 268 to coat the substrate with product particles/powders. Substrate 266 can be mounted on a stage, conveyor, or the like 270 to sweep substrate 266 through the flow. Specifically, stage 270 can be connected to an actuator arm 272 or other motorized apparatus to move stage 270 to sweep the substrate through the product stream. Various configurations can be used to sweep the coating across the substrate surface as the product leaves the reaction zone. A shown in FIG. 8, actuator arm 272 translates stage 270 to sweep substrate 266 through the product stream.

Figure 9:
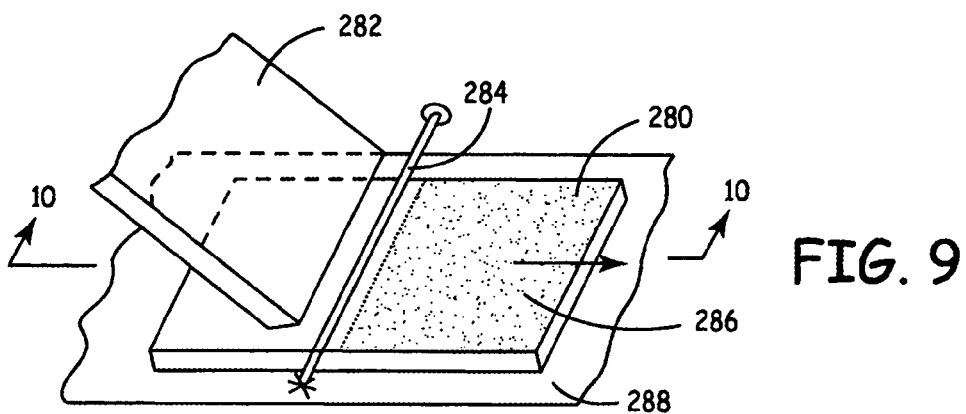
FIG. 9 is a perspective view of a reactant nozzle delivering reactants to a reaction zone positioned near a substrate.
Figure 10:
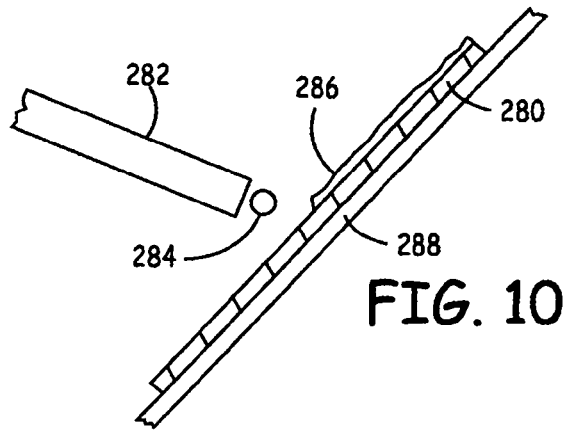
FIG. 10 is a sectional view of the apparatus of FIG. 9 taken along line 10-10.

A similar embodiment is shown in an expanded view in FIGS. 9 and 10. A substrate 280 moves relative to a reactant nozzle 282, as indicated by the right directed arrow. Reactant nozzle 282 is located just above substrate 280. An optical path 284 is defined by suitable optical elements that direct a light beam along path 284. Optical path 284 is located between nozzle 282 and substrate 280 to define a reaction zone just above the surface of substrate 280. The hot particles tend to attract to the cooler substrate surface.

Referring to FIGS. 9 and 10, a particle coating 286 is formed as the substrate is scanned past the reaction zone. In general, substrate 280 can be carried on a conveyor/stage 288. Conveyor/stage 288 can be connected to an actuator arm, as shown in FIG. 8. In alternative embodiments, rollers and a motor, a continuous belt conveyor, or any of a variety of design, comprising known designs, for translating a substrate can be used to carry the substrate.

In some embodiments, the position of conveyor 288 can be adjusted to alter the distance from substrate 286 to the reaction zone. Changes in the distance from substrate to the reaction zone correspondingly alter the temperature of the particles striking the substrate. The temperature of the particles striking the substrate generally alters the properties of the resulting coating and the requirements for subsequent processing, such as a subsequent heat processing consolidation of the coating. The distance between the substrate and the reaction zone can be adjusted empirically to produce desired coating properties. In addition, the stage/conveyor supporting the substrate can comprise thermal control features such that the temperature of the substrate can be adjusted to higher or lower temperatures, as desired.

For any of the coating configurations, the intersection of the flow with the substrate deflects the trajectory of the flow. Thus, it may be desirable to alter the position of the reaction chamber outlet to account for the change in direction of the flow due to the substrate. For example, it may be desirable to alter the chamber design to direct the reflected flow to the outlet and/or to change the position of the outlet accordingly. One particular example of an alternative flow configuration is shown in the embodiment below.

Figure 11:
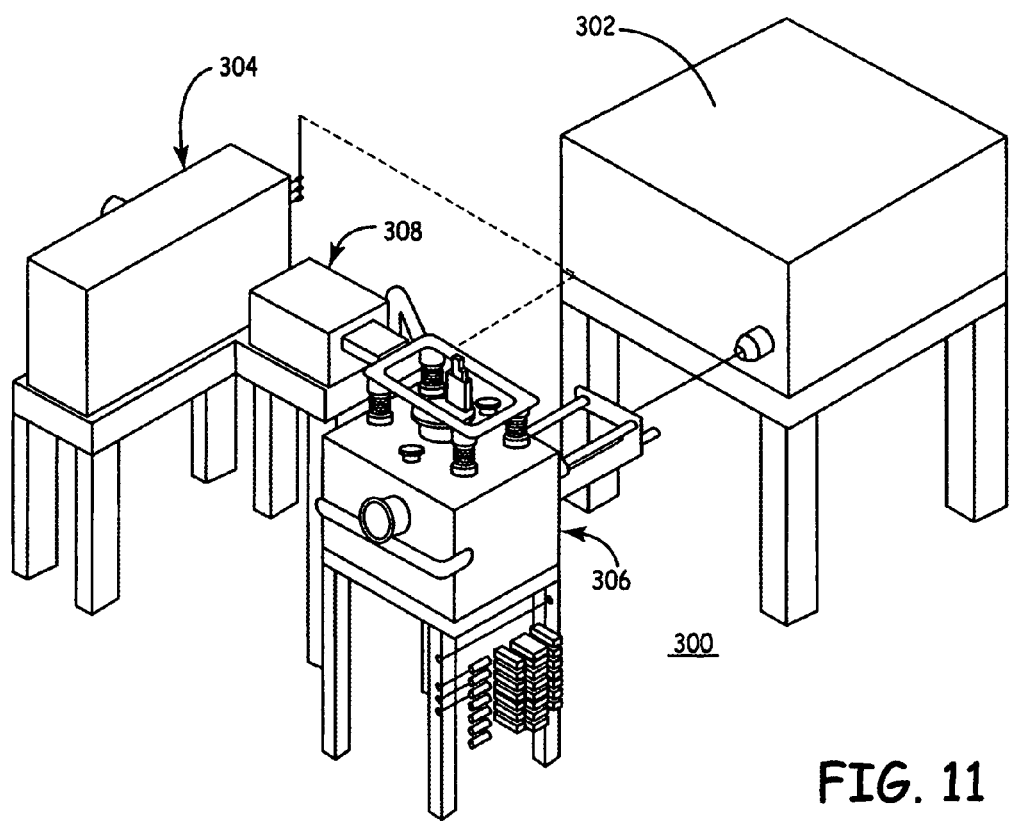
FIG. 11 is a perspective view of an embodiment of a light reactive deposition apparatus.

A specific embodiment of a light reactive deposition apparatus is shown in FIG. 11. Apparatus 300 comprises a $CO_2$ laser light source 302, a reactant delivery system 304, a reaction chamber 306, and exhaust system 308. In this embodiment, reactant delivery system 304 is configured specifically for the delivery of vapor/gaseous reactants. The specific diagram is shown with some specific reactants for forming doped silica glasses, although other reactants can be further included or substituted based on the disclosure herein.

Figure 12:
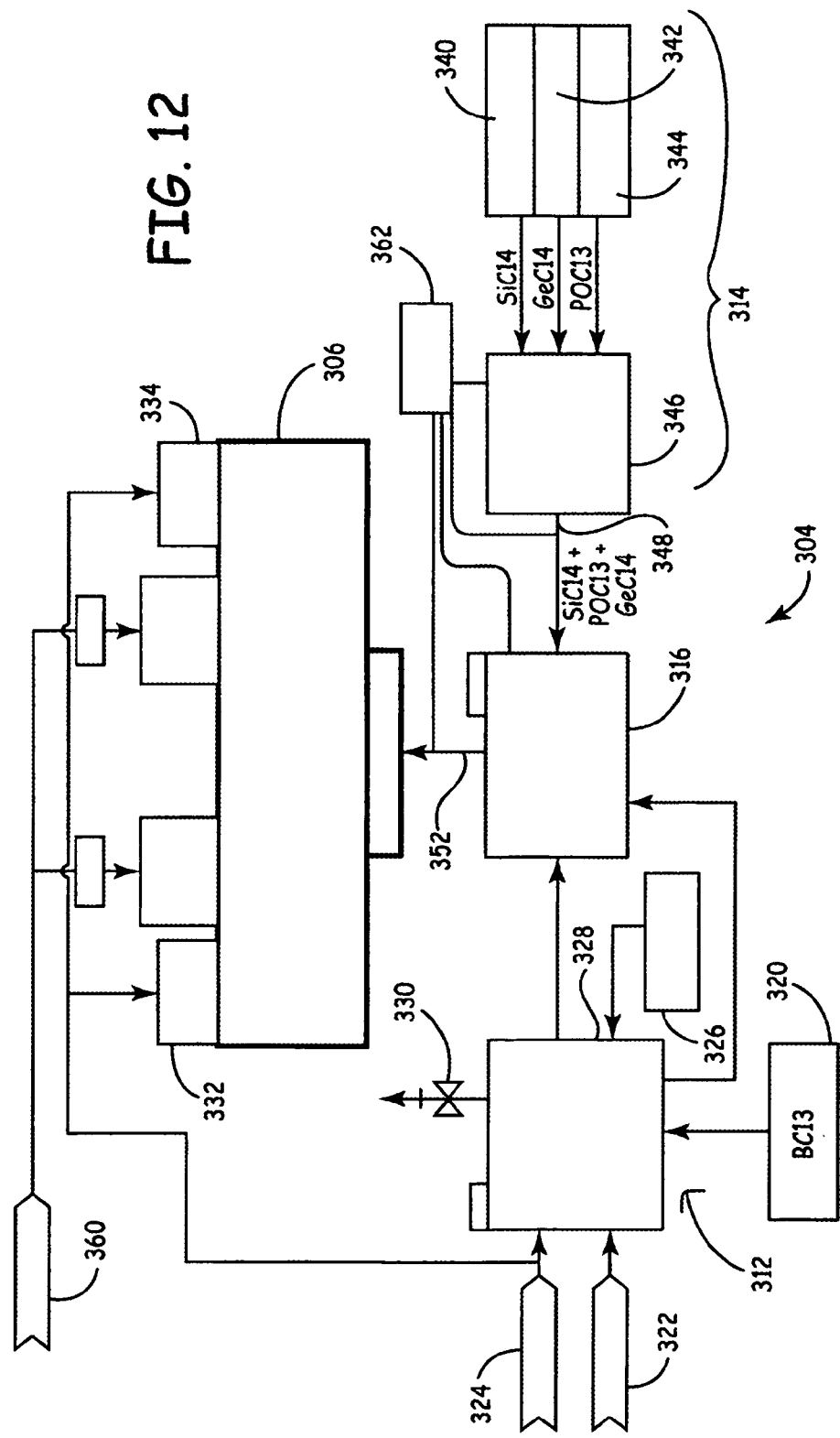
FIG. 12 is schematic diagram of the reactant delivery system of the apparatus in FIG. 11.

Reactant delivery system 304 is shown schematically in FIG. 12. As shown in FIG. 12, reactant delivery system 304 comprises a gas delivery subsystem 312 and a vapor delivery subsystem 314 that join a mixing subsystem 316. Gas delivery subsystem 312 can comprise one or more gas sources, such as a gas cylinder or the like for the delivery of gases into the reaction chamber. As shown in FIG. 12, gas delivery subsystem 312 comprises boron precursor source 320, an oxygen source precursor 322, an inert gas source 324, and a light absorbing gas source 326. The gases combine in a gas manifold 328 where the gases can mix. Gas manifold can have a pressure relief valve 330 for safety. Inert gas source 324 can be also used to supply inert gas within the chamber adjacent the windows/lenses 332, 334 used to direct light from an external light source into chamber 306.

Vapor delivery subsystem 314 comprises a plurality of flash evaporators 340, 342, 344. Each flash evaporator can be connected to a liquid reservoir to supply liquid precursor in suitable quantities. Suitable flash evaporators are available from, for example, MKS Equipment or can be produced from readily available components. As shown in FIG. 12, flash evaporators 340, 342, 344 respectively supply a silicon precursor, a germanium precursor and a phosphorous precursor. The flash evaporators can be programmed to deliver a selected partial pressure of the particular precursor. The vapors from the flash evaporator are directed to a manifold 346 that directs the vapors to a common feed line 348. The vapor precursors mix within common feed line 348.

The gas components from gas delivery subsystem 312 and vapor components from vapor delivery subsystem 314 are combined within mixing subsystem 316. Mixing subsystem 316 is a manifold that combines the flow from gas delivery subsystem 312 and vapor delivery subsystem 316. In the mixing subsystem 316, the inputs are oriented to improve mixing of the combined flows of different vapors and gases at different pressures. The mixing block has a slanted termination to reduce backflow into lower pressure sources. A conduit 352 leads from mixing system 350 to reaction chamber 304.

A separate shielding gas system 360 can be used to delivery inert shielding gas to a moving nozzle assembly in reaction chamber 304, although inert gas source 324 can be used to supply inert gas to an external section of the moving nozzle. The shielding gas from the external sections of the nozzle serve as a guide for the reactant precursor stream into the light reaction zone.

A heat controller 362 can be used to control the heat through conduction heaters or the like throughout the vapor delivery subsystem, mixing system 350 and conduit 352 to reduce or eliminate any condensation of precursor vapors. A suitable heat controller is model CN132 from Omega Engineering (Stamford, Conn.). Overall precursor flow is controlled/monitored by a DX5 controller from United Instruments (Westbury, N.Y.). The DX5 instrument can be interfaced with mass flow controllers (Mykrolis Corp., Billerica, Mass.) controlling the flow of one or more vapor/gas precursors. The automation of the system is integrated by a controller from Brooks-PRI Automation (Chelmsford, Mass.).

Figures 13, 18:
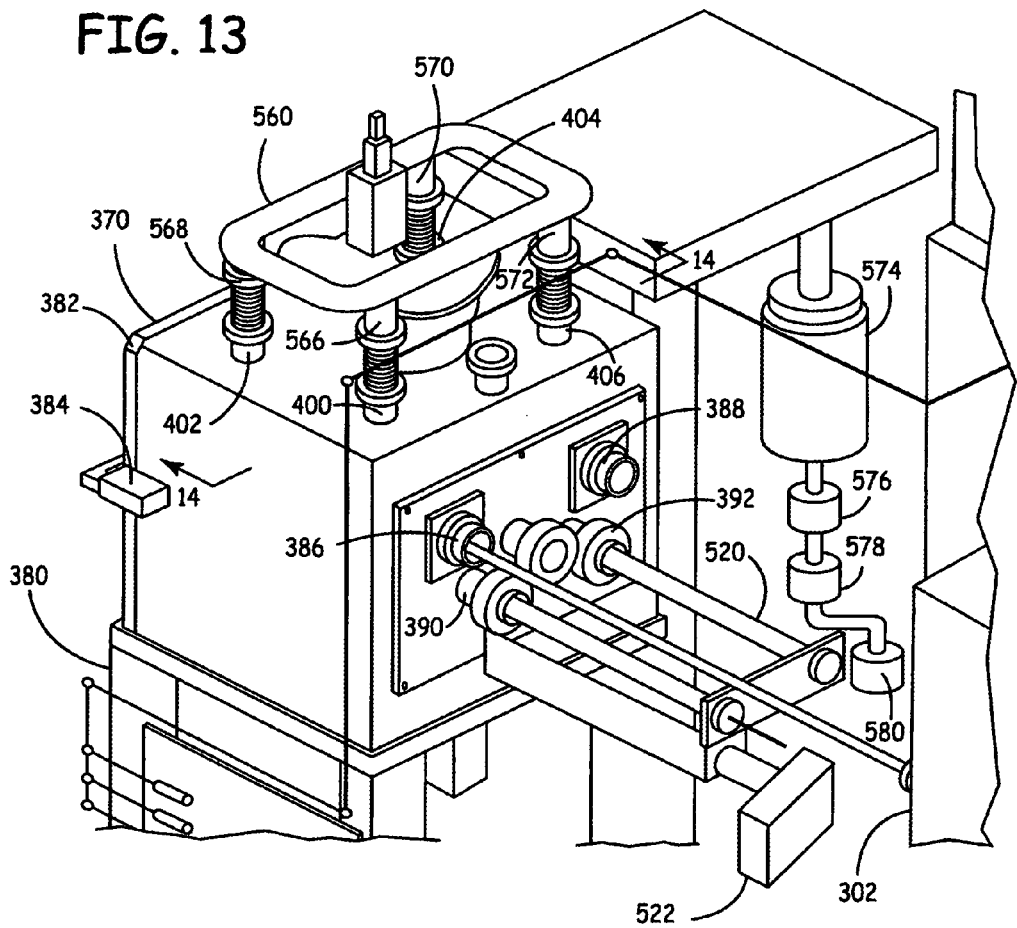
FIG. 13 is an expanded view of the reaction chamber of the apparatus of FIG. 11.
FIG. 18 is a top view of the reactant inlet nozzle for the reaction chamber of FIG. 13.
Figure 14:
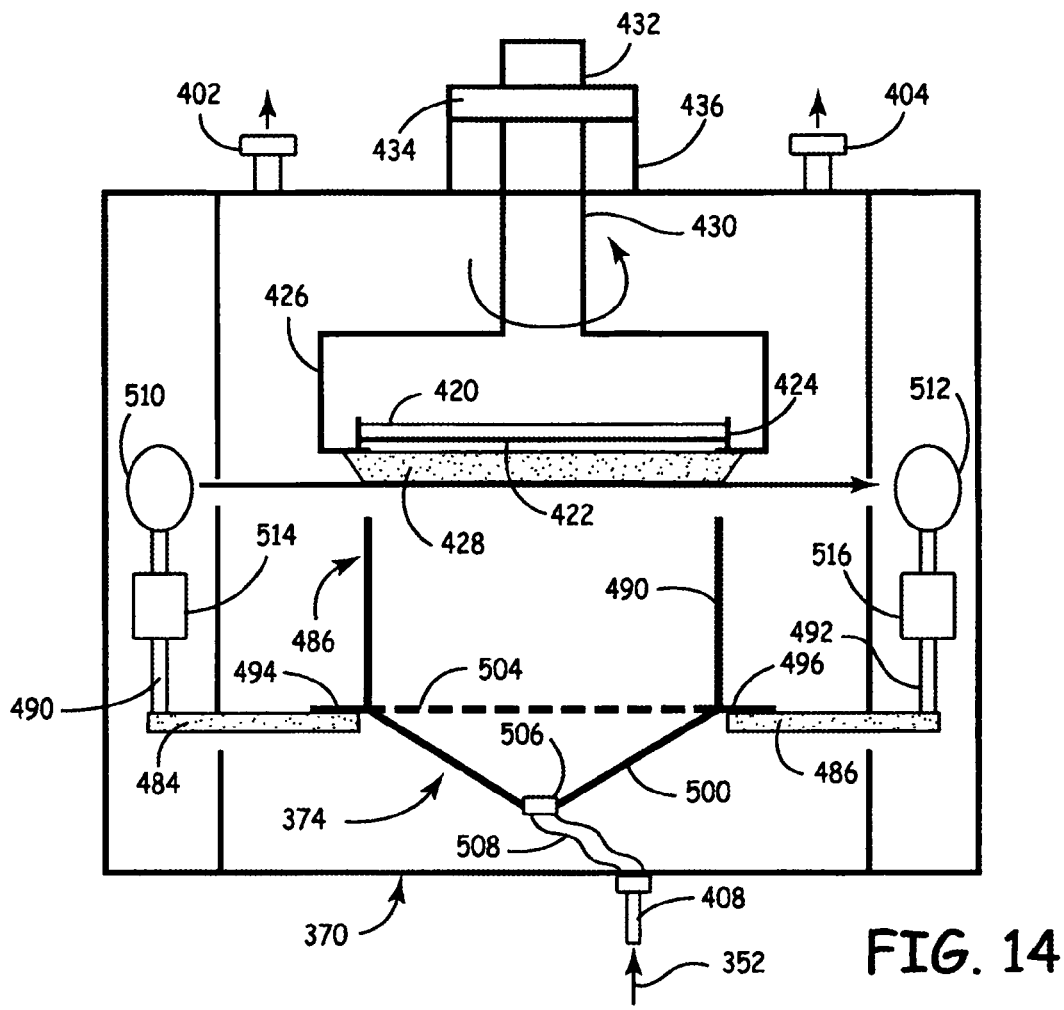
FIG. 14 is sectional view of the reaction chamber of FIG. 13 taken along line 14-14 of FIG. 13.
Figure 15:
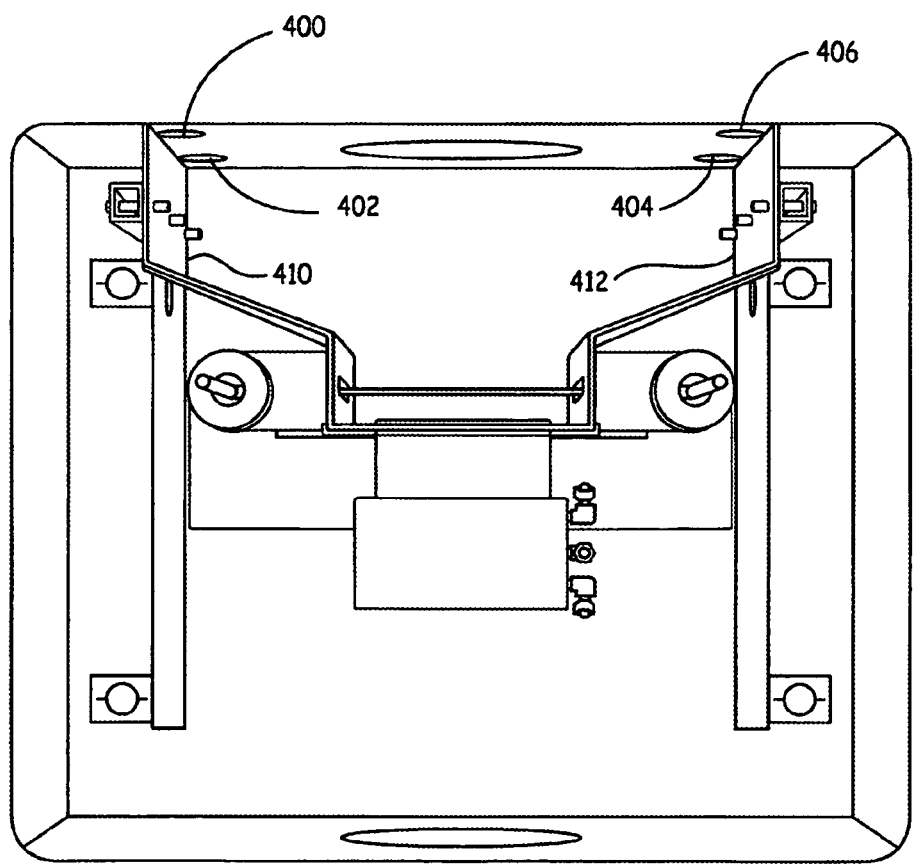
FIG. 15 is an alternative sectional view of the reaction chamber of FIG. 13 with the wafer holder portions removed and the baffle system visible.

Reaction chamber 306 comprises a chamber structure 370, a wafer mount 372 and a moving nozzle system 374. Referring to FIG. 13, chamber structure 370 rests on a stand 380. Chamber structure 370 comprises a hatch 382 that secures closed with a latch 384. Chamber structure 370 also comprises a window 386 that is positioned to receive light from laser 302, and a window 388 for exiting light, which can be connected to a power meter (not shown). Window 386 can include a lens, such as a cylindrical lens. Chamber structure 370 interfaces with moving nozzle system 374 through sealed ports 390, 392. Chamber structure 370 interfaces with exhaust system 306 through four vents 400, 402, 404, 406. Referring to FIG. 14, chamber structure 370 further comprises a reactant port 408 that connects reactant delivery system 302 at conduit 352 with moving nozzle system 374. Referring to FIG. 15, baffles 410, 412 guide flow to vents 400, 402, 404, 406.

Wafer mount 372 comprises a wafer holder 420 that is supported with wafer 422 in brackets 424 within aluminum wafer mount 426. Referring to FIG. 16, wafer holder 420 is shown separated from the apparatus. Wafer holder 420 includes three pins 426 to hold the wafer, although a different number of pins can be used as desired. A sectional view is shown in FIG. 17 depicting the support of a wafer/substrate 422 by a pin 426. The flow of particles during the coating process is shown with arrows. Away from pins 426, wafer holder 420 and wafer 422 form an approximately flat continuous surface with a small gap such that edge effects of the coating deposition along the edge of the wafer are reduced or eliminated. Suitable materials for the formation of the wafer holder include, for example, aluminun oxide or molybdenum.

A two position shutter 428 can be selectively opened and closed to expose (open) or shield (closed) wafer 422. Aluminum wafer mount 426 comprises a shaft 430 that connects to a DC motor 432 through an o-ring seal 434 that is supported by mount 436 connected to chamber structure 370. With this structure, wafer 422 can be rotated. For example, the wafer can be rotated, e.g., 90 degrees or 180 degrees, between coating runs, or if desired within a coating run, or continuously throughout a coating run. In some embodiments, suitable motors are capable of rotating the wafer at a rate of about several hundreds if revolutions per minute.

Moving nozzle system 374 comprises a moving mount 480 and drive system 482. Moving mount 480 comprises a mounting bracket 484, 496, nozzle 488 and mirror mounts 490, 492. Mounting brackets 484, 486 connect nozzle 488 and mirror mounts 490, 492. Nozzle 488 connects with mounting brackets 484, 486 at flanges 494, 496. Nozzle 488 also comprises funnel section 500 and rectangular section 502 with a metal grid 504. Funnel section expands from an orifice 506 to rectangular section 502. A flexible tube 508 connects orifice 506 with reactant port 408, such that the nozzle remains connected to the reactant delivery system as the nozzle moves. In a particular embodiment, rectangular section has a rectangular cross section with dimensions of 0.08 inches×4.65 inches as shown schematically a top view in FIG. 18, although other ratios of lengths or widths can be used. Metal grid 504 divides the flow from funnel section 500 to provide a more uniform flow in rectangular section 502. Nozzle designs for flowing reactors are described further in copending and commonly assigned U.S. patent application Ser. No. 10/119,645 to Gardner et al., entitled "Reactant Nozzles Within Flowing Reactors," incorporated herein by reference. Referring to FIG. 14, mirror mounts 490, 492 extend respectively from mounting brackets 484, 486. Mirror mounts 490, 492 also comprise respectively mirrors 510, 512, which can be, for example, parabolic or cylindrically focusing copper mirrors. The mirrors are water cooled. The light path between mirrors 510, 512 is shown with an arrow in FIG. 14. Mirror mounts 490, 492 connect with drive system 482 at support brackets 514, 516.

Figure 19:
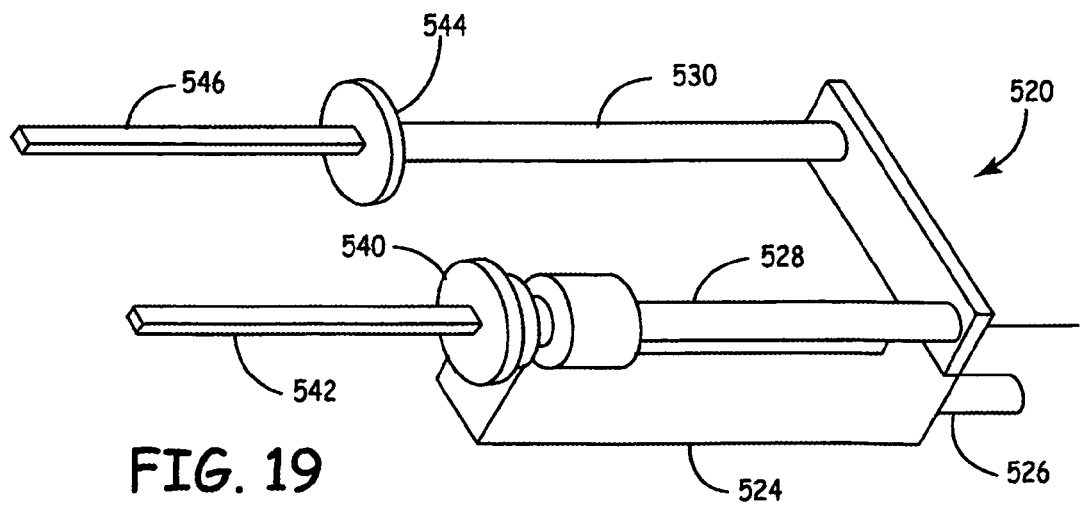
FIG. 19 is a perspective view of a dual linear manipulator, which is part of the drive system for the nozzle of the reaction chamber of FIG. 13, where the dual linear manipulator is separated from the reaction chamber for separate viewing.

Referring to FIG. 13, drive system 482 comprises a duel linear manipulator 520 and a motor 522. In one embodiment, the motor moves a magnet that couples to the manipulator arm such that it controls the movement of the manipulator arm. The movement of the manipulator arm results in the movement of the bracket/nozzle system. The velocity and acceleration throughout the motion can be precisely controlled. A suitable motor is a model P22NRXB-LNN-NF-00 from Pacific Scientific (Rockford, Ill.). Duel linear manipulator 520 comprises a motor interface bracket 524 with a motor interface rod 526. Motor interface bracket connects with a first shaft 528 and a second shaft 530, a shown in FIG. 19. First shaft 528 comprises stop 540 and a first support shaft 542, and second shaft 530 comprises a stop 544 and a second support shaft 546. Stops 540, 544 limit the motion of duel linear manipulator 520 when stops 540, 544 contact ports 390, 392. Support shafts 542, 546 slide through ports 390, 392, respectively, which are sealed with an o-ring. Furthermore, inert gas can be flowed from the back of the translator arm to purge the chamber and to keep the arms cleaner with respect to particles. Support shafts 542, 546 connect with moving nozzle system 374 at support brackets 514, 516, respectively, as shown in FIG. 14.

Support shafts support moving nozzle system 374. Furthermore, chamber 370 can comprise a support track to help support the moving nozzle system. For example, a guide rail can be included on each side of the chamber. The guide rails help to ensure uniformity during translation. In some embodiments, the arm comprises a flanged rulon bearing that roles over the guiding rail.

In one embodiment, exhaust system 308 comprises a conduit 560, as shown schematically in FIG. 13. Conduit 560 comprises channels 566, 568, 570, 572 that connect respectively with vents 400, 402, 404, 406. Exhaust system 308 further comprises a particle filter 574, two in-line Sodasorb® (W. R. Grace) chlorine traps 576, 578 and a pump 580. Conduit 560 connects with particle filter 574, and Sodasorb® traps 576, 578 are placed between particle filter 574 and pump 580 to prevent chlorine from damaging the pump. The line from second chlorine trap 578 can go directly to the pump. A suitable pump is a dry rotary pump from Edwards, such as model QDP80.

The temperature of the substrate during the deposition process can be adjusted to achieve particular objectives. For example, the substrate can be cooled during the deposition process since a relatively cool substrate can attract the particles to its surface through thermophoretic force. However, in some embodiments, the substrate is heated, for example to about 500° C., during the deposition process. In embodiments in which that the substrate is close enough to the reaction zone, the particle may be in a semi-molten state when they reach the substrate surface. Semi-molten particles may deform upon impact and may stick better due to the deformation. In addition, the particles tend to compact and fuse on a heated substrate such that a subsequent consolidation of the coating into a fused glass or other material is facilitated if the coating were formed initially on a heated substrate.

The formation of coatings by light reactive deposition, silicon glass deposition and optical devices in general are described further in copending and commonly assigned U.S. patent application Ser. No. 09/715,935 to Bi et al., entitled "Coating Formation By Reactive Deposition," incorporated herein by reference, and in copending and commonly assigned PCT application designating the U.S. serial number PCT/US01/32413 to Bi et al. filed on Oct. 16, 2001, entitled "Coating Formation By Reactive Deposition," incorporated herein by reference.

The well-defined reactant stream as a sheet of flow leading into the reaction zone tends to spread after the reaction zone due to heat from the reaction. If the substrate is swept relative to the reaction zone near the reaction zone, the spreading of the flow may not be significant. In some embodiments, it may be desirable to contact the substrate with the flow farther away from the reaction zone such that the flow has spread significantly and the entire substrate or desired portion thereof can be coated simultaneously without moving the substrate. The appropriate distance to obtain a uniform coating of particles depends on the substrate size and the reaction conditions. A typical distance of about 15 centimeters would be suitable for a wafer with a 4-inch diameter. A general description of ranges of distances of the wafer from the radiation beam is given above.

For these embodiment with simultaneous coating of the entire substrate surface, when the composition of the product particle flow is changed in time during the deposition process, the composition of the particles changes through the thickness of the coating. If the composition is changed continuously, a continuous composition gradient through the layer results. For optical materials, generally a continuous composition gradient layer having a continuous composition change from a first composition to a second composition has a thickness of no more than about 300 microns, in other embodiments no more than about 150 microns, in further embodiments, in the range(s) from about 500 nm to about 100 microns and in still other embodiments in the range(s) from about 1 micron to about 50 microns. A person of ordinary skill in the art will recognize that other ranges and subranges within the explicit ranges are contemplated and are encompassed within the present disclosure. Alternatively or additionally, gradients can be formed within a layer or layers, such as parallel to a surface, for example, along one or more dimensions of x-y Cartesian coordinates relative to a z-axis that is normal to a substrate surface or a layered structure, if the structure is formed in layers.

Alternatively, the composition can be changed incrementally or discretely to produce layers with varying composition, which can involve a gradual change in composition between two compositions or discrete layers with discrete composition differences. The resulting transition material has a step-wise change in composition from a first composition to a second composition. Generally, the first composition and second composition are the compositions of the adjacent layers (or adjacent compositions in the same layer) such that the transition material provides a gradual transition in composition between the two adjacent layers. While a transition material can have two layers, the transition material generally has at least three layers, in other embodiments at least 4 layers and in further embodiments in the range(s) from 5 layers to 100 layers. A person of ordinary skill in the art will recognize that additional range(s) within these specific ranges are contemplated and are within the present disclosure. The total thickness generally is similar to the continuous gradient layers described in the previous paragraph. Each layer within the step-wise transition material generally has a thickness less than about 100 microns, in other embodiments less than about 25 microns, in further embodiments in the range(s) from about 500 nm to about 20 microns and in additional embodiments in the range(s) from about 1 micron to about 10 microns. The layers within the step-wise transition material may or may not have approximately equal thickness. Similarly, the step-wise change in composition may or may not take equivalent steps between layers of the transition material.

For the production of discrete optical devices or other structures on a substrate surface, the composition of the optical material generally must be different at different locations within the optical structure. To introduce the composition variation, the deposition process itself can be manipulated to produce specific structures. Alternatively, various patterning approaches can be used following the deposition for the formation of selected optical devices. Patterning following deposition of one or more coating layers is described further below.

Using the deposition approaches described herein, the composition of product particles deposited on the substrate can be changed during the deposition process to deposit particles with a particular composition at selected locations on the substrate to vary the resulting composition of the optical material along the x-y plane. For example, if the product particle compositions are changed while sweeping the substrate through the product particle stream, stripes or grids can be formed on the substrate surface with different particle compositions in different stripes or grid locations. Using light reactive deposition, the product composition can be varied by adjusting the reactants that react to form the product particle or by varying the reaction conditions. The reaction conditions can also affect the resulting product particle properties. For example, the reaction chamber pressure, flow rates, radiation intensity, radiation energy/wavelength, concentration of inert diluent gas in the reaction stream, temperature of the reactant flow can affect the composition and other properties of the product particles.

In some embodiments, the reactant flow can comprise vapor and/or aerosol reactants, which can be varied to alter the composition of the products. In particular, dopant concentrations can be changed by varying the composition and/or quantity of dopant elements in the flow.

While product particle composition changes can be introduced by changing the reactant flow composition or the reaction conditions while sweeping a substrate through the product stream, it may be desirable, especially when more significant compositional changes are imposed to stop the deposition between the different deposition steps involving the different compositions. For example, to coat one portion of a substrate with a first composition and the remaining portions with another composition, the substrate can be swept through the product stream to deposit the first composition to a specified point at which the deposition is terminated. The substrate is then translated the remaining distance without any coating being performed. The composition of the product is then changed, by changing the reactant flow or reaction conditions, and the substrate is swept, after a short period of time for the product flow to stabilize, in the opposite direction to coat the second composition in a complementary pattern to the first composition. A small gap can be left between the coatings of the first composition and the second composition to reduce the presence of a boundary zone with a mixed composition. The small gap can fill in during the consolidation step to form a smooth surface with a relatively sharp boundary between the two materials.

The deposition process can be generalized for the deposition of more than two compositions and/or more elaborate patterns on the substrate. In the more elaborate processes, a shutter can be used to block deposition while the product flow is stabilized and/or while the substrate is being positioned. A precision controlled stage/conveyor can precisely position and sweep the substrate for the deposition of a particular composition. The shutter can be rapidly opened and closed to control the deposition. Gaps may or may not be used to slightly space the different location of the compositions within the pattern.

In other embodiments, a discrete mask is used to control the deposition of particles. A discrete mask can provide an efficient and precise approach for the patterning of particles. With chemical vapor deposition and physical vapor deposition, a layer of material is built up from an atomic or molecular level, which can involve intimate binding of the mask to the underlying substrate at an atomic or molecular level to prevent migration of the material being deposited under the mask to blocked regions. Thus, the coated masks are a coating on the surface without an independent, self-supporting structure corresponding to the mask, and the coated mask is chemically or physically bonded to the surface with atomic level contact along the coated mask. In contrast, with particle deposition as described herein, the particles generally can be at least macromolecular in size with diameters in the range(s) of about 1 nanometer (nm) or more such that a mask with a flat surface placed against another flat surface provides sufficient contact to prevent significant particle migration past the mask. While coated masks can be effectively used in light reactive deposition, physical masks provide an efficient alternative to coated masks for patterning a surface. The physical masks have an intact self-supporting structure that is not bonded to the surface such that the mask can be removed intact from the surface that is coated. Therefore, the discrete mask approach herein is different from previous masking approaches adapted from photolithography for vapor deposition approaches.

In these embodiments, the formation of the particle coating correspondingly involves directing a product particle stream at the substrate shielded with the discrete mask. The discrete mask has a surface, generally a planar surface, with openings at selected locations. The discrete mask blocks the surface except at the openings such that particles can deposit on the surface through the openings. Thus, the mask provides for patterning compositions on the surface by the selected placement of the openings. In some embodiments, suitable discrete masks comprise a mask with a slit that is narrower than the product particle flow such that the deposition process can be very precisely controlled. Movement of the slit can form a desired, precisely controlled pattern with one or more compositions. After use of a discrete mask, it can be removed and reused.

In some embodiments, a plurality of masks can be used to deposit particles along a single layer. For example, following deposition of a pattern through a first mask, a second complementary mask can be used to deposit material over at least a portion of the surface left uncovered during deposition with the first mask. Further complementary masks can be used to form complex patterns while completing a single layer or portion thereof with a coating having varying chemical composition over the layer.

Thus, using light reactive deposition, a range of effective approaches are available to vary the chemical composition of optical materials within layers and in different layers to form three-dimensional optical structures with selected compositions are selected locations within the material. In other words, the optical properties and/or composition of the materials can be varied along all three axes, x, y and z, within the optical structure to form desired structures. The patterning of compositions of optical materials during the deposition process is described further in copending and commonly assigned U.S. patent application Ser. No. 10/027,906 to Bi et al., entitled "Three Dimensional Engineering of Optical Structures," incorporated herein by reference.

Composition Of Coatings

Adaptation of laser pyrolysis for the performance of light reactive deposition can be used to produce coatings of comparable compositions as the particles with selected compositions that can be produced by laser pyrolysis, which span a broad range of compositions. Specifically, the compositions can comprise one or more metal/metalloid elements forming a crystalline or amorphous material with an optional dopant or additive composition. In addition, dopant(s)/additive(s) can be used to alter the optical, chemical and/or physical properties of the particles. Generally, the powders comprise fine or ultrafine particles with particle sizes in the submicron/nanometer range. The particles may or may not partly fuse or sinter during the deposition while forming a powder coating. To form a densified layer, a powder coating can be consolidated. Incorporation of the dopant(s)/additive(s) into the powder coating, during its formation or following its formation, results in a distribution of the dopant(s)/additive(s) through the densified material.

In general, the submicron/nanoscale particles, as a particle collection or a powder coating, can generally be characterized as comprising a composition including a number of different elements and present in varying relative proportions, where the number and the relative proportions can be selected as a function of the application for the particles. Typical numbers of different elements include, for example, numbers in the range(s) from about 2 elements to about 15 elements, with numbers of 1, 2, 3, 4, 5, 6, 7, 8, 9, 10, 11, 12, 13, 14, and 15 being contemplated. In some embodiments, some or all of the elements can be a metal/metalloid element. General numbers of relative proportions include, for example, values in the range(s) from about 1 to about 1,000,000, with numbers of about 1, 10, 100, 1000, 10000, 100000, 1000000, and suitable sums thereof being contemplated. In addition, elemental materials are contemplated in which the element is in its elemental, un-ionized form, such as a metal/metalloid element, i.e., $M^0$.

Alternatively or additionally, such submicron/nanoscale particles can be characterized as having the following formula:

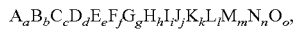

$A_a B_b C_c D_d E_e F_f G_g H_h I_i J_j K_k L_l M_m N_n O_o$, where each A, B, C, D, E, F, G, H, I, J, K, L, M, N, and O is independently present or absent and at least one of A, B, C, D, E, F, G, H, I, J, K, L, M, N, and O is present and is independently selected from the group consisting of elements of the periodic table of elements comprising Group 1 A elements, Group 2A elements, Group 3B elements (including the lanthamide family of elements and the actinide family of elements), Group 4B elements, Group 5B elements, Group 6B elements, Group 7B elements, Group 8B elements, Group 1B elements, Group 2B elements, Group 3A elements, Group 4A elements, Group 5A elements, Group 6A elements, and Group 7A elements; and each a, b, c, d, e, f, g, h, i, j, k, 1, m, n, and o is independently selected and stoichiometrically feasible from a value in the range(s) from about 1 to about 1,000,000, with numbers of about 1, 10, 100, 1000, 10000, 100000, 1000000, and suitable sums thereof being contemplated. The materials can be crystalline, amorphous or combinations thereof. In other words, the elements can be any element from the periodic table other than the noble gases. As described herein, all inorganic compositions are contemplated, as well as all subsets of inorganic compounds as distinct inventive groupings, such as all inorganic compounds or combinations thereof except for any particular composition, group of compositions, genus, subgenus, alone or together and the like.

While some compositions are described with respect to particular stoichiometries/compositions, stoichiometries generally are only approximate quantities. In particular, materials can have contaminants, defects and the like. Similarly, some amorphous materials can comprise essentially blends such that the relative amounts of different components are continuously adjustable over ranges in which the materials are miscible. In other embodiments, phase separated amorphous materials can be formed with differing compositions at different domains due to immiscibility of the materials at the average composition. Furthermore, for amorphous and crystalline materials in which elements of a corresponding compound has a plurality of oxidation states, the materials can comprise a plurality of oxidation states. Thus, when stoichiometries are described herein, the actual materials may comprise other stoichiometries of the same elements also, such as $SiO_2$ also include some SiO and the like.

In some embodiments, such as for optical materials, powders can comprise as a host material, for example, silicon particles, metal particles, and metal/metalloid compositions, such as, metal/metalloid oxides, metal/metalloid carbides, metal/metalloid nitrides, metal/metalloid phosphides, metal/metalloid sulfides, metal/metalloid tellurides, metal/metalloid selenides, metal/metalloid arsinides and mixtures and combinations thereof. Especially in amorphous materials, great varieties of elemental compositions are possible within a particular material. While laser pyrolysis is versatile with respect to the production of particles, with a wide range of compositions, in one embodiment, certain host materials for the introduction of dopant(s)/additive(s) are desirable because of their particular ability to be processed into glass layers and/or their desirability for optical materials that are processible into optical devices. For optical materials, some materials of particular interest comprise, for example, silicon oxide (silica), phosphate glasses, germanium oxide, aluminum oxide, indium phosphide, lithium niobate, lithium tantalate, telluride glasses, aluminum oxide, titanium oxide, gallium arsenide, combinations thereof and doped versions thereof. Some metal/metalloid oxides are particularly desirable for optical applications and/or for their ability to consolidate into uniform glass layers. Suitable glass forming host oxides for doping include, for example, $TiO_2$, $SiO_2$, $GeO_2$, $Al_2O_3$, $P_2O_5$, $B_2O_3$, $TeO_2$, $CaO$—$Al_2O_3$, $V_2O_5$, $BiO_2$, $Sb_2O_5$ and combinations and mixtures thereof. Other metal/metalloid oxides have desirable optical properties in crystalline form, such as $LiNbO_3$, $LiTaO_3$, $Y_3Al_5O_{12}$ (YAG) and rare earth, especially Nd, doped YAG. The approaches described herein for particle formation and coating formation are particularly suitable for formation of metal/metalloid oxide particles with or without dopant(s)/additive(s). Similarly, laser pyrolysis and light reactive deposition are suitable approaches for producing particle collections and powder coatings for the non-oxide materials, as described further below.

In addition, particles and powder coatings can include one or more dopants/additives within an amorphous material and/or a crystalline material. Dopant(s)/additive(s), which can be complex blends of dopant/additive composition(s), generally are included in non-stoichiometric amounts. A dopant/additive is generally metal or metalloid element, although other dopant(s)/additive(s) of interest include fluorine, chlorine, nitrogen and/or carbon, which substitute for oxygen in oxides or other anions relative to metal/metalloid components. Since these anion dopant(s)/additive(s), like some cation dopants, tend to disrupt the oxygen bonded network of oxides, these tend to lower the flow temperature of oxide glasses, and these dopant(s)/additive(s) tend to lower the index-of-refraction and the dielectric constant. The dopant(s)/additive(s) generally can, for example, replace other constituents within the material in order to maintain overall electrical neutrality. Dopant(s)/additive(s) can impart desirable properties to the resulting materials. The amount of dopant(s)/additive(s) can be selected to yield desired properties while maintaining appropriate chemical stability to the material. In crystalline materials, dopant/additive element(s) can replace host elements at lattice sites, dopant/additive element(s) can reside at previously unoccupied lattice sites and/or dopant/additive element(s) can be located at interstitial sites. Unlike dopant(s)/additive(s) within crystalline materials in which the crystal structure influences incorporation of the dopant(s)/additive(s), dopant(s)/additive(s) within amorphous materials can behave more as a composition dissolved within the host material to form a solid mixture. Thus, the overall composition of the material influences the chemical properties, including the processing parameters and stability, of the resulting combined materials. Solubility of dopant(s)/additive(s) within a host amorphous material can influence the amount of a particular dopant/additive that can be homogeneously integrated into a consolidated glass.

A dopant, such as a rare earth dopant, generally comprises in the range(s) less than about 15 mole percent of the metal/metalloid in the composition, in further embodiments in the range(s) less than about 10 mole percent, in some embodiments in the range(s) from about 0.001 mole percent to about 5 mole percent, and in other embodiments in the range(s) from about 0.025 to about 1 mole percent of the metal/metalloid in the composition. A person of ordinary skill in the art will recognize that the present disclosure similarly covers ranges within these specific ranges. Additive compositions are similar to dopant compositions except that they generally are included at higher amounts while still being a minority component of the composition, i.e., in the range(s) less than about 50 mole percent of the composition with any and all cut offs within this range being contemplated. For amorphous materials, additive(s) can be modifiers or intermediate compositions between glass formers and modifiers. Modifiers can disrupt the oxygen network within an oxide glass to modify the glass properties, such as flow temperature, coefficient of thermal expansion, chemical durability and the index-of-refraction. Thus, additive(s) can be useful for many of the same purposes as dopant(s). Doped and doping, for convenience, can refer to materials with dopants and/or additives and the process of incorporating dopants and/or additives, respectively. Suitable dopant(s)/additive(s) include, for example, rare earth metal(s) among other suitable element(s). Rare earth dopants can impart desirable modifications of properties, such as index-of-refraction, photosensitivity, fluorescence and paramagnetism.

In some embodiments, powders and coatings, e.g., glass layers, can be formed with complex compositions comprising, for example, one or more metal/metalloid elements in a host material and, optionally, one or more selected dopants/additives in the amorphous host material. Similarly, crystalline materials can be formed with dopant(s)/additive(s) within a crystalline host material. The doped materials can be formed by directly depositing particles to form a powder coating using light reactive deposition and subsequently consolidating the powder coating into a uniform layer of a glass, polycrystalline or crystalline material. Alternatively, any dopant(s)/additive(s) can be introduced to a powder coating following its formation for incorporation into a consolidated uniform material, as described further below.

Submicron/nanoscale particles deposited as a powder coating can be produced with complex compositions using light reactive deposition. Materials can be formed with desired compositions by appropriately introducing a reactant composition to form the desired host material. The elements that modify the composition, such as elements introduced in approximately stoichiometric amounts as well as dopant(s)/additive(s), can be introduced into an appropriate host material either during the formation of the host material or subsequent to formation of the powder coating. Specifically, selected elements can be introduced at desired amounts by varying the composition of the reactant stream. The conditions in the reactor can also be selected to produce the desired materials. In alternative embodiments, a modifying element is applied to an already formed particle collection or powder coating in proportion to the desired levels for the ultimate composition. Upon heat treatment, the desired composition is formed. Heat treatments to introduce modifying elements are described further below.

With respect to glasses, while a variety of materials are of interest, silica ($SiO_2$)-based glasses are of interest due to their existing commercial applications. Other glass forming materials that are suitable for combining with silica to form amorphous host materials include, for example, $Al_2O_3$, $Na_2O$, $B_2O_3$, $P_2O_5$, $GeO_2$, and the like and combinations thereof. Thus, a plurality of glass forming compositions can be combined to form a blended glass host composition with desired properties, such as index-of-refraction and glass transition temperature. The blended glass host materials can be doped with further materials to further adjust the properties of the material.

A wide range of silica glass compositions has significant optical applications or potential optical applications. Generally, these silica glasses can be formed by light reactive deposition based on the description herein. The silica glass generally is combined with other glass forming compositions to alter the optical properties, such as index-of-refraction, and or alter the processing properties, such as lowering the flow temperature. Some non-silica glasses are also very suitable for optical applications, such as germinates, phosphates, aluminocalcinates and tellurides. Some crystalline materials also have desirable optical properties.

Dopant(s)/additive(s) can be introduced to vary properties, such as optical properties and physical properties, of the particles and/or a resulting layer of particles with or without consolidation. For example, dopant(s)/additive(s) can be introduced to change the index-of-refraction of the material as well as influencing the emission/gain bandwidth, and the absorption efficiency of other dopants. For optical applications, the index-of-refraction can be varied to form specific optical devices that operate with light of a selected frequency range. Dopant(s)/additive(s) can also be introduced to alter the processing properties of the material. In particular, some dopant(s)/additive(s) change the flow temperature, i.e., the glass transition temperature, such that the glass can be processed at lower temperatures. Dopant(s)/additive(s) can also alter the physical properties of a resultant glass such as the thermal expansion coefficient and/or chemical durability. Dopants/additives can also interact within the materials. For example, some dopant(s)/additive(s), such as $P_2O_5$ and $Al_2O_3$, are introduced to increase the solubility of other dopant(s)/additive(s). Doped materials are useful in the production of optical devices. Using the techniques described herein, the doped materials can be formulated into planar optical devices.

In one embodiment, materials of interest comprise amorphous compositions that form optical glasses with a plurality of dopants/additives. In some embodiments, the one or plurality of dopants/additives comprise rare earth metals. Rare earth metals can be desirable because of their modification of optical properties of the materials. If the particles are consolidated into a substantially uniform layer, the resulting material can have an index-of-refraction influenced by the rare earth dopant(s)/additive(s) as well as other dopant(s)/additive(s). In addition, the rare earth dopant(s)/additive(s) can influence the optical emission properties that can alter the application of the materials for the production of optical amplifiers and other optical devices. Rare earth metals comprise the transition metals of the group IIIb of the periodic table. Specifically, the rare earth elements comprise Sc, Y and the Lanthamide series. Other suitable dopant(s)/additive(s) include elements of the actinide series. For optical glasses, the rare earth metals of interest as dopants/additives comprise Er, Yb, Nd, La, Ce, Tb, Dy, Ho, Sm, Eu, Gd, Pr, Tm, Sc, Y, and the like and combinations thereof. Suitable non-rare earth metal dopants/additives include, for example, Al, Ga, Mg, Sr, Zn, Bi, Sb, Zr, Pb, Li, Na, K, Ba, W, Si, Ge, P, B, Te, Ca, Rb, Sn, In, Ti, Au, Ag, Ta, Mo, Nb, and the like and combinations thereof. Also, certain first-row transition metals have optical emission properties in the visible or infrared regions of the spectrum. Suitable first-row transition element having desirable optical properties as dopants/additives include, for example, V, Cr, Mn, Fe, Co, Ni and Cu. the wavelength of the optical emission depends on the oxidation-state of the transition-metal. This oxidation state generally can be controlled by adjusting the oxygen partial-pressure during the consolidation process.

Various materials have been formed as submicron/nanoscale particles using laser pyrolysis. Some of these materials are described in the following description. Using light reactive deposition, these materials can be formed directly as coatings in the form of powder coatings. Based on the description and examples herein, a range of additional materials can be produced by light reactive deposition. Specifically, suitable approaches for the formation of some improved materials are outlined below.

For example, the production of silicon oxide submicron/nanoscale particles is described in copending and commonly assigned U.S. patent application Ser. No. 09/085,514, now U.S. Pat. No. 6,726,990 to Kumar et al., entitled "Silicon Oxide Particles," incorporated herein by reference. This patent application describes the production of amorphous $SiO_2$. The production of titanium oxide submicron/nanoscale particles and crystalline silicon dioxide submicron/nanoscale particles is described in U.S. Pat. No. 6,387,531 to Bi et al., entitled "Metal (Silicon) Oxide/Carbon Composites," incorporated herein by reference. In particular, this application describes the production of anatase and rutile $TiO_2$.

In addition, submicron/nanoscale manganese oxide particles have been formed. The production of these particles is described in copending and commonly assigned U.S. patent application Ser. No. 09/188,770, now U.S. Pat. No. 6,506,493 to Kumar et al., entitled "Metal Oxide Particles," incorporated herein by reference. This application describes the production of MnO, $Mn_2O_3$, $Mn_3O_4$ and $Mn_5O_8$.

Also, the production of vanadium oxide submicron/nanoscale particles is described in U.S. Pat. No. 6,106,798 to Bi et al., entitled "Vanadium Oxide Nanoparticles," incorporated herein by reference. Similarly, silver vanadium oxide submicron/nanoscale particles have been produced, as described in U.S. Pat. No. 6,225,007 to Horne et al., and U.S. Pat. No. 6,394,494 to Reitz et al., both entitled "Metal Vanadium Oxide Particles," and Ser. No. 09/649,752, now U.S. Pat. No. 6,503,646 to Ghantous et al., entitled "High Rate Batteries," all three of which are incorporated herein by reference.

Furthermore, lithium manganese oxide submicron/nanoscale particles have been produced by laser pyrolysis along with or without subsequent heat processing, as described in copending and commonly assigned U.S. patent application Ser. No. 09/188,768, now U.S. Pat. No. 6,607,706 to Kumar et al., entitled "Composite Metal Oxide Particles," and Ser. No. 09/334,203, now U.S. Pat. No. 6,482,374 to Kumar et al., entitled "Reaction Methods for Producing Lithium Metal Oxide Particles," and U.S. Pat. No. 6,136,287 to Horne et al., entitled "Lithium Manganese Oxides and Batteries," all three of which are incorporated herein by reference. The production of lithium cobalt oxide, lithium nickel oxide, lithium cobalt nickel oxide, lithium titanium oxide and other lithium metal oxides is described in copending and commonly assigned U.S. patent application Ser. No. 09/595,958 to Kumar et al., entitled "Lithium Metal Oxides," incorporated herein by reference.

The production of aluminum oxide submicron/nanoscale particles is described in copending and commonly assigned, U.S. patent application Ser. No. 09/136,483 to Kumar et al., entitled "Aluminum Oxide Particles," incorporated herein by reference. In particular, this application discloses the production of $\gamma$-$Al_2O_3$. The formation of delta-$Al_2O_3$ and theta-$Al_2O_3$ by laser pyrolysis/light reactive deposition along with doped-crystalline and amorphous alumina is described in copending and commonly assigned U.S. patent application Ser. No. 09/969,025 to Chiruvolu et al., entitled "Aluminum Oxide Powders," incorporated herein by reference.

Amorphous aluminum oxide materials can be combined with other glass formers, such as $SiO_2$ and/or $P_2O_5$. For example, suitable metal oxide dopant(s)/additive(s) for aluminum oxide for optical glass formation comprise cesium oxide ($Cs_2O$), rubidium oxide ($Rb_2O$), thallium oxide ($Tl_2O$), lithium oxide ($Li_2O$), sodium oxide ($Na_2O$), potassium oxide ($K_2O$), beryllium oxide (BeO), magnesium oxide (MgO), calcium oxide (CaO), strontium oxide (SrO), barium oxide (BaO), and the like and combinations of any two or more thereof. Glass dopant(s)/additive(s) can affect, for example, the index-of-refraction, consolidation temperature and/or the porosity of the glass. Suitable metal oxide dopants/additives for infrared emitters comprise, for example, cobalt oxide ($CO_3O_4$), $Er_2O_3$, $CrO_2$, $Tm_2O_3$, $Nd_2O_3$, $Yb_2O_3$, $Pr_2O_3$, $Dy_2O_3$, $Ho_2O_3$, and the like, and combinations of any two or more thereof.

In addition, tin oxide submicron/nanoscale particles have been produced by laser pyrolysis, as described in U.S. Pat. No. 6,200,674 to Kumar et al., entitled "Tin Oxide Particles," incorporated herein by reference. The production of zinc oxide submicron/nanoscale particles is described in copending and commonly assigned U.S. patent application Ser. No.

09/266,202 to Reitz, entitled "Zinc Oxide Particles," incorporated herein by reference. In particular, the production of ZnO submicron/nanoscale particles is described.

Submicron/nanoscale particles and corresponding coatings of rare earth metal oxide particles, rare earth doped metal/metalloid oxide particles, rare earth metal/metalloid sulfides and rare earth doped metal/metalloid sulfides are described in copending and commonly assigned U.S. patent application Ser. No. 09/843,195, now U.S. Pat. No. 6,692,660 to Kumar et al, entitled "High Luminescence Phosphor Particles," incorporated herein by reference. Suitable host materials for the formation of phosphors comprise ZnO, ZnS, $Zn_2SiO_4$, SrS, $YBO_3$, $Y_2O_3$, $Al_2O_3$, $Y_3Al_5O_{12}$ and $BaMgAl_{14}O_{23}$, and combinations of any two or more thereof. Exemplary non-rare earth metals for activating phosphor particles as dopant(s)/additive(s) include, for example, manganese, silver, lead, and the like and combinations thereof. Exemplary rare earth metals for forming metal oxide phosphors include, for example, europium, cerium, terbium, erbium and the like and combinations thereof. Generally, heavy metal ions or rare earth ions are used as activators in phosphors. For phosphor applications, the particles are generally crystalline.

The production of iron, iron oxide and iron carbide is described in a publication by Bi et al., entitled "Nanocrystalline α-Fe, $Fe_3C$, and $Fe_7C_3$ produced by $CO_2$ laser pyrolysis," J. Mater. Res. Vol. 8, No. 7 1666-1674 (July 1993), incorporated herein by reference. The production of submicron/nanoscale particles of silver metal is described in U.S. Pat. No. 6,394,494 to Reitz et al., entitled "Metal Vanadium Oxide Particles," incorporated herein by reference. Submicron/nanoscale carbon particles produced by laser pyrolysis is described in a reference by Bi et al., entitled "Nanoscale carbon blacks produced by $CO_2$ laser pyrolysis," J. Mater. Res. Vol. 10, No. 11, 2875-2884 (November 1995), incorporated herein by reference.

The production of iron sulfide ($Fe_{1-x}S$) submicron/nanoscale particles by low rate laser pyrolysis is described in Bi et al., Material Research Society Symposium Proceedings, vol. 286, p. 161-166 (1993), incorporated herein by reference. Precursors for laser pyrolysis production of iron sulfide were iron pentacarbonyl ($Fe(CO)_5$) and hydrogen sulfide ($H_2S$). Other suitable gaseous sulfur precursors for vapor delivery comprise, for example, pyrosulfuryl chloride ($S_2O_5Cl_2$), Sulfur chloride ($S_2Cl_2$), sulfuryl chloride ($SO_2Cl_2$), thionyl chloride ($SOCl_2$), and the like, and combinations of any two or more thereof. Suitable sulfur precursors for aerosol delivery comprise, for example, ammonium sulfate (($NH_4)_2S$), sulfuric acid ($H_2SO_4$), and the like, and any combinations thereof, which are soluble in water. Other metal/metalloid sulfide materials can be similarly produced.

Metal borates can be similarly formed using one or more metal precursors and a boron precursor. As a specific example, $TiB_2$ has potential utility in battery applications. Suitable titanium precursors include, for example, titanium tetrachloride ($TiCl_4$), titanium isopropoxide ($Ti[OCH(CH_3)_2]_4$), and the like, and combinations of any two or more thereof. Suitable boron precursors comprise, for example, boron trichloride ($BCl_3$), diborane ($B_2H_6$), $BH_3$, and the like, and combinations of any two or more thereof.

Cerium oxide can be produced using the laser pyrolysis apparatuses described above. Suitable precursors for aerosol delivery comprise, for example, cerous nitrate ($Ce(NO_3)_3$), cerous chloride ($CeCl_3$), cerous oxalate ($Ce_2(C_2O_4)_3$), and the like, and combinations of any two or more thereof. Similarly, zirconium oxide can be produced using the laser pyrolysis apparatuses described above. Suitable zirconium precursors for aerosol delivery comprise, for example, zirconyl chloride ($ZrOCl_2$), zirconyl nitrate ($ZrO(NO_3)_2$), and the like, and combinations of any two or more thereof.

The deposition of coatings of dielectric materials for chip capacitors is described in copending and commonly assigned U.S. Provisional Patent Application Ser. No. 60/312,234 to Bryan, entitled "Reactive Deposition For The Formation Of Chip Capacitors," incorporated herein by reference. Suitable dielectric materials include a majority of barium titanate ($BaTiO_3$), optionally mixed with other metal oxides. Other dielectric oxides suitable for incorporation into ceramic chip capacitors with appropriate dopant(s)/additive(s) comprise, for example, $SrTiO_3$, $CaTiO_3$, $SrZrO_3$, $CaZrO_3$, $Nd_2O_3$-$2TiO_3$, $La_2O_3$—$2TiO_2$, and the like, and any two or more thereof.

The production of ternary submicron/nanoscale particles of aluminum silicate and aluminum titanate can be performed by laser pyrolysis following procedures similar to the production of silver vanadium oxide submicro/nanoscale particles described in U.S. Pat. No. 6,394,494 to Reitz et al., entitled "Metal Vanadium Oxide Particles," incorporated herein by reference. Suitable precursors for the production of aluminum silicate comprise, for vapor delivery, a mixture of aluminum chloride ($AlCl_3$), silicon tetrachloride ($SiCl_4$), and the like, and combinations thereof, and, for aerosol delivery, a mixture of tetra(N-butoxy) silane and aluminum isopropoxide ($Al(OCH(CH_3)_2)_3$), a mixture of tetraethoxysilane and aluminum nitrate, or tetraethoxysilane and aluminum chloride, or tetraethoxysilane and aluminum isopropoxide, and the like, and combinations of any two or more thereof. Similarly, suitable precursors for the production of aluminum titanate comprise, for aerosol delivery, a mixture of aluminum nitrate ($Al(NO_3)_3$) and titanium dioxide ($TiO_2$) powder dissolved in sulfuric acid, a mixture of aluminum isopropoxide and titanium isopropoxide ($Ti(OCH(CH_3)_2)_4$), and the like, and combinations of any two or more thereof.

The formation of submicron/nanoscale particles along with coatings of metal/metalloid compositions with complex anions is described in copending and commonly assigned U.S. patent application Ser. No. 09/845,985 to Chaloner-Gill et al., entitled "Phosphate Powder Compositions And Methods For Forming Particles With Complex Anions," incorporated herein by reference. Suitable polyatomic anions comprise, for example, phosphate ($PO_4^{-3}$), sulfate ($SO_4^{-2}$), silicate ($SiO_4^{-4}$), and the like, and combinations of any two or more thereof. Suitable phosphorous precursors for forming the phosphate anion, sulfur precursors for forming the sulfate anion and silicon precursors for forming the silicate anion are discussed above. Suitable cations comprise, for example, metal and metalloid cations. Phosphate glasses can be used in a variety of contexts. Phosphate compositions for glasses comprise, for example, aluminum phosphate ($AlPO_4$), calcium phosphate ($Ca_3(PO_4)_2$), and the like, and combinations of any two or more thereof. Suitable gaseous phosphate precursor compositions for vapor delivery comprise, for example, phosphine ($PH_3$), phosphorus trichloride ($PCl_3$), phosphorous pentachloride ($PCl_5$), phosphorus oxychloride ($POCl_3$), $P(OCH_3)_3$, and the like, and combinations of any two or more thereof. Suitable phosphorous precursors for aerosol delivery comprise, for example, $(C_2H_5O)_3P$, $(C_2H_5O)_3$ PO, ammonium phosphate (($NH_4)_3PO_4$), ammonium phosphate—dibasic (($H)_2HPO_4$), ammonium phosphate—monobasic (($NH_4)H_2PO_4$), phosphoric acid ($H_3PO_4$), and the like, and combinations of any two or more thereof, which are all moderately soluble in water.

The synthesis by laser pyrolysis of silicon carbide and silicon nitride is described in copending and commonly assigned U.S. patent application Ser. No. 09/433,202 to Reitz et al., entitled "Particle Dispersions," incorporated herein by reference. Other metal/metalloid carbides and meta/metalloid nitrides can be similarly produced.

The formation of a powder coating comprising boron and phosphorous doped amorphous silica ($SiO_2$) is described in copending and commonly assigned U.S. patent application Ser. No. 09/715,935 to Bi et al. entitled "Coating Formation By Reactive Deposition," incorporated herein by reference. The doped silica powder coating was consolidated into a glass layer. Rare earth metal and other dopants for amorphous particles and powder coatings as well as complex glass compositions for powder coatings, and in particular, erbium doped aluminum silicate and aluminum-lanthanum-silicate powder coatings and glasses, are described in copending and commonly assigned U.S. patent application Ser. No. 10/099,597 to Home et al., filed on Mar. 15, 2002, entitled "Optical Materials And Optical Devices," incorporated herein by reference.

For some host glass forming materials and/or dopant(s)/additive(s) of particular interest for optical applications, suitable precursors can be described as a representative listing of precursor materials. Such a representative list follows.

Suitable silicon precursors for vapor delivery comprise, for example, silicon tetrachloride ($SiCl_4$), trichlorosilane ($Cl_3HSi$), trichloromethyl silane $CH_3SiCl_3$, tetraethoxysilane ($Si(OC_2H_5)_4$, also known as ethyl silane and tetraethyl silane), and the like, and combinations of any two or more thereof. Suitable boron precursors comprise, for example, boron trichloride ($BCl_3$), diborane ($B_2H_6$), $BH_3$, and the like, and combinations of any two or more thereof. Suitable phosphate precursor compositions for vapor delivery comprise, for example, phosphine ($PH_3$), phosphorus trichloride ($PCl_3$), phosphorous pentachloride ($PCl_5$), phosphorus oxychloride ($POCl_3$), $P(OCH_3)_3$, and the like, and combinations of any two or more thereof. Suitable germanium precursors comprise, for example, $GeCl_4$, and the like, and combinations of any two or more thereof. Suitable titanium precursors comprise, for example, titanium tetrachloride ($TiCl_4$), titanium isopropoxide ($Ti[OCH(CH_3)_2]_4$), and the like, and combinations of any two or more thereof. Suitable liquid, aluminum precursors comprise, for example, aluminum s-butoxide ($Al(OC_4H_9)_3$), trimethyl aluminum ($Al(CH_3)_3$, trimethyl ammonia aluminum $Al(CH_3)_3NH_3$, and the like, and combinations of any two or more thereof. A number of suitable solid, aluminum precursor compositions are available, such compositions comprising, for example, aluminum chloride ($AlCl_3$), aluminum ethoxide ($Al(OC_2H_5)_3$), aluminum isopropoxide ($Al[OCH(CH_3)_2]_3$), and the like, and combinations of any two or more thereof. Suitable tellurium precursors comprise, for example, $Te(C_2H_5)_2$, $Te(CH_3)_2$, $Te(C_3H_7)_2$, $Te(C_4H_9)_2$, $Te(C_3H_4)_2$, $Te(CH_3C_3H_4)_2$, and the like, and combinations of any two or more thereof.

With respect to rare earth metal precursors, suitable precursors for vapor delivery include, for example, erbium heptafluorodimethyloctanedionate, $Er(C_{11}H_{19}O_2)_3$, $Yb(C_{11}H_{19}O_2)_3$, $Pr(C_{11}H_{19}O_2)_3$, $Nb(C_{11}H_{19}O_2)_3$, $Tm(C_{11}H_{19}O_2)_3$, and the like, and combinations of any two or more thereof. Some representative precursors for other desirable metal dopant(s)/additive(s) comprise, for example, liquid zinc precursor compositions, such as diethyl zinc ($Zn(C_2H_5)_2$), dimethyl zinc ($Zn(CH_3)_2$), and the like, and combinations of any two or more thereof. Suitable solid, zinc precursors with sufficient vapor pressure of gaseous delivery comprise, for example, zinc chloride ($ZnCl_2$), and the like, and combinations of any two or more thereof. Suitable lithium precursors for vapor delivery comprise, for example, solids, such as lithium acetate ($Li_2O_2CCH_3$), liquids, such as lithium amide ($LiNH_2$) dissolved in hexane, and the like, and combinations of any two or more thereof.

Suitable silicon precursors for aerosol production comprise, for example, silicon tetrachloride $Si(Cl_4)$, which is soluble in ether, trichlorosilane ($Cl_3HSi$), which is soluble in carbon tetrachloride, coilloidal silica, $Si(OC_2H_5)_4$, which is soluble in alcohol, $Si(OCH_3)_4$, $(CH_3)_3SiOSi(CH_3)_3$, and the like, and combinations of any two or more thereof. Similarly, suitable boron precursors for aerosol delivery include, for example, ammonium borate ($(NH_4)_2B_4O_7$), which is soluble in water and various organic solvents, $B(OC_2H_5)_3$, $B(C_2H_5)_3$, and the like, and combinations of any two or more thereof. Suitable phosphorous precursors for aerosol delivery comprise, for example, ammonium phosphate ($(NH_4)_3PO_4$), ammonium phosphate—dibasic ($(NH_4)_2HPO_4$), ammonium phosphate—monobasic ($(NH_4)H_2PO_4$) and phosphoric acid ($H_3PO_4$), which are all moderately soluble in water, as well as $OP(OC_2H_5)_3$, which is soluble in alcohol and ether, $P(OC_2H_5)_3$, $OP(OCH_3)_3$, and the like, and combinations of any two or more thereof. Suitable aluminum precursors for aerosol delivery comprise, for example, aluminum chloride ($AlCl_3.9H_2O$), which is soluble in many organic solvents, and aluminum nitrate ($Al(NO_3)_3.9H_2O$) and aluminum hydroxychloride ($Al_2(OH)_5Cl.2H_2O$), which are soluble in water, as well as $Al(C_2H_5)_3$, $Al(OC_4H_9)_3$, $Al(C_5H_7O_2)_3$, $Al(C_{18}H_{35}O_2)_3$, and the like, and combinations of any two or more thereof. Suitable titanium precursors for aerosol delivery comprise, for example, $Ti(N(CH_3)_2)_4$, $TiO_2OH$, and the like, and combinations of any two or more thereof. Suitable germanium precursors for aerosol delivery comprise, for example, $Ge(OC_2H_5)_3$, $Ge(OCH_3)_4$, and the like, and combinations of any two or more thereof. Suitable tellurium precursors for aerosol delivery comprise, for example $TeC_4$, which is soluble in alcohol, and the like, and combinations of any two or more thereof.

Similarly, rare earth dopant/additive precursor(s) can be supplied as an aerosol. Some representative rare earth precursors suitable for aerosol delivery are presented below with suitable solvents. Yttrium chloride ($YCl_3$) and yttrium nitrate ($Y(NO_3)_3$) are soluble in water. Lanthanum chloride ($LaCl_3$ and $LaCl_3.7H_2O$) and lanthanum nitrate hexahydrate ($La(NO_3)_3.6H_2O$) are soluble in water. Thulium chloride ($TmCl_3$ and $TmCl_3.7H_2O$) is soluble in water. Ytterbium chloride ($YbCl_3$ and $YbCl_3.6H_2O$) is soluble in water. Praseodymium chloride ($PrCl_3$ and $PrCl_3.7H_2O$) and praseodymium nitrate hexahydrate ($Pr(NO_3)_3.6H_2O$) are soluble in water. Neodymium chloride ($NdCl_3$ and $NdCl_3.6H_2O$) and neodymium nitrate hexahydrate ($Nd(NO_3)_3.6H_2O$) are soluble in water. Erbium chloride ($ErCl_3$ and $ErCl_3.6H_2O$) is soluble in water. Other suitable rare earth dopant(s)/additive(s) include, for example, $Er(NO_3)_3$, $CeCl_3$ and $Ce(NO_3)_3$.

Other non-rare earth metal dopant(s)/additive(s) also can be delivered by aerosol. For example, zinc chloride ($ZnCl_2$) and zinc nitrate ($Zn(NO_3)_2$) are soluble in water and some organic solvents, such as isopropyl alcohol. Suitable lithium precursors for aerosol delivery from solution comprise, for example, lithium acetate ($LiCH_3CO_2$) and lithium nitrate ($LiNO_3$), which are soluble in water and alcohol, lithium chloride (LiCl), which is somewhat soluble in water, alcohol and some other organic solvents, lithium hydroxide (LiOH), which is somewhat soluble in water and alcohol, and the like, and combinations of any two or more thereof. Suitable bismuth precursors for aerosol delivery comprise, for example, bismuth nitrate ($Bi(NO_3)_3$), which is soluble in dilute aqueous acid solutions, and the like, and combinations of any two or more thereof. Antimony trichloride ($SbCl_3$) is soluble in alcohol. Barium azide ($Ba(N_3)_2$ and $Ba(N_3)_2.H_2O$) and barium chloride ($BaCl_2$) are soluble in water. Other barium compounds suitable for aerosol delivery include, for example, $Ba(C_2H_3O_2)_2$, $Ba(C_2H_3O_2)_2.H_2O$, $Ba(C_2H_3O_2)_2.H_2O$ and combinations thereof. Suitable antimony precursors comprise, for example, $Sb(C_2H_5)_3$, $Sb(OC_2H_5)_3$, $Sb_2(C_4H_4O_6)_3.6H_2O$ and combinations thereof.

As noted above, fluorine dopant(s)/additive(s) are of interest for some applications. For phosphate coating silica glasses, a fluoride precursor of particular interest comprises for example, phosphorus trifluoride ($PF_3$), which is a gas such that it is suitable for vapor delivery into a laser pyrolysis/light reactive deposition chamber. Other fluoride precursors for vapor and/or aerosol delivery comprises, for example, $(C_2H_5O)_3SiF$, $(C_2H_5O)_2SiF_2$, $(C_2H_5O)SiF_3$, $(C_2H_5)_2SiF_2$, $C_2H_5SiF_3$, $C_6H_5SiF_3$, $H_2SiF_6.xH_2O$, $SiF_4$, $Si_4F_3Cl$, $SiF_2Cl_2$, $SiFCl_3$, $HPO_2F_2$, $HPF_6.6H_2O$, $(i-C_3H_7O)_2POF$, $H_2PO_3F$, $CF_4$, $CF_3COCF_3.H_2O$, $AlF_3$, $SnF_2$, $SnF_4$, $GeF_2$, $GeF_4$, $GeF_3Cl$, $GeF_2Cl_2$, $GeFCl_3$, $TiF_4$, $FCH_2CO_2H$, $C_2F_6$, $CCl_2F_2$, $BF_3.2H_2O$, $[(CH_3)2N]2BF$, $C_6H_5BF_2$, $(4-CH_3C_6H_4)BF_2$, $(4-CH_3C_6H_4)BF_2$, $HBF_4$, and the like, and combinations of any two or more thereof. Chlorine dopant(s)/additive(s) can be introduced as the chloride of a metal/metalloid element or in similar compounds as fluorine. Carbon and nitrogen dopant(s)/additive(s) can be introduced as elements associated with other precursors, and carbon can be supplied as ethylene or other hydrocarbon.

In general, the selection of the composition of particles and/or corresponding powder coatings are based on the intended use of the materials. Similarly, any dopants/additives are similarly selected. The resulting properties of the particles depend on the compositions, including any dopants/additives and the phase(s), e.g., crystallinity or amorphous character, of the particles as well as, in some embodiments, the particle size and particle size distribution. Desirable properties for some applications are described above in some detail either with respect to specific compositions or more generally.

For optical applications, silica glasses can be formed with high dopant/additive levels of a particular element. In particular, phosphorous-doped silicate glasses ($SiO_2$) can be formed with $P_2O_5$ concentrations in the range(s) up to about 27.5 weight percent and any lesser values can be formed into a high quality glass. Thus, phosphorous-silicate glasses (P-doped $SiO_2$) can be formed with an index-of-refraction in the range(s) up to about 1.463 index units to provide a range in index-of-refraction for P-doped silicate in the range(s) of about 1.4490 to about 1.463. Similarly, germanium-doped silicate glasses can be formed into a high quality optical glass with $GeO_2$ concentrations in the range(s) up to about 37 weight percent and any lesser value. The germanium-doped silicate glasses can be further doped with in the range(s) from about 1 to about 5 weight percent. Thus, boron-doped germanium-silicate glasses ($B_2O_3$-doped and GeO2-doped $SiO_2$) can be formed with an index-of-refraction in the range of from about 1.452 to about 1.489 index units. Based on these high dopant levels, P, Ge and B doped silicate glasses can be formed on undercladding glasses with a high index-of-refraction differences between the glasses, which can be advantageous for the formation of optical devices.

Particle And Coating Properties

Light reactive deposition (as well as laser pyrolysis) is particularly suitable for the formation of highly uniform particles, especially submicron/nanoscale particles. The particles can be directly deposited onto a substrate to form a particle coating. Small particle size and particle uniformity can contribute overall to the uniformity of the resulting coating, for example, with respect to composition as well as the smoothness of the surface and interfaces between materials. In particular, the lack of particles significantly larger than the average can lead to a more uniform coating. With respect to optical coatings, the coating after consolidation/densification can have high uniformity with respect to thickness and index-of-refraction both within a layer and between layers formed under equivalent conditions. In addition, optical glass can be formed with a high level of smoothness and with high variation in index-of-refraction due to high dopant concentrations.

A collection of particles of interest generally has an average diameter for the primary particles in the range(s) of less than about 2500 nm, in most embodiments in the range(s) less than about 500 nm, in additional embodiments in the range(s) less than about 250 nm, in other embodiments in the range(s) from about 1 nm to about 100 nm, in some embodiments in the range(s) from about 2 nm to about 95 nm, in further embodiments in the range(s) from about 3 nm to about 75 nm, and still other embodiments in the range(s) from about 5 nm to about 50 nm. A person of ordinary skill in the art will recognize that other average diameter ranges within these specific ranges are also contemplated and are within the present disclosure. Particle diameters generally are evaluated by transmission electron microscopy. Diameter measurements on particles with asymmetries are based on an average of length measurements along the principle axes of the particle. In general, a collection of particles, as described herein, has substantially all primary particles that are not fused, i.e., hard bonded to remove a distinct separable interface, although they can be attracted by electrostatic forces, as described below. Powder coatings, which maintain characteristics of the primary particles, are described further above and below.

Particles refer to dispersable units within the collection of particles. Thus, hard fused primary particles collectively form a particle. Primary particles represent distinguishable units in a transmission electron micrograph, which can be hard fused as indicated by necking or the like in the micrograph.

The primary particles usually have a roughly spherical gross appearance. Upon closer examination, crystalline particles generally have facets corresponding to the underlying crystal lattice, for crystalline particles. Nevertheless, crystalline primary particles tend to exhibit growth in laser pyrolysis that is roughly equal in the three physical dimensions to give a gross spherical appearance. Amorphous particles generally have an even more spherical aspect. In some embodiments, in the range(s) of about 95 percent of the primary particles, and in some embodiments in the range(s) of about 99 percent, have ratios of the dimension along the major axis to the dimension along the minor axis less than about 2.

The primary particles can have a high degree of uniformity in size. Based on an analysis of particles produced under analogous conditions by laser pyrolysis, light reactive deposition, as described above, generally results in particles having a very narrow range of particle diameters. Furthermore, heat processing under suitably mild conditions does not alter the very narrow range of particle diameters. With aerosol delivery of reactants for laser pyrolysis, the distribution of particle diameters is particularly sensitive to the reaction conditions. Nevertheless, if the reaction conditions are properly controlled, a very narrow distribution of particle diameters can be obtained with an aerosol delivery system. As determined from examination of transmission electron micrographs, the primary particles generally have a distribution in sizes such that in the range(s) of at least about 80 percent, in other embodiments in the range(s) of at least about 95 percent, and in some embodiments in the range(s) 99 percent, of the primary particles have a diameter greater than about 40 percent of the average diameter and less than about 700 percent of the average diameter. In further embodiments, the primary particles generally have a distribution in sizes such that in the range(s) of at least about 80 percent, in other embodiments in the range(s) of at least about 95 percent, and in some embodiments in the range(s) 99 percent, of the primary particles have a diameter greater than about 40 percent of the average diameter and less than about 300 percent of the average diameter. In alternative or additional embodiments, the primary particles have a distribution of diameters such that in the range(s) of at least about 95 percent, and in further embodiments in the range(s) 99 percent, of the primary particles have a diameter greater than about 45 percent of the average diameter and less than about 200 percent of the average diameter. A person of ordinary skill in the art will recognize that other ranges within these explicit ranges are contemplated and are within the present disclosure.

Furthermore, in some embodiments effectively no primary particles have an average diameter in the range(s) of greater than about 10 times the average diameter, in some embodiments in the range(s) of greater than about 5 times the average diameter, in further embodiments in the range(s) of greater than about 4 times the average diameter, in additional embodiments in the range(s) of greater than about 3 times the average diameter, and in other embodiment in the range(s) greater than about 2 times the average diameter. A person of ordinary skill in the art will recognize that other ranges of distribution cut-offs within these explicit ranges are contemplated and are within the present disclosure. In other words, the particle size distribution effectively does not have a tail indicative of a small number of particles with significantly larger sizes relative to the average size. This cut-off in the particle size distribution is a result of the small reaction zone and corresponding rapid quench of the particles. An effective cut off in the tail of the size distribution indicates that there are less than about 1 particle in $10^6$ that have a diameter greater than a specified cut off value above the average diameter. In some embodiments, the evaluation of the lack of a tail can be performed with computational analysis of transmission electron microscopy micrographs. Narrow size distributions, lack of a tail in the distributions and the roughly spherical morphology can be exploited in a variety of applications.

In addition, the submiron/nanoscale particles generally have a very high purity level. Furthermore, crystalline submicron/nanoscale particles produced by laser pyrolysis can have a high degree of crystallinity. Certain impurities on the surface of the particles may be removed by heating the particles to temperatures below their sintering temperatures to achieve not only high crystalline purity but high purity overall.

When collecting the particles directly onto a substrate surface, the distance from the substrate to the reaction zone and the temperature of the substrate can be adjusted to control the character of the deposit on the substrate surface. The particles on the surface form a powder coating. The powder coating can be in the form of independent primary particles randomly stacked on the surface. The coating of primary particles may only be held together by electromagnetic forces between adjacent and nearby particles. In some embodiments, it may be desirable to form a powder coating with some degree of hard fusing between primary particles. Fusing between primary particles can be achieved by placing the substrate closer to the reaction zone such that the particles are not fully quenched when they strike the substrate surface and/or by heating the substrate, for example, using a wafer heating apparatus, the flame resulting from the reaction of non-particle producing reactants, and/or the gases emanating from the reaction zone during particle production. Even if the primary particles are hard fused, the resulting powder coating maintains character due to the submicron/nanoscale size of the primary particles. In particular, primary particles incorporated into the powder coating may be visible in scanning electron micrographs. In addition, channels between fused particles generally will reflect the submicron/nanoscale of the surrounding fused particles, e.g., by having submicron/nanoscale diameter channels extending into the powder coating. Thus, the submicron/nanoscale character of the primary particles is built into the resulting powder coating formed from the submicron/nanoscale primary particles.

While submicron/nanoscale particles can in principle pack densely on a surface due to their small size, the particles tend to coat a surface as a loose collection due to electrostatic forces between the particles. The relative or apparent density of the powder coating can depend on the particle size, particle composition and the deposition conditions, which may affect particle fusing as well as the forces between the particles and with the surface. The relative density is evaluated relative to the fully densified material of the same composition. In general, the relative density for the powder coating formed from submicron/nanoscale particles is in the range(s) of less than about 0.6, in other embodiments in the range(s) from about 0.02 to about 0.55 and in further embodiments in the range(s) from about 0.05 to about 0.4. A person of ordinary skill in the art will recognize that additional ranges within these specific ranges are contemplated and are within the present disclosure.

To obtain particular objectives, the features of a coating can be varied with respect to composition of layers of the powders as well as location of materials on the substrate. Generally, to form an optical device the uniform optical material can be localized to a particular location on the substrate. In addition, multiple layers of particles can be deposited in a controlled fashion to form layers with different compositions. Similarly, the coating can be made a uniform thickness, or different portions of the substrate can be coated with different thicknesses of particles. Different coating thicknesses can be applied such as by varying the sweep speed of the substrate relative to the particle nozzle, by making multiple sweeps of portions of the substrate that receive a thicker particle coating or by patterning the layer, for example, with a mask. Approaches for the selective deposition of particles are described above. Alternatively or additionally, a layer can be contoured by etching or the like following deposition either before or after consolidation into a uniform material.

Thus, layers of materials, as described herein, may comprise particular layers that do not have the same planar extent as other layers. For example, some layers may cover the entire substrate surface or a large fraction thereof while other layers cover a smaller fraction of the substrate surface. In this way, the layers can form one or more localized devices. At any particular point along the planar substrate, a sectional view through the structures may reveal a different number of identifiable layers than at other point along the surface. Generally, for optical applications, the particle coatings have a thickness in the range(s) of less than about 500 microns, in other embodiments, in the range(s) of less than about 250 microns, in additional embodiments in the range(s) from about 50 nanometers to about 100 microns and in further embodiments in the range(s) from about 100 nanometers to about 50 microns. A person of ordinary skill in the art will recognize that additional range(s) within these explicit ranges and subranges are contemplated and are encompassed within the present disclosure.

The approaches described herein provide for the formation of consolidated glass layers that have very high uniformity within a layer and between layers formed under equivalent conditions. Thicknesses of a glass layer can be measured, for example, with a scanning electron microscope (SEM) with the examination of a cross section, such as SEM instuments available from Hitachi, a spectrophotometry-based film analysis apparatus, such as a FilmTek™ 4000 (Scientific Computing International, Carlsbad, Calif.), or a prism coupling-based apparatus, such as a 2010 Prism Coupler (Metricon Corp., Pennington, N.J.). To measure the thickness variation across a layer of glass, the thickness can be measured, for example, using a Metricon Prism Coupler at nine points across the film. Additionally or alternatively, an SEM analysis can be performed on a cross section, for example, at about 10 points along a first direction and about 10 points across the perpendicular direction. With the FilmTek™ spectrophotometry apparatus, the instrument can be automated with take measurements at the number of points desired, generally nine or more, and in further embodiments 10, 20, 30 or more points. The average and standard deviation can be obtained from these measurements. In evaluating thickness and thickness uniformity of a glass layer, a one centimeter band along the edge is excluded. In some embodiments, one standard deviation of the thickness on a substrate with an area of at least about 25 square centimeters can be in the range(s) of less than about 0.5 microns, in other embodiments less than about 0.35 microns and in further embodiments from about 0.075 to about 0.25 microns. In addition, the standard deviation of the average thickness between a plurality of substrates coated under equivalent conditions can be less than about 0.1 microns, in other embodiments less than about 0.08 microns and in further embodiments from about 0.04 to about 0.06 microns. A person of ordinary skill in the art will recognize that additional deviations in thickness within a layer and between layers of different wafers within the explicit ranges above are contemplated and are within the present disclosure.

The index-of-refraction of the glass determines in part the optical transmission properties. Using the techniques described herein, very high index-of-refraction uniformity can be obtained within a particular glass layer and between layers deposited under equivalent conditions. The index-of-refraction can be measured, for example, with a prism coupler, such as a prism coupler from Metricon Corp., or a FilmTek™ 4000 spectrophotometry instrument. The measurement of the index-of-refraction of a layer of glass can be obtained for approximately the same number of points at which the thickness is measured. Generally, a one-centimeter band is excluded along the edge for the index-of-refraction measurements. The average and standard deviation can be calculated based on the measurements across the layer of glass. In some embodiments, the standard deviation of the index-of-refraction in a glass layer across a substrate with an area of at least about 25 square centimeters can be in the range(s) of no more than about 0.001, in other embodiments in the range(s) of no more than about 0.0008 and in further embodiments in the range(s) from about 0.0001 to about 0.0006. Also, the standard deviation of the average index-of-refraction on glass layers among a plurality of substrates coated under equivalent conditions can be in range(s) of no more than about 0.001, in further embodiments in range(s) of no more than about 0.0006 and in other embodiments in the range(s) from about 0.00005 to about 0.0004. A person of ordinary skill in the art will recognize that additional ranges within the explicit ranges of standard deviations in index-of-refraction within a coating and in average index-of-refractions between coatings formed under equivalent conditions are contemplated and are within the present disclosure.

Furthermore, very low surface roughness for a glass coating on a substrate can be achieved. Surface roughness is evaluated generally with respect to a specific area of the surface for comparison. Different techniques may be particularly suited for the evaluation of surface roughness over particular areas due to time and resolution issues. For example, atomic force microscopy (AFM) can be used to evaluate a root mean square surface roughness over an approximate 20 micron by 20 micron area of a substrate, which is referred to herein as $R_{AFM}$. A suitable AFM instrument includes, for example, a Digital Instruments (Santa Barbara, Calif.) Model Nanoscope® 4. Using the techniques described herein, $R_{AFM}$ values and similarly average roughness values ($R_a$) can be obtained in the ranges of no more than about 0.5 nanometers (nm), and in other embodiments in the ranges from about 0.1 nm to about 0.3 nm. Interferometry can be used to obtain surface roughness measurements over larger areas, such as 480 microns×736 microns. An interferometric profiler is an optical non-contact technique that can measure surface roughness from sub-nanometer to millimeter scales. A suitable interferometric profiler using digital signal processing to obtain surface profile measurement is a Wyko series profiler from Veeco Instruments Inc. (Woodbury, N.Y.). Using light reactive deposition, root mean square surface roughness ($R_{rms}$) values and similarly the average surface roughness ($R_a$) over 480 microns×736 microns can be obtained in the ranges of no more than about 10 nm and in further embodiments from about 1 nm to about 5 nm. A person of ordinary skill in the art will recognize that additional ranges of surface roughness within the explicit ranges are contemplated and are within the present disclosure.

The advantages of light reactive deposition, such as high deposition rates and uniformity, can be achieved while obtaining low in-plane light transmission loss. In some embodiments, the in-plane losses, as measured by coupling techniques, for 1550 nm wavelength light can be in the range(s) of no more than about 0.1 dB/cm and in other embodiments in the range(s) of no more than about 0.05 dB/cm. A person of ordinary skill in the art will recognize that additional ranges within these explicit ranges of in-plane loss are contemplated and are within the present disclosure. The in-plane loss reflects attenuation of transmitted light, for example, due to adsorption and scattering from the core, for in-plane optical transmission. These loss values are within commercially acceptable ranges.

Modifying the Composition of Powder Coatings

While the compositions can be selected during deposition by appropriately introducing elements into the reactant stream for particle production, alternatively or additionally, the powder coating composition can be modified following formation of the powder coating. The composition modifications of powder coatings may involve introduction of approximately stoichiometric amounts of element(s) and/or dopant(s)/additive(s). Due to the submicron/nanoscale of the primary particles incorporated into the powder coating, the powder coating has a large surface area that facilitates incorporation of the additional element(s) into the initial material. One or more additional elements can be incorporated into the powder coating by a gentle heating at temperatures that do not result in consolidation of the material, or into a densified material during consolidation of the powder coating into a uniform material. The additional element(s) can be applied to the powder coating within the reaction chamber or following removal from the reaction/coating chamber. If the element(s) is applied to the powder coating following removal of the coated substrate from the reaction chamber, the additional element(s) can be applied to powder coating directly or using electro-migration deposition. In some embodiments of these approaches, the powder coating can be partly consolidated prior to initiating the composition introduction process to stabilize the coating, generally without removing all of the submicron/nano-structured character of the coating.

Generally, one or more modifying element is applied as a composition comprising the desired element. Any remaining elements in the compositions generally would volatilize during the heating process, although it is possible that oxygen or other non-metal/metalloid elements from the compositions may also incorporate into the powder coating. For example, metal/metalloid nitrates during the heat treatment can involve the incorporation of the metal/metalloid element into the host material and the removal of nitrogen oxides to remove the counter-ions of the composition. The composition can be applied to the powder coating as a solution, an aerosol, and/or as a powder. In general, the use of a solution can facilitate the even spread of the composition through the powder coating by the flow of the solution over and into the powder coating. The concentration of a solution can be selected to contribute to more even distribution of the composition at desired amounts of modification element through the use of a volume of liquid that appropriately wets the powder coating. Surfactants and/or choice of solvent can be used to reduce surface tension and facilitate substantially even spread of the solution. The solvent can be evaporated prior to and/or during the heat processing of the powder coating to incorporate the modification element into the powder coating. Any surfactants can be selected to volatize, for example by decomposition, during the consolidation step.

The reactant delivery system can be used to apply a composition to a powder coating within a reaction chamber. In particular, the composition comprising the modifying element can be applied within the coating apparatus by spraying a solution of the composition through the reactant inlet such that the composition is applied to all or selected portions of the substrate. The composition comprising the modifying element can be applied, for example, as an aerosol using an aerosol delivery system. The radiation beam can be either turned off during spraying of the composition or turned to a very low power to evaporate a portion of the solvent without reacting the composition. The reactant delivery systems described above can be adapted for the delivery of the unreacted composition. The coating process can be used to apply an approximately even coating onto the powder coating, e.g., by sweeping the substrate through a delivery stream of the solution with the modifying element at a constant rate.

Alternatively, the modifying element can be applied to the powder coating following removal of the powder coating from the reaction/coating chamber. The modifying element can be applied, generally in the form of a composition, as a liquid, aerosol and/or a powder, to the powder coating, for example, by spraying, brushing, dipping or the like. As with solutions applied within the reaction chamber, the concentration and other properties of the solution can be selected to obtain even distribution of the modifying element within the powder coating and/or consolidated material. Dip coating of the powder coating can be a convenient approach for obtaining uniform distribution of composition over the powder coating.

Rather than allowing natural migration of the composition with the modifying element over and through the powder coating, an electric field can be used to drive ions of the modifying element(s) into the host matrix. Specifically, modifying element(s) can be introduced into material using electrophoretic or electro-migration deposition. In this approach, an electric field is used to drive ions into the host matrix of the powder coating. A solution containing the host ions is contacted with the powder coating. Generally, an electrode is placed behind the substrate coating while a counter electrode is placed within the solution such that ions driven toward the electrode behind the substrate are driven into the powder coating. More than one electrode of each type can be used, if desired. In addition, multiple modifying elements can be simultaneously or sequentially introduced into the powder coating by electro-migration deposition. Electro-migration deposition into a pwder coating is described further in copending and commonly assigned U.S. patent application Ser. No. 10/195,851, entitled "Nanoparticle Production And Corresponding Structures," incorporated herein by reference.

Figure 20:
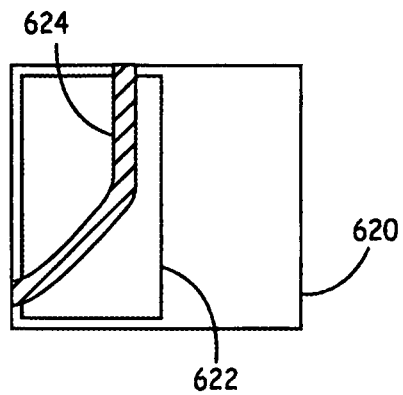
FIG. 20 is a top view of a substrate with a powder coating covered in part with a mask.

The modifying element, e.g., a dopant(s)/additive(s), can be introduced into a selected portion of the powder coating by selectively contacting the solution with only a portion of the powder coating using solution barriers. Alternatively or additionally, a portion of the powder coating can be covered with a mask, such as conventional resist used in electronic processing, to block migration of the modifying element into the masked regions. Referring to an embodiment in FIG. 20, coated substrate 620 is in contact with barrier 622 confining a solution to a portion of the coated substrate. Furthermore, a portion of coated substrate 620 is covered with a mask 624. In this embodiment, the powder coating is doped in un-masked portions in contact with the solution comprising a modifying element. Masking generally is selected to form desired devices following consolidation of the layers into a uniform material. Multiple modifying elements can be sequentially applied to the same and/or different, although optionally overlapping, portions of a coated substrate by altering the masking between electro-migration deposition of the different modifying elements.

In further embodiments, a composition comprising the desired modifying element, e.g., a dopant(s)/additive(s), is reacted separately in the reaction chamber for coating onto a powder coating. Thus, a separate layer of powder comprising a modifying element can be deposited on top of a host powder. As a particular example, if the host powder is a metal/metalloid oxide, a powder of a modifying metal/metalloid oxide can be formed as a separate powder coating on top of the host powder coating. Upon consolidation, the materials fuse into a uniform composition that can have approximately uniform distribution of modifying element through the material. The amount of powder of the modifying element can be selected to yield the desired levels of the modifying element, e.g., a dopant(s)/additive(s). The coating processes can be repeated to form layers of host powder coating (H) and modifying powder coating (D) in desired proportions—HDHDHD . . . or alternatively HDHDH . . . , with modifying powder coating layers always surrounded by host layers, except if the modified powder coating layer is at the bottom or the top of the multiple layer coating stack where the substrate or surface, respectively, surround one side of the modified layer. Of course, in forming a single host or modifying powder coating layer in some embodiments, multiple coating passes can be used in the coating apparatus with each pass involving a sweep of a substrate through the reactant/product stream. The number of alternating layers can be selected to yield the desired total thickness and modifying element distribution. In particular, thinner host layers and corresponding modifying powder coating layers may result in a more uniform distribution of modifying element within the final consolidated material. In general, the alternating layers comprise at least one host layer and one modifying powder coating layer and in some embodiments in the range(s) of less than about 50 host layers and less than about 50 modifying powder coating layers and in further embodiment in the range(s) from 3 host layers and 2 modifying powder coating layers to less than about 25 host layers and less than about 25 modifying powder coating layers. A person of ordinary skill in the art will recognize that other ranges within these explicit ranges are contemplated and are within the present disclosure.

In general, the various approaches for introducing a modifying element into a powder coating can be combined for the introduction of one or more than one modifying element into a powder coating and, in some embodiments, an ultimate consolidated material. In particular, a method for introducing one or more modifying elements, such as a dopant(s)/additive(s), during formation of a powder coating and methods for introducing modifying elements following deposition of a powder coating are described above. For example, a particular modifying element can be introduced using a plurality of techniques to achieve desired levels of modifying element and/or distributions of modifying element within the powder coating and/or consolidated material. In addition, for the deposition of a plurality of modifying elements, each modifying element can be deposited using one or more of the techniques described above, for convenience of processing and/or to achieve desired properties of the resulting consolidated materials.

Consolidation To Form Optical Materials

Heat treatment can sinter the particles and lead to compaction, i.e., densification, of the powders to form the desired material density, such as an optical material. This sintering of the particles is generally referred to as consolidation. The completely consolidated or densified material is generally a uniform material, i.e., it is generally not a porous network, although there can be random imperfections in the uniformity of the material. A partially consolidated or densified material is one in which a pore network remains but the pore size has been reduced and the solid matrix strengthened through the fusing of particles to form rigid interparticle necks. To consolidate, i.e., densify, the optical materials, the materials can be heated to a temperature above the melting point for crystalline materials or the flow temperature for amorphous materials, e.g., above the glass transition temperature and possibly above the softening point below which a glass is self-supporting, to consolidate the coating into a densified material by forming a viscous liquid. Consolidation can be used to form amorphous, crystalline or polycrystalline phases in layers. These layers can be completely or partially densified. In general, consolidation can be performed before or after patterning of a layer. A preliminary heat treatment can be applied with the reactor flame to reduce dopant(s)/additive(s) migration during the consolidation process and to partly densify the material. Using the techniques described herein, doped glasses can be formulated into planar optical devices.

Generally, the heating is performed under conditions to lower the viscosity of the material to promote flow. Because of the high viscosity at typical consolidation temperatures, the material generally does not flow significantly on the substrate surface, although small gaps may fill in. Processing at higher temperatures to reduce the viscosity of the melt can result in undesirable melting of the substrate, migration of compositions between layers or in flow from a selected area of the substrate. The heating and quenching times can be adjusted to change the properties of the consolidated coatings, such as density. While the final consolidated material may be uniform, the density of the material may vary slightly depending on the processing conditions. In addition, heat treatment can remove undesirable impurities and/or change the stoichiometry and crystal structure of the material, as described further above with respect to modification of composition using heat treatment.

Following deposition of the powder layer, the precursors can be shut off such that the reactant stream only comprises a fuel and an oxygen source that reacts to form gaseous/vapor products without particles. The flame resulting from the reaction of the fuel and oxygen source can be used to heat the coated substrate without depositing any additional materials on the substrate. Such a heating step is observed to reduce dopant(s)/additive(s) migration upon full consolidation of a doped silica glass. A flame heating step can be performed between coating steps for several layers or after deposition of several layer, in which each coating layer may or may not have the same composition as other layers. Generally, after a desired number of layers or quantity of material is deposited, a final consolidating heat treatment is performed to fully consolidate the material. In forming a coating with a uniform composition, one or more layers of particles with the same composition can be deposited. All of the layers can be deposited prior to any consolidation or partial consolidation, e.g., with a flame, or complete or partial consolidation can be performed after each layer or subset of layers formed with particles having the same composition. After final consolidation, a layer formed with particles of a uniform composition can have some variation in dopant/additive concentration(s) through the thickness of the material due to migration of dopant(s)/additive(s) during the consolidation process.

Suitable processing temperatures and times generally depend on the composition of the particles. Small particles on the submicron/nanometer scale generally can be processed at lower temperatures and/or for shorter times relative to powders with larger particles due to lower melting points for the submicron/nanoscale particles in comparison with bulk material. However, it may be desirable to use a comparable melting temperature to obtain greater surface smoothness from improved melting of the submicron/nanoscale particles.

For the processing of silicon oxide submicron/nanoscale particles, the particle coatings can be heated to a temperature in the range(s) from about 800° C. to 1700° C., although with silicon substrates the upper limit can be about 1350° C. Higher temperatures can be reached with appropriate ceramic substrates. Dopant(s)/additive(s) in the silicon oxide particles can lower the appropriate consolidation temperatures. Thus, the dopant(s)/additive(s) can be selected to flow into a uniform optical material at a lower temperature. Suitable dopant(s)/additive(s) to lower the flow temperature when placed into silicon oxide ($SiO_2$) include, for example, boron, phosphorous, germanium, fluorine, germanium, aluminum, sodium, calcium, and combinations thereof. The amount and composition of one or more dopants/additives can be selected to yield a desired flow temperature for consolidation and index-of-refraction of the consolidated optical material.

Heat treatments can be performed in a suitable oven. It may be desirable to control the atmosphere in the oven with respect to pressure and/or the composition of the gases. Suitable ovens comprise, for example, an induction furnace, a box furnace or a tube furnace with gas(es) flowing through the space containing the coated substrate. The heat treatment can be performed following removal of the coated substrates from the coating chamber. In alternative embodiments, the heat treatment is integrated into the coating process such that the processing steps can be performed sequentially in the apparatus in an automated fashion.

For many applications, it is desirable to apply multiple particle coatings with different compositions. In general, these multiple particle coatings can be arranged adjacent to each other across the x-y plane of the substrate being coated (e.g., perpendicular to the direction of motion of the substrate relative to the product stream), or stacked one on top of the other across the z plane of the substrate being coated, or in any suitable combination of adjacent domains and stacked layers. Each coating can be applied to a desired thickness.

For some embodiments, different compositions can be deposited adjacent to each other within a layer and/or in adjacent layers. Similarly, distinct layers of different compositions can be deposited in alternating layers. Specifically, two layers with different compositions can be deposited with one on top of the other, and or additionally or alternatively, with one next to the other, such as layer A and layer B formed as AB. In other embodiments, more than two layers each with different compositions can be deposited, such as layer A, layer B and layer C deposited as three sequential (e.g., stacked one on top of the other, or adjacent to the other, or adjacent and stacked) layers ABC. Similarly, alternating sequences of layers with different compositions can be formed, such as ABABAB . . . or ABCABCABC . . . Other combinations of layers with specific compositions and/or optical properties can be formed as desired.

Individual uniform layers, each of a particular composition, generally have after consolidation an average thickness in the range(s) of less than 100 microns, in many embodiments in the range(s) from about 0.1 micron to about 50 microns, in other embodiments in the range(s) from about 0.2 microns to about 20 microns. A person of skill in the art will recognize that ranges within these specific ranges are contemplated and are within the scope of the present disclosure. Each uniform layer formed from particles with the same composition can be formed from one or more passes through a product flow in a light reactive deposition apparatus. Thickness is measured perpendicular to the projection plane in which the structure has a maximum surface area.

The material with multiple particle coatings can be heat treated after the deposition of each layer or following the deposition of multiple layers or some combination of the two approaches. The optimal processing order generally would depend on the melting point of the materials. Generally, however, it may be desirable to heat treat and consolidate a plurality of layers simultaneously. Specifically, consolidating multiple layers simultaneously can reduce the time and complexity of the manufacturing process and, thus, reduce manufacturing costs. If the heating temperatures are picked at reasonable values, the melted materials remain sufficiently viscous that the layers do not merge undesirable amounts at the interface. Slight merging of the layers generally does not affect performance by unacceptable amounts. By changing reaction conditions, such as precursor flow or total gas flow, particles can be deposited with changing particle size in the z-direction within a single layer or between layers. Thus, smaller particles can be deposited on top of larger particles. Since the smaller particles generally soften at lower temperatures, the consolidation of the upper layer can be less likely to damage the lower layers during the consolidation step. To form patterned structures following deposition, patterning approaches, such as lithography and photolithography, along with etching, such as chemical etching, dry etching or radiation-based etching, can be used to form desired patterns in one or more layers. This patterning generally is performed on a structure prior to deposition of additional material. Patterning can be performed on particle layers or consolidated layers.

Optical Structures

As noted above, the particles and consolidated materials have various applications including, for example, optical applications. In particular, the uniform materials formed after consolidation can be used in forming optical devices, such as fiber preforms and planar optical structures. The improved materials described herein can advantageously be incorporated into a variety of desirable optical devices, which can be incorporated into integrated optical and electro-optical structures. In particular, some dopants/additives introduce desirable functional properties while other dopants/additives improve processing for the formation of structures with a plurality of layers and/or other features. The approaches described above can be used to guide the deposition of structures with selected compositions and/or dopants/additives localized within selected portions of the structures.

Figure 21:
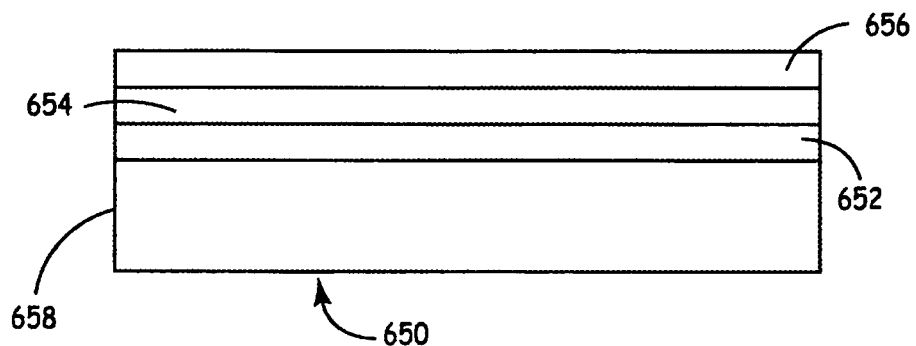
FIG. 21 is a side view of a structure with optical layers.

As an example of potential processing improvements, layered structures generally are formed with layers further away from the substrate having lower flow temperatures such that consolidation of upper layers do not remelt lower layers or, if consolidated together, do not lower the viscosity of lower layers excessively such that the materials flow more than desired. Having a greater ability to vary material compositions with respect to the host and any dopants/additives provides a corresponding greater ability to select a desired flow temperature for the processing of a layered structure. As a particular example, a layered structure is shown in FIG. 21. Optical structure 650 has optical layers 652, 654, 656 on substrate 658. In addition, when forming monolithic structures built upon a substrate, different materials are generally applied in layers adjacent each other. Different materials can have different coefficients of thermal expansion. During processing, the structures are generally heated and cooled to consolidate the materials. The host and dopant/additive compositions can similarly be selected to have compatible coefficients of thermal expansion to reduce stresses and any corresponding optical distortions.

Figure 22:
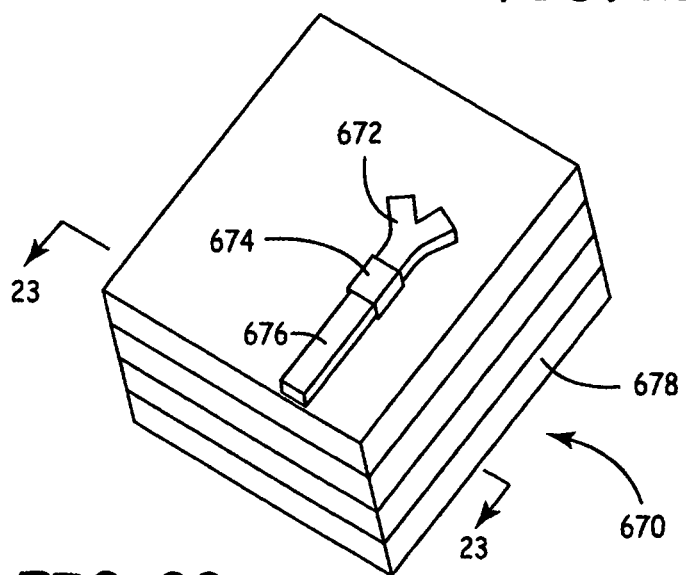
FIG. 22 is a perspective view of an optical circuit.
Figure 23:
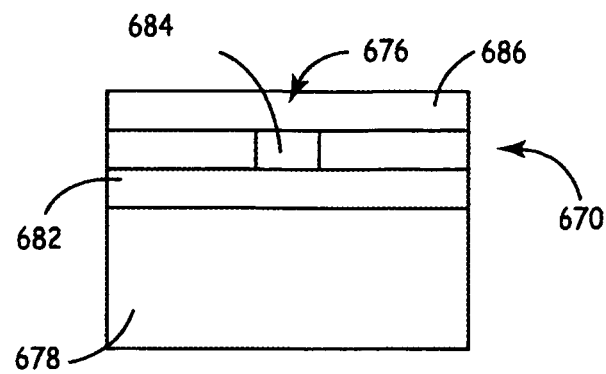
FIG. 23 is a sectional view of the optical circuit of FIG. 22 taken along line 23-23.

In general, light paths through optical fibers and planar optical devices take the form of waveguides that are a higher index-of-refraction material surrounded by a lower index-of-refraction cladding. As a representative example, an optical circuit on a substrate is shown schematically in FIGS. 22 and 23. As shown in FIG. 22, optical circuit 670 includes optical devices 672, 674, 676 on substrate 678. A sectional view including optical device 676 is shown in FIG. 23. Optical device 676 includes an undercladding optical material 682, a core optical material 684 and an overcladding optical material 686. In general, core optical material 684 can be different from undercladding optical material 682 and overcladding optical material 686 in any optical property, such as index-of-refraction, which may be the result of, for example, a compositional difference, a density difference, or a crystal structure difference. Undercladding optical material 682 may or may not be different from overcladding optical material 686 in composition and/or optical properties. Overcladding material 686 generally is located along two layers, a layer shared with the core optical material and an overlying layer.

Substrate 678 can be formed, for example, from silicon and/or other high melting materials, such as alumina. Common substrates are round wafers, although substrates that are square or other shapes can be used. For the formation of preforms, it may be desirable to shape the substrate highly elongated in one dimension. The aspect ratio may range from about 1:5 to about 1:50, or in other embodiments from about 1:10 to about 1:25. A person of ordinary skill in the art will recognize that ranges and subranges within these explicit ranges are contemplated and are within the present disclosure. Similarly, for preforms it may be desirable to have coatings with dimensions that change as further coatings are added such that the final structure does not have a rectangular shape to facilitate pulling of the fiber from the preform.

Optical devices of interest comprise, for example, optical waveguide devices, such as optical couplers, splitters, arrayed waveguide grating (AWG) and the like. Waveguides manufactured on a substrate surface are referred to as planar waveguides. Planar waveguides are useful in the production of integrated optical circuits for optical communication and other opto-electronics applications. Other optical devices of interest comprise, for example, three dimensional optical memory device, Bragg grating, optical attenuator, optical splitter/coupler, optical filter, optical switch, laser, modulator, interconnect, optical isolator, optical add-drop multiplexer (OADM), optical amplifier, optical polarizer, optical circulator, phase shifter, optical mirror/reflector, optical phase-retarder, and optical detector.

Rare earth doped glasses are particularly suitable for use in the formation of optical amplifiers. The amplifier material is excited by a pump light signal transversely coupled to the optical material. The pump light can be tuned to excite the rare earth doped materials. An optical input passing through the optical material at a lower frequency than the pump signal is then amplified by stimulated emission. Thus, energy from the pump light is used to amplify the input light signal. $Cr^{+4}$ ions can also be used to form optical amplifiers. In addition, rare-earth ions can be used to improve pump efficiency as a pump sensitizer or to provide another pumping band for a rare-earth emitter. For example $Yb^{+3}$ can be a sensitizer for $Er^{+3}$, and $Ho^{+3}$ can provide a pump band for a $Tm^{+3}$ emitter.

Figure 24:
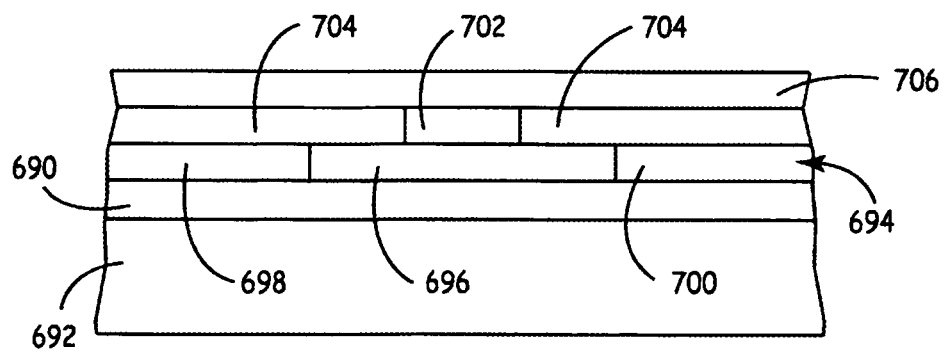
FIG. 24 is a side view of an optical amplifier.

A representative amplifier structure is shown in sectional FIG. 24. An undercladding layer 690 is located on substrate 692. Core layer 694 includes an amplifier material 696 between waveguides 698, 700 along an optical pathway. Pump waveguide 702 is optically connected to amplifier material 696. Pump waveguide 702 is surrounded by cladding 704 in the same layer and connects to a pump light source. Over-cladding 706 can be placed over pump waveguide 702.

Improved ability to form complex optical compositions with selected hosts and dopants/additives can be used to introduce multiple functionalities to one or more materials within an optical structure. For example, amplification, UV/visible sensitivity and/or paramagnetic properties can be introduced. Amplification properties have been described above. UV/visible sensitivity can be introduced with, for example, $Ce^{+3}$, $Tb^{+3}$, $Eu^{+2}$, $Sn^{+2}$ and/or $Ge^{+4}$ dopants/additives. In particular, the index-of-refraction of UV/visible sensitive materials changes in a lasting way following exposure of the material to high-energy light, e.g., blue light or ultraviolet light. These changes in index-of-refraction can be used to form optical devices, such as waveguides and gratings, with a periodic index change introduced using an interference pattern of UV/visible light. Paramagnetic effects can be introduced with, for example, $Ce^{+3}$, $Tb^{+3}$, $Gd^{+3}$, $Yb^{+3}$ and/or $Dy^{+3}$ dopants/additives. Paramagnetic materials have an enhanced Faraday effect. The Faraday effect can be used for altering polarization of light, thereby affecting the transmission and reflection properties of the material. Specifically, the Faraday effect involves a rotation of plane-polarized light. This provides for the unidirectional propagation of light within a core waveguide. The magnitude of the Verdet constant and therefore the Faraday effect can be increased by enhancing the paramagnetism. An enhanced Faraday effect can be used to construct smaller optical devices, such as optical rotators and Faraday isolators Layered structures for optical fiber preforms and planar optical structures, including integrated planar optical structures, are described further in copending and commonly assigned PCT application designating the U.S. PCT/01/45762 to Bryan et al., entitled "Multilayered Optical Structures," incorporated herein by reference and copending and commonly assigned U.S. patent application Ser. No. 10/027,906 to Bi et al., entitled "Three Dimensional Engineering Of Optical Structures," incorporated herein by reference.

EXAMPLES

Example 1

Phosphorous Doped Silicon Oxide Optical Coatings

This example describes the coating of a phosphorous-doped silicon oxide glass (PSG) onto a silicon substrate containing a thermal silicon oxide undercladding layer using light reactive deposition to form a powder coating that is subsequently consolidated into the glass.

Particle coating was performed using light reactive deposition in which wafer coating was performed within a reaction chamber by passing a product particle stream by a wafer. The light reactive deposition apparatus was essentially as shown in FIGS. 11-19. Five equivalent wafers were coated with the PSG glass under equivalent conditions.

Phosphorous-doped $SiO_2$ was coated onto each 4-inch diameter silicon wafer with a thermal oxide coating by light reactive deposition. The thermal oxide coated wafers had a thirteen micron thick thermal oxide coating. Silicon tetrachloride (Strem Chemical, Inc., Newburyport, Mass.) precursor vapor was carried into the reaction chamber using a flash evaporator with a fixed vapor partial pressure. Similarly, $POCl_3$ (Schumacher, Carlsbad, Calif.) was supplied to the reaction chamber from a flash evaporator. Argon gas was mixed with the reactant stream as a diluent/inert gas to moderate the reaction. $C_2H_4$ gas was used as a laser absorbing gas. $O_2$ was used as an oxygen source and was mixed with the reactants. The reactant gas mixture containing $SiCl_4$, argon, $POCl_3$ and $C_2H_4$ was introduced into the reactant gas nozzle for injection into the reaction chamber.

During a run, the reactant nozzle was moved back and forth past the wafer 8 times at a rate specified below. About 2.5 seconds were required per pass with each cycle comprising one pass past the substrate and one pass in return with some delay between cycles. The reaction conditions for the production of the phosphorous-doped silicon oxide coatings by light reactive deposition are described in Table 1.

TABLE 1

| | |
|---|---:|
| Laser Power (watts) | 800 |
| Chamber Pressure (torr) | 250 |
| Substrate Temperature (° C.) | 350 |
| Nozzle Speed (in/sec) | 0.5 |
| Oxygen (sccm) | 1200 |
| Ethylene (sccm) | 400 |
| Argon (sccm) | 7000 |
| $SiCl_4$ (sccm) | 70 |
| $POCl_3$ (sccm) | 25 |
| Cycle Number | 8 |
| Deposition Time (min) | 5 | sccm = standard cubic centimeters per minute.

Following completion of the coating run, the wafers appeared to have a uniform, white powdery coating across the surface of the wafer. The coating had a thickness of roughly 70 microns, as measured by scanning electron microscopy (SEM) using a Hitachi™ model S-3000H instrument.

After the wafers were coated with the powder, the coating was consolidated in a 1710 series box furnace (CM Furnaces, Bloomfield, N.J.) under conditions specified in Table 2. The coated wafers were inserted into the furnace at 1335° C., and remained in the furnace for 1 hour under an atmosphere of Helium, which was flowed through the furnace. After 1 hour the temperature was ramped down from 1335° C. at a rate of 100° C. per minute. The wafer was removed from the oven at a temperature of 500° C.

TABLE 2

| Insertion Temperature (° C.) | 1335 |
| Ramp Up (° C./min) | NA |
| Consolidation Temperature (° C.) | 1335 |
| Consolidation Time (min) | 60 |
| Ramp Down (° C./min) | 100 |
| Removal Temperature (° C.) | 500 |
| Gas Used | Helium |
| Gas Flow (sccm) | 800 | sccm = standard cubic centimeters per minute.

Figure 25:
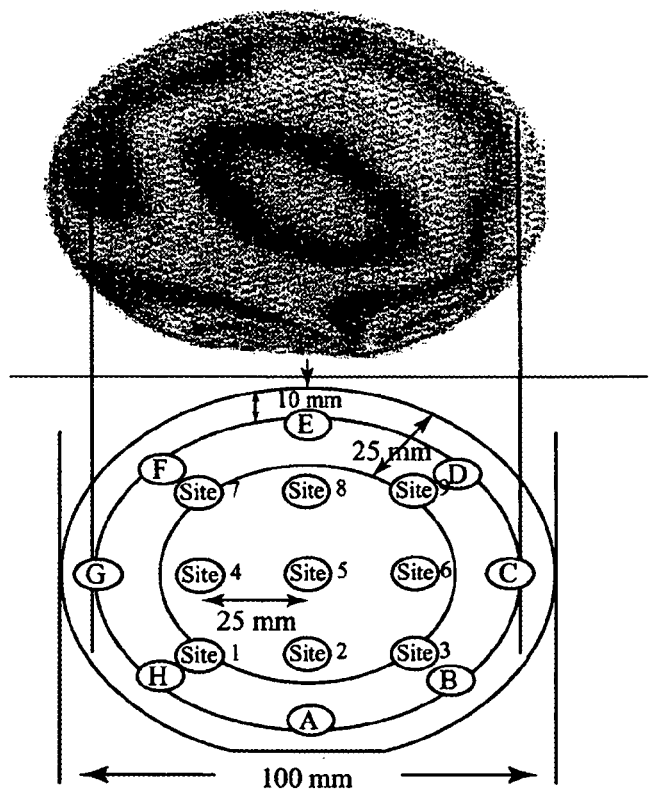
FIG. 25 is a spectrophotometric measurement of the surface of a wafer coated with phosphate doped silica glass with the lower diagram indicating nine points at which thickness measurements were performed.

After being removed from the oven, the surfaces of the wafers were coated with a clear glass. The glass layer had an average thickness of 5.19 microns for the 5 wafers. The standard deviation in thickness was obtained within each coating and between the average thickness of all the coatings. The standard deviations are presented in Table 3. These results indicate that the PSG wafers had excellent thickness uniformity across the surface of the waver and between wafers coated under equivalent conditions. For example, FIG. 25 shows an interference profile obtained with Veeco Instruments interference profiler along with a schematic indicating the location of points used to measure a 0.07 micron thickness uniformity (standard deviation in thickness) across the entire surface of the wafer, as evaluated with a FilmTek™ 4000 spectrophotometry instrument. The measurement points for the thickness measurements are also shown in the lower diagram of FIG. 25.

Figure 27:
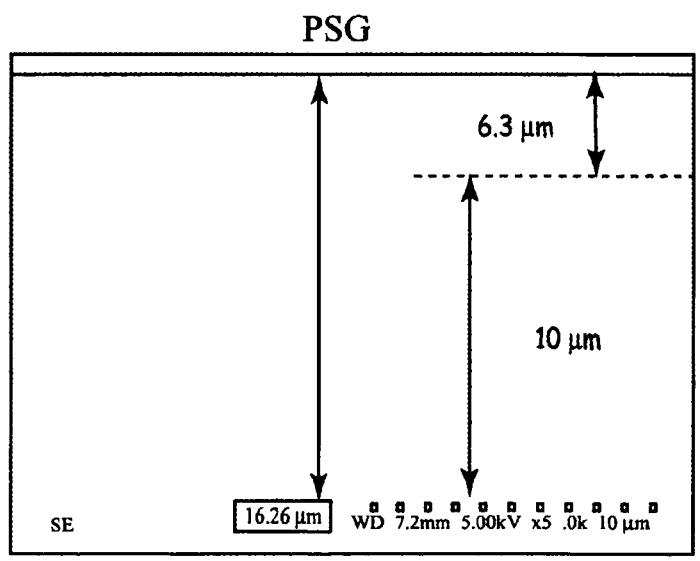
FIG. 27 is a scanning electron micrograph of a cross section of a substrate coated with phosphate doped silica glass.
Figure 26:
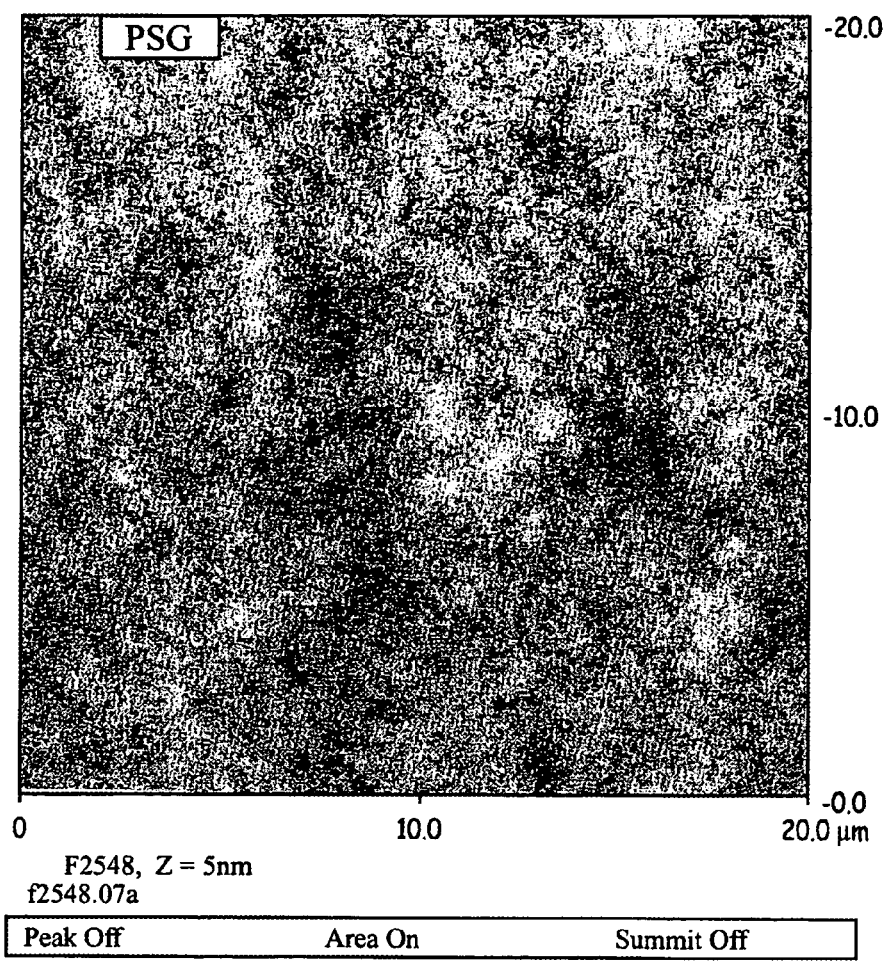
FIG. 26 is a atomic force microscopic scan across a 20 micron by 20 micron portion of phosphate doped silica glass formed by the methods described herein.

Analysis with Atomic Force Microscopy revealed that the coated wafers had a low surface roughness. A Digital Instruments AFM, model Dimension 3100 was used in tapping mode. A 20 micron by 20 micron AFM scan is shown for a representative wafer in FIG. 26. As shown in FIG. 27, SEM measurements of a cross section of a representative wafer also verified that the coating was fully consolidated, with no observed air bubbles or defects inside the core or at the core-cladding interface.

TABLE 3

| Sample | Index of Refraction | SD Index of Refraction | Thickness (microns) | SD Thickness |
|---|---|---|---|---|
| P124 | 1.4527 | 0.0002 | 5.11 | 0.26 |
| P126 | 1.453 | 0.0003 | 5.25 | 0.23 |
| P127 | 1.4528 | 0.0004 | 5.24 | 0.22 |
| P128 | 1.4528 | 0.0004 | 5.2 | 0.27 |
| P129 | 1.4528 | 0.0004 | 5.15 | 0.18 |
| Mean | 1.45282 | | 5.19 | |
| SD | 0.000109545 | | 0.059581876 | |

Similarly, the index-of-refraction demonstrated high uniformity within a layer on a wafer and between glass layers on different wafers. The index-of-refraction was measured at nine points on each wafer using a Metricon prism coupler. The average index-of-refraction on each of the five coated wafers is given in Table 3. The standard deviation of the index-of-refraction across the wafer for each of the five wafers as well as the standard deviation of the average index-of-refraction for the five wafers are also presented in Table 3.

Figure 28:
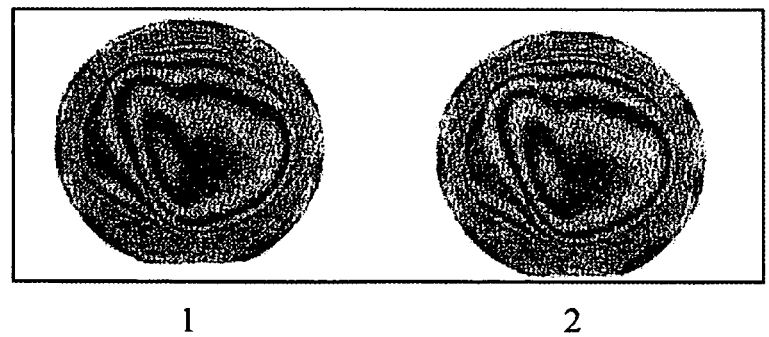
FIG. 28 is the interference patterns measured from two wafers coated with phosphate doped silica glass under equivalent coating conditions using the techniques described herein.

Another feature of the coated wafers produce by this method is the low in-plane loss exhibited. The in-plane loss was measured using a high precision prism coupler system with a Metricon Model 2010 Prism Coupler. The light from a laser source with (633 nm, 1300 nm and 1500 nm) wavelength light is coupled to the glass film by a prism and then an oil bath is used to collect the transmitted coupled light. The light is then collected by a detector selected for the particular wavelength of light. An in-plane loss value of ~0.1 dB/cm was measured for a representative PSG glass layer with 633 nm light. An even lower loss value would be expected for 1550 nm light since the film is selected to be a single mode film at 1550 nm while it is a multimode film at 633 nm. Moreover, high wafer-to-wafer reproducibility is also manifested in the nearly identical interference patterns (see FIG. 28) of wafers formed under equivalent conditions as measured with a Veeco Instruments interference profiler.

Figure 29:
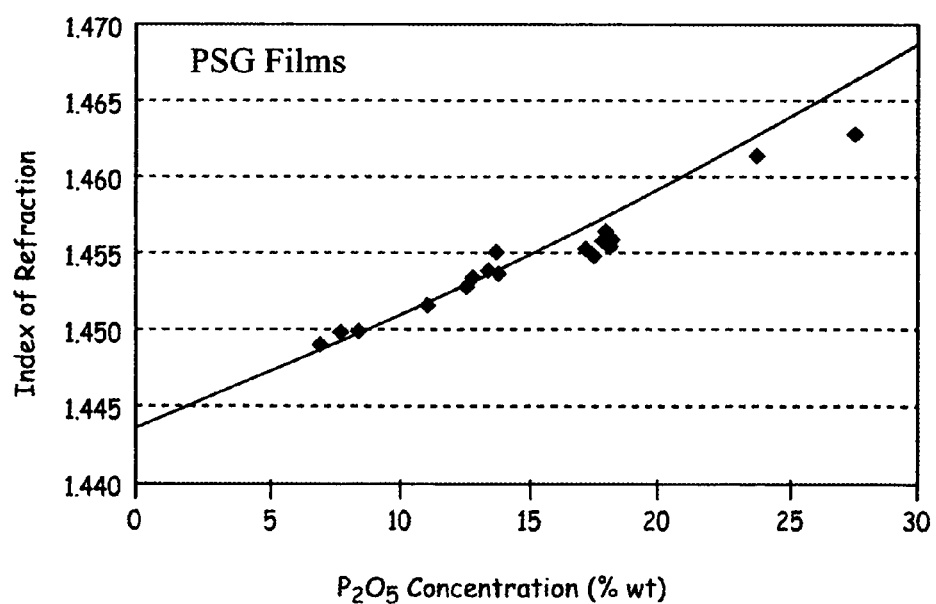
FIG. 29 is a plot of measured index-of-refraction (points) compared with predicted values of index-of-refraction (line) for silica glass doped with different levels of phosphate.

Furthermore, in addition to producing a coating exhibiting a high degree of thickness uniformity, the instant method also provides accurate control over the concentration of the dopant, which translates to an accurate control over the index of refraction of the wafer coating (see FIG. 29). Furthermore, FIG. 29 also shows that the method allows for selection of an index of refraction over a wide range in values, in which the dopant concentration is selected by using a corresponding flow rate of the Phosphorous precursor. The maximum change in the index of refraction achieved for the phosphorous glass relative to the undoped glass was about 1.25%.

Example 2

Germanium and Boron Doped Silicon Oxide Optical Coatings

This example describes the coating of a silicon substrate containing a thermal silicon oxide coating, with a germanium and boron-doped silicate glass (GBSG) using light reactive deposition to form powder coatings that are subsequently consolidated into the glass.

Particle coating was performed using light reactive deposition in which wafer coating was performed within a reaction chamber by passing a product particle stream by a wafer. The light reactive deposition apparatus was essentially as shown in FIGS. 11-16. Five equivalent wafers were coated with the GBSG glass under equivalent conditions.

Germanium and boron doped $SiO_2$ was coated onto each 4-inch diameter silicon wafer with a thermal oxide coating by light reactive deposition. The thermal oxide coated wafers had a thirteen micron thick thermal oxide coating. Silicon tetrachloride (Strem Chemical, Inc., Newburyport, Mass.) precursor vapor was carried into the reaction chamber by flash evaporation. Similarly, $GeCl_4$ (Strem Chemical, Inc., Newburyport, Mass.) was supplied to the reaction chamber from a flash evaporator. $BCl_3$ (Air Products) was supplied as a gas at a specified flow rate. Argon gas was mixed with the reactant stream as a diluent/inert gas to moderate the reaction. $C_2H_4$ gas was used as a laser absorbing gas. $O_2$ was used as an oxygen source and was mixed with the reactants. The reactant gas mixture containing $SiCl_4$, argon, $GeCl_4$, $BCl_3$ and $C_2H_4$ was introduced into the reactant gas nozzle for injection into the reaction chamber.

During a run, the reactant nozzle was moved past the wafer six cycles or twelve passes at a rate specified in Table 4. The reaction conditions for the production of the GBSG coatings by light reactive deposition are presented in Table 4.

TABLE 4

| | |
|---|---|
| Laser Power (watts) | 800 |
| Chamber Pressure (torr) | 250 |
| Substrate Temperature (° C.) | 350 |
| Nozzle Speed (in/sec) | 0.5 |
| Oxygen (sccm) | 1150 |
| Ethylene (sccm) | 380 |
| Argon (sccm) | 7000 |
| $SiCl_4$ (sccm) | 110 |
| $GeCl_4$ (sccm) | 16 |
| $BCl_3$ (sccm) | 15 |
| Cycle Number | 6 |
| Deposition Time (min) | 5 |

Following completion of the coating run, the wafers appeared to have a uniform powdery white coating across the surface of the wafer. The coating had a thickness of roughly 50-70 microns, as measured by scanning electron microscopy (SEM).

After the wafers were coated with the powder, the coating was consolidated in a box furnace (CM Furnaces series 1710) under conditions specified in Table 5. The coated wafers were inserted into an oven at 1335° C. and remained in the oven for 2 hours under an atmosphere of Helium, which was flowed through the furnace. After 2 hours the temperature was ramped down from 1335° C. at a rate of 100° C. per minute. The wafer was removed from the oven at a temperature of 500° C.

TABLE 5

| | |
|---|---|
| Insertion Temperature (° C.) | 1335 |
| Ramp Up (° C./min) | NA |
| Consolidation Temperature (° C.) | 1335 |
| Consolidation Time (min) | 120 |
| Ramp Down (° C./min) | 100 |
| Removal Temperature (° C.) | 500 |
| Gas Used | Helium |
| Gas Flow (sccm) | 800 | sccm = standard cubic centimeters per minute

After being removed from the oven, the surfaces of the wafers were coated with a clear glass. The glass layer had an average thickness of 5.058 microns for the 5 wafers. The standard deviation in thickness was obtained within each coating and between the average thickness of all the coatings. The standard deviations are presented in Table 6. These results indicate that the PSG wafers had excellent thickness uniformity across the surface of the waver and between wafers coated under equivalent conditions.

Figure 30:
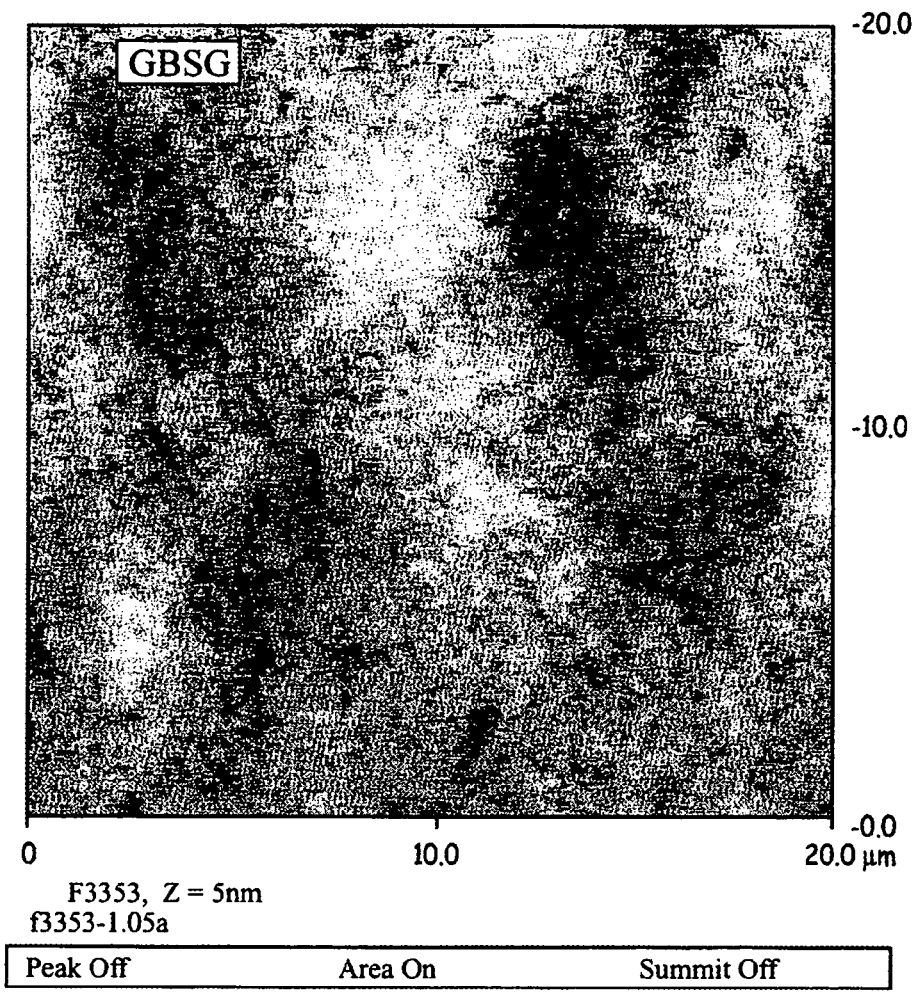
FIG. 30 is atomic force microscopic scan across a 20 micron by 20 micron portion of a germanium and boron doped silica glass.
Figure 31:
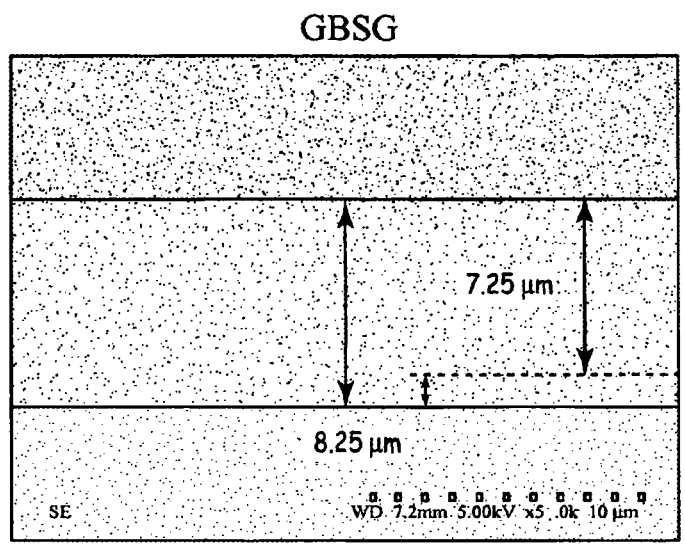
FIG. 31 is a scanning electron micrograph of a cross section of a substrate coated with germanium and boron doped silica glass.

Analysis with Atomic Force Microscopy (Digital Instruments model 3100) revealed that the coated wafers had very low surface roughness properties. A 20 micron by 20 micron AFM scan is shown for a representative wafer with a GBSG coating in FIG. 30. As shown in FIG. 31, SEM measurements of a cross section also verified that the coating was fully consolidated, with no observed air bubbles or defects inside the core or at the core-cladding interface.

TABLE 6

| Sample | Index of Refraction | SD Index of Refraction | Thickness (microns) | SD Thickness |
|---|---|---|---|---|
| P107 | 1.4555 | 0.0003 | 5.03 | 0.21 |
| P108 | 1.4553 | 0.0004 | 5.04 | 0.23 |
| P109 | 1.4557 | 0.0004 | 4.98 | 0.17 |
| P111 | 1.4549 | 0.0005 | 5.12 | 0.18 |
| P112 | 1.455 | 0.0004 | 5.12 | 0.21 |

TABLE 6-continued

| Sample | Index of Refraction | SD Index of Refraction | Thickness (microns) | SD Thickness |
|---|---|---|---|---|
| Mean | 1.45528 | | 5.058 | |
| SD | 0.000299333 | | 0.054552727 | |

Similarly, the index-of-refraction demonstrated high uniformity within a layer on a wafer and between glass layers on different wafers. The measurements were performed as described in Example 1. The average index-of-refraction on each of the five coated wafers is given in Table 6. The standard deviation of the index-of-refraction across the wafer for each of the five wafers as well as the standard deviation of the average index-of-refraction for the five wafers are also presented in Table 6.

Figure 32:
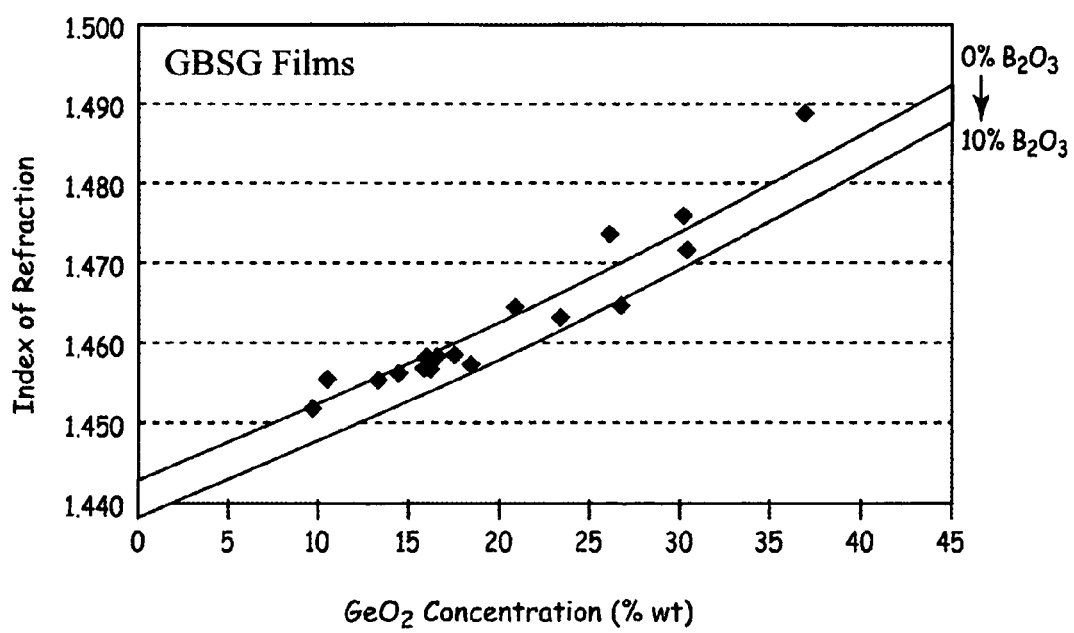
FIG. 32 is a plot of index-of-refraction of germanium and boron doped silica glass as a function of germanium oxide concentration compared with model calculation estimates.
Figure 33:
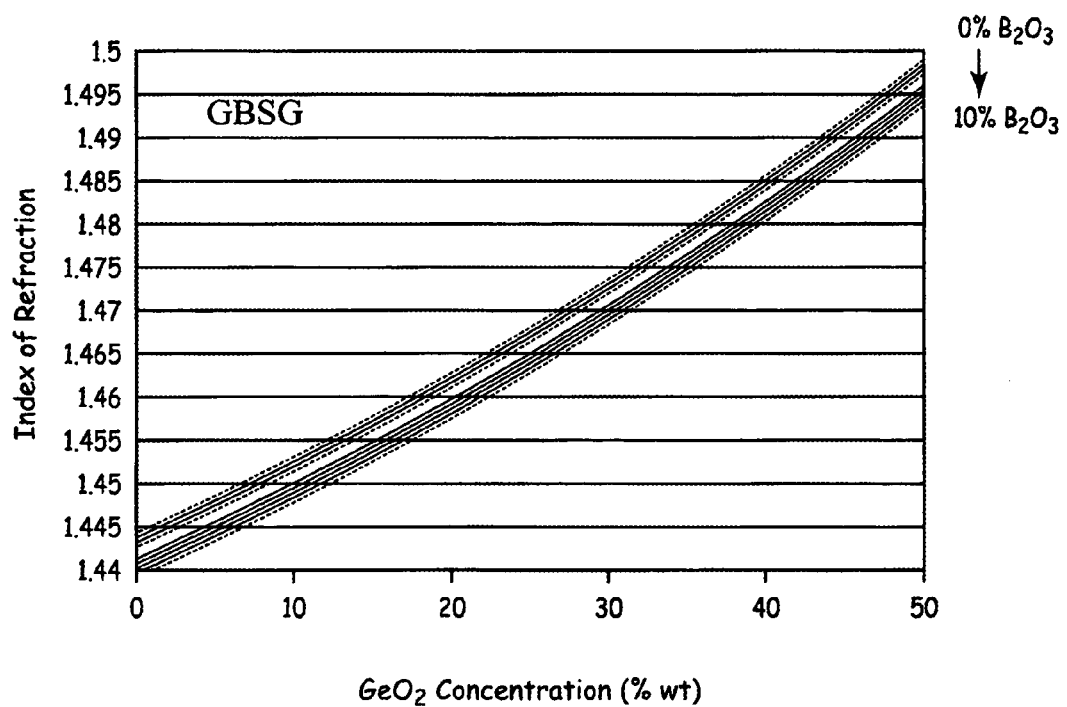
FIG. 33 is a plot of index-of-refraction from model calculations as a function of germanium and boron dopant concentrations in a silica glass.

In addition to producing a coating of uniform thickness, the instant method also provides accurate control over the concentration of the dopant, which translates to an accurate control over the index of refraction of the wafer coating (see FIG. 32). Furthermore, FIG. 32 also shows that the method allows for a wide range in index of refraction values. The maximum change in the index-of-refraction achieved for the GBSG wafer was about 2.97%. FIG. 33 includes plots of the predicted model calculations of the index-of-refraction for a multi-dopant GBSG coating.

As utilized herein, the term "in the range(s)" or "between" comprises the range defined by the values listed after the term "in the range(s)" or "between", as well as any and all sub-ranges contained within such range, where each such subrange is defined as having as a first endpoint any value in such range, and as a second endpoint any value in such range that is greater than the first endpoint and that is in such range.

The embodiments described above are intended to be illustrative and not limiting. Additional embodiments are within the claims below. Although the present invention has been described with reference to specific embodiments, workers skilled in the art will recognize that changes may be made in form and detail without departing from the spirit and scope of the invention. In addition, the terms including, comprising and having as used herein are intended to have broad non-limiting scope.

What we claim is:

1. A method for forming optical coatings on a plurality of planar substrates in a chamber, the method comprising depositing a powder coating on each of the plurality of planar substrates from a product flow:
   wherein the product flow results from a chemical reaction in a reactant flow comprising a first precursor at a first selected vapor pressure and a second precursor at a second selected vapor pressure,
   wherein a nozzle that directs a source of the reactant flow along a propagation direction into the chamber is moved within to the chamber to thereby move the reactant flow relative to the substrates and the chemical reaction is driven by a light beam that is moved within the chamber relative to the substrates,
   wherein the reactant flow has a cross section perpendicular to the propagation direction characterized by a major axis and a minor axis, the major axis being at least a factor of two greater than the minor axis, and the major axis is sufficiently large that the product flow simultaneously forms a layer on the structures along an entire linear dimension extending across the structures resulting in the deposition of the layer on the structures with one linear pass of the product flow across the structures, wherein the nozzle is connected to a flexible conduit that provides the reactants, with the flexible conduit moving inside the chamber as needed to provide a continuous supply of the reactants as the nozzle moves, wherein moving the light beam comprises passing the light beam into the chamber through a first window, directing the light beam through the reactant flow in a direction parallel to the major axis, and passing the light beam out of the chamber through a second window, with the directing of the beam comprising reflection with a plurality of mirrors, and moving the beam with the reactant flow to maintain passage of the beam through the reactant flow and parallel to the major axis, wherein the powder coating comprises the layer and the powder coating is deposited with a thickness of at least about 100 nm in no more than about 30 minutes for each planar substrate, and wherein the optical coatings on respective planar substrates have a standard deviation between the optical coatings on the planar substrates in average index-of-refraction for each planar substrate of no more than about 0.001 with a one centimeter edge exclusion.

2. The method of claim 1 wherein the plurality of planar substrates comprises at least about 5 planar substrates.

3. The method of claim 1 wherein the optical coatings on respective planar substrates have a standard deviation between the optical coatings on the planar substrates in average index-of-refraction for each planar substrate of no more than about 0.0006.

4. The method of claim 1 wherein the optical coatings on respective planar substrates have a standard deviation between the optical coatings on the planar substrates in average index-of-refraction for each planar substrate between about 0.00005 and about 0.0004.

5. The method of claim 1 wherein the powder coating comprises silica.

6. The method of claim 1 wherein the powder coating is deposited at a rate of at least about 5 grams per hour.

7. The method of claim 1 wherein each planar substrate has a surface area of at least about 25 square centimeters.

8. The method of claim 1 wherein the plurality of mirrors and the nozzle are mounted to a bracket that moves relative to the chamber.

9. The method of claim 1 further comprising a flash evaporator for delivering the first precursor at the first selected vapor pressure and the second precursor at the second selected vapor pressure.

10. A method for forming an optical coating on a planar substrate in a chamber, the method comprising depositing a powder coating on the planar substrate from a product flow:

wherein the product flow results from a chemical reaction in a reactant flow comprising a first precursor, wherein the chemical reaction is driven by a light beam, wherein the planar substrate has a surface area of at least about 25 square centimeters, wherein a nozzle that directs a source of the reactant flow along a propagation direction into the chamber is moved within the chamber to thereby move the reactant flow relative to the substrate and the chemical reaction is driven by a light beam that is moved within the chamber relative to the substrate, wherein the reactant flow has a cross section perpendicular to the propagation direction characterized by a major axis and a minor axis, the major axis being at least a factor of two greater than the minor axis, and the major axis is sufficiently large that the product flow simultaneously forms a layer on the substrate along an entire linear dimension extending across the substrate resulting in the deposition of the layer on the substrate with one linear pass of the product flow across the substrate, wherein the nozzle is connected to a flexible conduit that provides the reactants, with the flexible conduit moving inside the chamber as needed to provide a continuous supply of the reactants as the nozzle moves, wherein moving the light beam comprises passing the light beam into the chamber through a first window, directing the light beam through the reactant flow in a direction parallel to the major axis, and passing the light beam out of the chamber through a second window, with the directing of the beam comprising reflection with a plurality of mirrors, and moving the beam with the reactant flow to maintain passage of the beam through the reactant flow and parallel to the major axis, wherein the method comprises depositing a powder coating comprising the layer on the planar substrate from a product flow with the powder coating having a thickness of at least about 100 nm in no more than about 30 minutes, and wherein the powder coating consolidates under appropriate conditions into an optical coating having a standard deviation in index-of-refraction across the planar substrate of less than about 0.001 with a 1 centimeter edge exclusion.

11. The method of claim 10 wherein the optical coating has a standard deviation in index-of-refraction across the planar substrate of no more than about 0.0008.

12. The method of claim 10 wherein the optical coating has a standard deviation in index-of-refraction across the planar substrate between about 0.0001 and about 0.0006.

13. The method of claim 10 wherein the powder coating comprises silica.

14. The method of claim 10 wherein the powder coating is deposited at a rate of at least about 5 grams per hour.

15. The method of claim 10 wherein the plurality of mirrors and the nozzle are mounted to a bracket that moves relative to the chamber.

16. The method of claim 10 further comprising a flash evaporator for delivering the first precursor at a first selected vapor pressure and the second precursor at a second selected vapor pressure.

* * * * *